(12) United States Patent
Mahajan et al.

(10) Patent No.: US 9,401,306 B2
(45) Date of Patent: Jul. 26, 2016

(54) SELF-ALIGNED CAPILLARITY-ASSISTED MICROFABRICATION

(71) Applicant: REGENTS OF THE UNIVERSITY OF MINNESOTA, Minneapolis, MN (US)

(72) Inventors: Ankit Mahajan, Minneapolis, MN (US); Carl Daniel Frisbie, Mahtomedi, MN (US); Lorraine F. Francis, Minnetonka, MN (US)

(73) Assignee: REGENTS OF THE UNIVERSITY OF MINNESOTA, Minneapolis, MN (US)

( * ) Notice: Subject to any disclaimer, the term of this patent is extended or adjusted under 35 U.S.C. 154(b) by 0 days.

(21) Appl. No.: 14/538,367

(22) Filed: Nov. 11, 2014

(65) Prior Publication Data

US 2015/0130069 A1    May 14, 2015

Related U.S. Application Data

(60) Provisional application No. 61/902,661, filed on Nov. 11, 2013.

(51) Int. Cl.
| | |
|---|---|
| *H01L 21/44* | (2006.01) |
| *H01L 21/768* | (2006.01) |
| *H01L 29/06* | (2006.01) |
| *H01L 21/683* | (2006.01) |
| *H01L 31/0392* | (2006.01) |
| *H01L 27/12* | (2006.01) |
| *H01L 29/786* | (2006.01) |
| *H01L 21/48* | (2006.01) |

(52) U.S. Cl.
CPC .... *H01L 21/76834* (2013.01); *H01L 21/76879* (2013.01); *H01L 21/76882* (2013.01); *H01L 29/78693* (2013.01); *H01L 21/4867* (2013.01); *H01L 21/6835* (2013.01); *H01L 27/1285* (2013.01); *H01L 27/1292* (2013.01); *H01L 29/0673* (2013.01); *H01L 29/0676* (2013.01); *H01L 29/78696* (2013.01); *H01L 31/0392* (2013.01)

(58) Field of Classification Search
CPC .................. H01L 21/76879; H01L 21/76882; H01L 29/78693; H01L 21/76834; H01L 21/4867; H01L 29/0673; H01L 29/0676; H01L 29/068; H01L 29/78696; H01L 31/0392; H01L 31/1804; H01L 21/02521; H01L 21/308; H01L 21/6835; H01L 24/97; H01L 27/1285; H01L 27/1292
USPC ........ 438/674, 679, 780, 781, 662; 257/9, 24, 257/40, 619, 773, E21.007, E51.006
See application file for complete search history.

(56) References Cited

U.S. PATENT DOCUMENTS

2011/0207328 A1* 8/2011 Speakman .......... H01L 51/0016
438/694

OTHER PUBLICATIONS

Ahn et al., "Transparent conductive grids via direct writing of silver nanoparticle inks," *Nanoscale*, Apr. 2011; 3:2700-2702.

(Continued)

*Primary Examiner* — Thinh T Nguyen
(74) *Attorney, Agent, or Firm* — Mueting, Raasch & Gebhardt, P.A.

(57) ABSTRACT

A manufacturing process, which we term Self-Aligned Capillarity-Assisted Lithography for manufacturing devices having nano-scale or micro-scale features, such as flexible electronic circuits, is described.

13 Claims, 43 Drawing Sheets

(56) References Cited

OTHER PUBLICATIONS

Arias et al., "Materials and Applications for Large Area Electronics: Solution-Based Approaches," *Chem. Rev.*, 2010; 110(1):3-24.
Briand et al., "Making environmental sensors on plastic foil," *Mater. Today*, 2011; 14:416-423.
Cavallini et al., "Nanopatterning Soluble Multifunctional Materials by Unconventional Wet Lithography," *Advanced Materials*, Mar. 2009; 21:1043-1053.
Chabinyc et al., "Fabrication of Arrays of Organic Polymeric Thin-Film Transistors using Self-Aligned Microfulidic Channels," *Advanced Materials*, Mar. 2003; 15:1903-1906.
Cho et al., "Printable ion-gel gate dielectrics for low-voltage polymer thin-film transistors on plastic," *Nature Materials*, 2008; 7(11):900-906.
DiBenedetto et al., "Molecular Self-Assembled Monolayers and Multilayers as Gate Dielectrics for Organic Thin Film Transistor Applications," *Advanced Materials*, Apr. 14, 2009; 21(14-15):1407-1433.
Dodabalapur et al., *European Research and Development in Hybrid Flexible Electronics*, WTEC Panel Report, Baltimore, 2010; 151 pgs.
Facchetti et al., "Gate-Planarized Low-Operating Voltage Organic Field-Effect Transistors Enabled by Hot Polymer Pressing/Embedding of Conducting Metal Lines," *J. Am. Chem. Soc.*, Apr. 19, 2006; 128(15):4928-4929.
Facchetti et al., *Transparent Electronics, from Synthesis to Applications*, Wiley-VCH Publishers, 2010; Cover Page; Copyright Page and Table of Contents; 7 pgs.
Galagan et al., "ITO-free flexible organic solar cells with printed current collecting grids," *Solar Energy Materials & Solar Cells*, May 2011; 95(5):1339-1343.
Ha et al., "Flexible Low-Voltage Organic Thin-Film Transistors Enabled by Low-Temperature, Ambient Solution-Processable Inorganic/Organic Hybrid Gate Dielectrics," *J. Am. Chem. Soc.*, Nov. 18, 2010; 132(49):17426-17434.
Ha et al, "Printed, sub-3V digital circuits on plastic from aqueous carbon nanotube inks," *ACS Nano*, Jun. 28, 2010; 4(8):4388-4395.
Han et al., "Filling Kinetics of Liquids in Nanochannels as Narrow as 27 nm by Capillary Force," *J. Colloid Interface Sci.*, 2006; 293:151-157.
Haneveld et al., "Capillary Filling of Sub-10 nm nanochannels," *J. Appl. Phys.*, 2008; 104(1):014309-6.
Hendriks et al., "'Invisible' Silver Tracks Produced by Combining Hot-Embossing and Inkjet Printing," *Advanced Functional Materials*, 2012; 18:1031-1038.
Hines et al., "Transfer printing methods for the fabrication of flexible organic electronics," *J. Appl. Phys.*, 2007; 101:024503.
Hong et al., "Nonvacuum, Maskless Fabrication of a Flexible Metal Grid Transparent Conductor by Low-Temperature Selective Laser Sintering of Nanoparticle Ink," *ACS Nano*, Jun. 25, 2013; 7(6):5024.
Hur et al., "Organic Nanodielectrics for Low Voltage Carbon Nanotube Thin Film Transistors and Complementary Logic Gates," *J. Am. Chem. Soc.*, Oct. 12, 2005; 127(40):13808-13809.
Jeong et al., "Role of Gallium Doping in Dramatically Lowering Amorphous-Oxide Processing Temperatures for Solution-Derived Indium Zinc Oxide Thin-Film Transistors," *Advanced Materials*, Mar. 26, 2010; 22(12):1346-1350.
Jo et al., "Scalable Fabrication of Strongly Textured Organic Semiconductor Micropatterns by Capillary Force Lithography," *Advanced Materials*, 2012; 24:3269-3274.

Ju et al., "Remarkable Radiation Hardness of Single Nanowire Transistors Using Robust Organic Gate Nanodielectrics. A Total-Integrated-Dose Proton Radiation Study," *Appl. Phys. Lett.*, Aug. 14, 2006; 89(7):073510.
Juncker et al., "Autonomous Microfluidic Capillary System," *Anal. Chem.*, Dec. 15, 2002; 74(24):6139-6144.
Kang et al., "High-Performance Printed Transistors Realized Using Femtoliter Gravure-Printed Sub-10 μm Metallic Nanoparticle Patterns and Highly Uniform Polymer Dielectric and Semiconductor Layers," *Adv. Mater.*, Jun. 12, 2012; 24(22):3065-30.
Khodagholy et al., "Highly Conformable Conducting Polymer Electrodes for In Vivo Recordings," *Adv. Mater.*, Sep. 22, 2011; 23(36):H268-H272.
Kim et al., "Micromolding in Capillaries: Applications in Materials Science," *J. Am. Chem. Soc.*, Jun. 19, 1996; 118:5722-5731.
Kim et al., "Printable Crosslinked Polymer Blend Dielectrics. Design Strategies, Synthesis, Microstructures, and Electrical Properties, with Organic Field-Effect Transistors as Testbeds," *J. Am. Chem. Soc.*, May 28, 2008; 130:6867-6878.
Kim et al., "Interface Studies of ZnO Nanowire Transistors Using Low-Frequency Noise and Temperature-Dependent I-V Measurements," *Appl. Phys. Lett.*, Jan. 14, 2008; 92:022104.
Kim et al., "Roll-to-roll Manufacturing of Electronics on flexible substrates using self-aligned imprint lithography (SAIL)," *Journal of the Society for Information Display*, 2009; 17:963.
Li et al., "ITO-free photovoltaic cell utilizing a high-resolution silver grid current collecting layer," *Solar Energy Materials & Solar Cells*, Jun. 2013; 113:85-89.
Lin et al., "Direct-Current and Radio-Frequency Characterizations of GaAs Metal-Insulator-Semiconductor Field-Effect Transistors Enabled by Self-Assembled Nanodielectrics," *Appl. Phys. Lett.*, Aug. 27, 2007; 91(9):092103.
Liu et al., "All-Amorphous-Oxide Flexible Transparent Thin Film Transistors," *J. Am. Chem. Soc.*, Aug. 10, 2010; 132:11934-11942.
Mahajan et al., "Facile Method for Fabricating Flexible Substrates with Embedded, Printed Silver Lines," *ACS Appl. Mater. Interfaces*, Dec. 9, 2013; 6:1306-1312.
Marks, "Materials for Organic and Hybrid Inorganic/Organic Electronics," *MRS Bulletin*, Dec. 2010; 35(12):1018-1027.
Moonen et al., "Fabrication of Transistors on Flexible Substrates: from Mass-Printing to High-Resolution Alternative Lithography Strategies," *Adv. Materials*, Nov. 2, 2012; 24(41):5526-5541.
Ortiz et al., "High-κ Dielectrics for Low-Voltage Organic Field-Effect Transistors," *Chem. Rev.*, Jan. 2010; 110(1):205-239. Available online Oct. 23, 2009.
Sokolov et al., "Fabrication of low-cost electronic biosensors," *Mater. Today*, Sep. 2009; 12:12.
Su et al., "Capillary Force Lithography," *Advanced Materials*, Sep. 14, 2001; 13(18):1386-1389.
Walker et al., "Reactive Silver Inks for Patterning High-Conductivity Features at Mild Temperatures," *J. Am. Chem. Soc.*, Jan. 5, 2012; 134(3):1419-1421.
Wang et al., "High-Performance Transparent Inorganic-Organic Hybrid Thin-Film Transistors Fabricated at Room Temperature. Towards Large-Scale Invisible Electronics," *Nature Materials*, Oct. 15, 2006; 5:893-900.
Washburn, "The Dynamics of Capillary Flow," *The Physical Review*, 1921; XVII:273-283.
Xia et al., "Printed, Sub-2V Gel-Electrolyte-Gated Polymer Transistors and Circuits," *Adv. Funct. Mater.*, Feb. 22, 2010; 20(4):587-594.
Yang et al., "Dynamics of Capillary-Driven Flow in Open Microchannels," *Journal of Physical Chemistry C*, 2011; 115:18761-18769.

\* cited by examiner $t = 0.34$ s $t = 20$ s

Liquid with surface tension $\gamma_{LV}$, contact angle with walls of $\theta$ and viscosity $\eta$ Capillary pressure: $\Delta P = \dfrac{2\gamma_{LV}\cos\theta}{r_H}$ Hydraulic radius: $r_H = \dfrac{wd}{2(w+d)}$ Position at time t: $x^2 = \dfrac{r_H \gamma_{LV} \cos\theta}{2\eta} t$ Velocity at x = L: $v = \dfrac{r_H \gamma_{LV} \cos\theta}{4\eta L}$

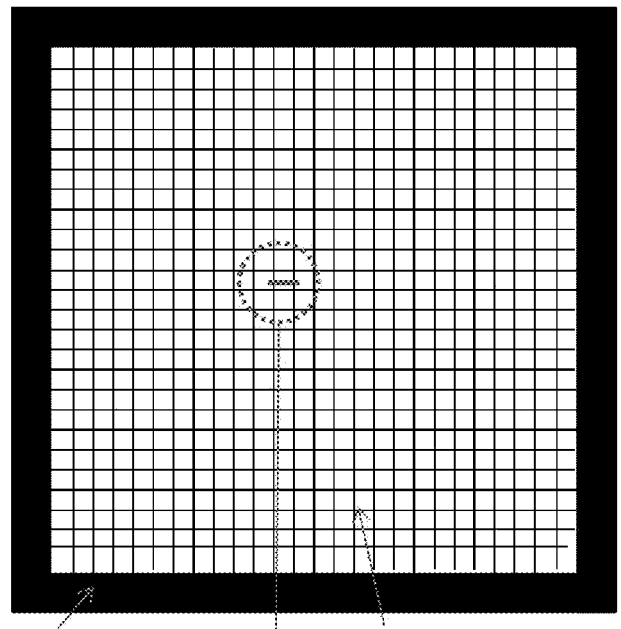

1. Electronic ink is dispensed into and along a large channel forming the border of the grid. This border serves as a contact pad in electronic devices.

2. Electronic ink flows into narrow and tall channels via capillarity to create a high density grid of silver lines.

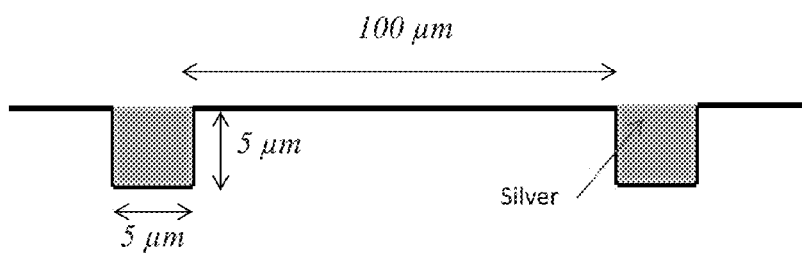

Cross-section along the red line. Thick silver lines provide high current carrying capacity. High transmittance of the grid is provided by the narrow width of the lines and optimized spacing between them.

FIG. 33

SELF-ALIGNED CAPILLARITY-ASSISTED MICROFABRICATION

RELATED APPLICATION

This application claims the benefit of U.S. Provisional Patent Application No. 61/902,661 filed on Nov. 11, 2013, which application is hereby incorporated herein by reference in its entirety to the extent that it does not conflict with the disclosure presented herein.

STATEMENT OF GOVERNMENT INTEREST

This invention was made with government support under N00014-11-1-0690 awarded by the Office of Naval Research. The government has certain rights in the invention.

FIELD

This disclosure generally relates to, among other things, methods of manufacturing flexible electronics and the resulting flexible electronics.

BACKGROUND

It is widely recognized that flexible electronics will greatly expand the application space for microelectronics and deliver new functional capabilities in a variety of commercial areas. In light of this well-recognized potential, one immediate challenge is to develop a robust manufacturing platform to achieve fast, low-power circuits on substrates such as plastic, rubber, paper, and metal foil. Previous demonstrations of flexible electronic systems have largely focused on integration of conventional silicon CMOS onto plastic or rubber sheets using mechanical transfer. Such lithography-intensive, "pick and place" paradigms may not be able to provide cost and area scaling necessary for many of envisioned applications and may not be able to deliver all the desired functions (e.g., optical transparency).

SUMMARY

This disclosure describes, among other things, methods for manufacturing high performance, multi-functional flexible electronics systems over large areas in a cost-effective manner. In some embodiments, a manufacturing process referred to herein as Self-Aligned Capillarity-Assisted Lithography for Electronics (or SCALE) is described. The SCALE process can be used to produce flexible electronic circuits. In some embodiments, SCALE can be used to produce devices and circuits that are not, or are not purely, electronic circuits. For example, SCALE can be used to produce devices or components for use in optics, such as photonics, plasmonics and nano-optics.

In various embodiments, SCALE can be an additive manufacturing process meaning valuable materials, such as electronic materials, can be patterned only in areas where they are required. In various embodiments, SCALE can be self-aligned which decreases long-standing complications associated with registering multiple layers of materials. In various embodiments, SCALE can be highly parallel meaning many devices can be fabricated simultaneously. In various embodiments, SCALE can be scalable in terms of device dimensions from millimeters or more to down to at least hundreds of nm, and potentially smaller. In various embodiments, SCALE can be high throughput, e.g., it can be implemented for continuous roll-to-roll manufacture. In various embodiments, SCALE can be two or more of additive, self-aligned, highly parallel, scalable and high throughput. In some embodiments, SCALE is additive, self-aligned, highly parallel, scalable and high throughput.

It will be understood that processes other than lithography can be used to produce structured substrates as described herein. Any suitable process that can produce substrates having features (such as microchannels) having a dimension (such as height or width) of about 500 micrometers or less can be employed. In some embodiments, the process can produce substrates having features having a dimension of 100 micrometers or less, such as 50 micrometers or less or 10 micrometers or less. Examples of such processes include imprint lithography, microreplication, embossing, etching, 3D printing, extrusion and the like, or combinations thereof.

In various embodiments described herein, a method for forming an electronic device includes (i) providing a substrate having a microchannel and a reservoir in communication with the microchannel and (ii) disposing a first ink comprising a first electronic material in the reservoir to cause the first ink to move via capillarity through the microchannel. In embodiments, the substrate is molded via imprint lithography. The first ink may be dried, leaving a first electronic material in the channel. A second ink comprising a second electronic material may be deposited in the first reservoir to cause to cause the second ink to move via capillarity through the microchannel over the first electronic material.

In various embodiments described herein, a method for forming an electronic device includes (a) providing a substrate having a microchannel and first and second reservoirs in communication with the microchannel; (b) disposing a first fluid composition comprising a liquid carrier and a first electronic material in the first reservoir to cause the first fluid composition to move via capillarity through the microchannel; (c) evaporating at least a portion of the liquid carrier of the first liquid composition, leaving the first electronic material in the channel; and (d) disposing a second liquid composition comprising a liquid carrier and a second electronic material in the second reservoir to cause the second liquid composition to move via capillarity through the microchannel over the first electronic material.

In various embodiments described herein, a method includes providing a flexible substrate for an electronic device, the substrate having a plurality of channels and a plurality of reservoirs defined therein, wherein a first of the plurality of channels is in fluid communication with a first of the plurality of reservoirs, wherein a second of the plurality of channels is in communication with a second of the plurality of reservoirs, and wherein the first and second channels are both in communication with a third of the plurality of reservoirs. The method further includes (a) disposing a first fluid composition comprising a liquid carrier and first electronic material in the first reservoir to cause the first fluid composition to move via capillarity through the first channel, (b) disposing a second fluid composition comprising a liquid carrier and a second electronic material in the second reservoir to cause the second liquid composition to move via capillarity through the second channel, and (c) disposing a third fluid composition comprising a liquid carrier and a third electronic material in the third reservoir to cause the ink to move via capillarity through the first channel and second channels.

Any of the methods outlined above may be carried out in whole or in part on a roll-to-roll apparatus.

In embodiments described herein, an electronic device includes (i) a substrate; (ii) a patterned polymer disposed on the substrate, wherein the patterned polymer defines a first microchannel in communication with a first reservoir; and (iii) a first electronic material disposed into the first microchannel. The patterned polymer may further define a second microchannel in communication with the first reservoir, and the first electronic material is disposed in the second microchannel. In some embodiments, the patterned polymer may further define a third microchannel in communication the first reservoir, the third microchannel is disposed over the first microchannel (and the second microchannel, if present), wherein a second electronic material is disposed in the third microchannel, wherein at least a portion of the second electronic material is disposed on the first electronic material in the first microchannel (and in the second microchannel, if present). In some embodiments, the patterned polymer further defines a fourth microchannel in communication a second reservoir, the fourth microchannel is disposed over the first microchannel (and the second microchannel, if present), wherein a second electronic material is disposed in the third microchannel, wherein at least a portion of the second electronic material is disposed on the first electronic material in the first microchannel (and in the second microchannel, if present).

dielectric shown in (B); and images (C) of arrays of flexible organic TFTs with CHB dielectrics printed on a polyimide.

Figure 28:
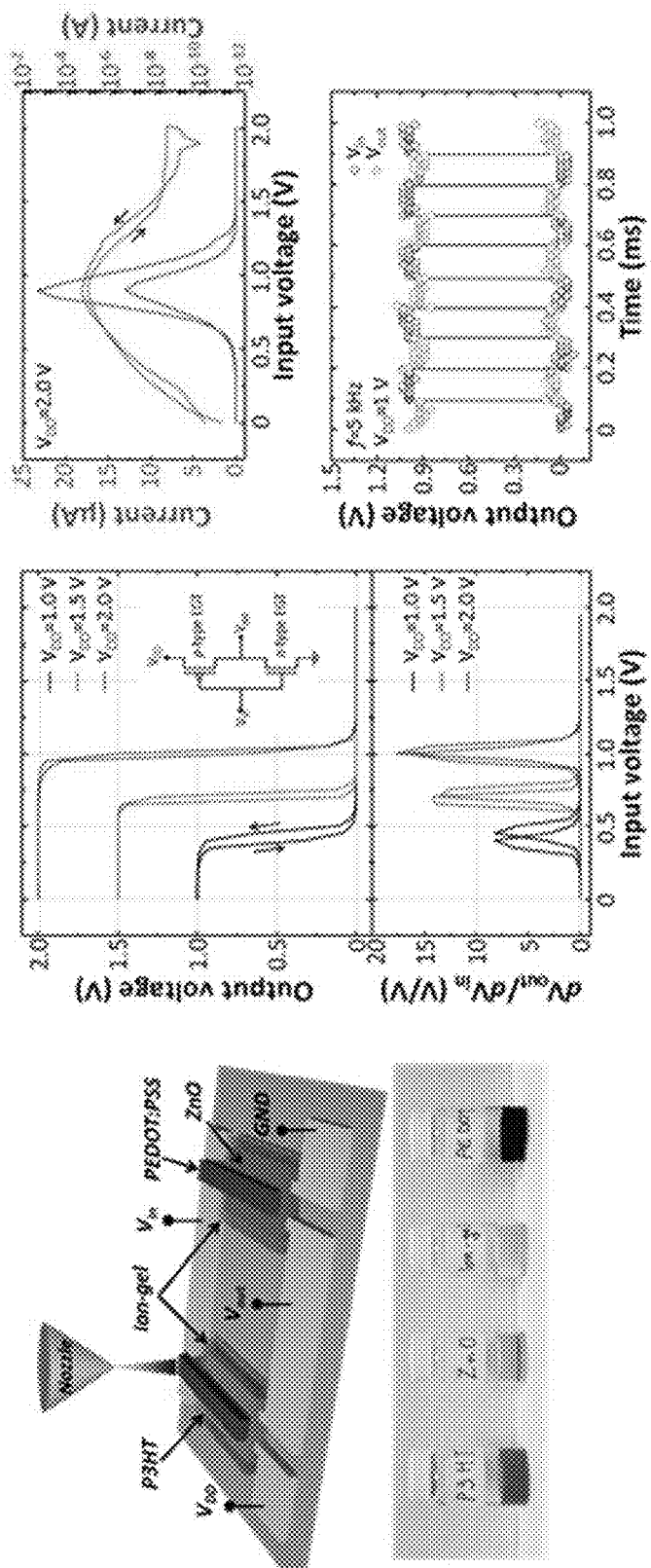

FIG. 28: (Left) Scheme of complementary inverter made by aerosol jet printing. Red semiconductor is p-type; blue is n-type. Electronic inks are shown below. (Right) Electrical characterization of the inverter.

Figure 29:
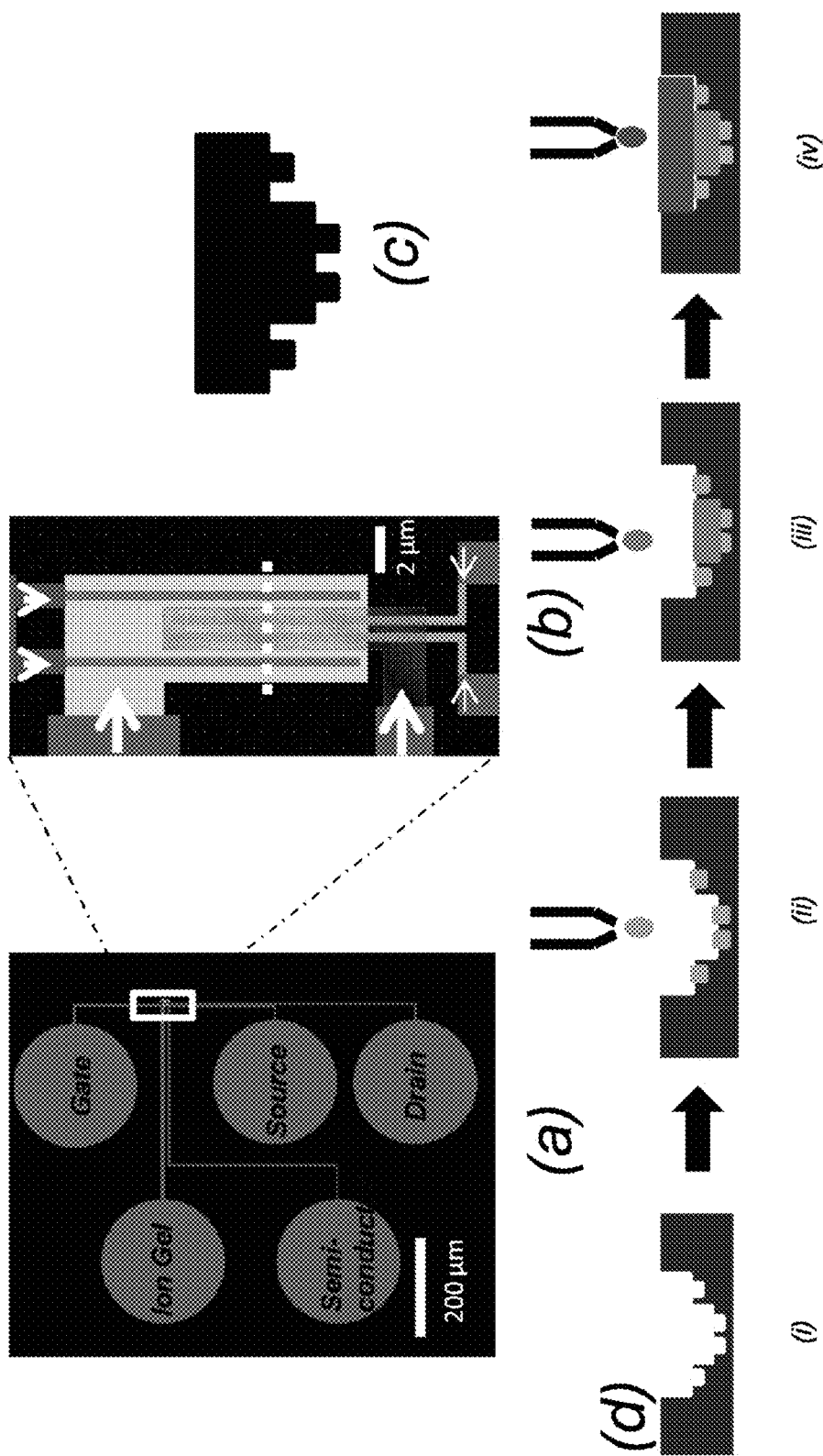

FIG. 29: (a) Planar layout of a SCALE template master for building TFTs employing high capacitance ion-gel dielectrics. The reservoirs and capillaries (in red) are photolithographically patterned. (b) An enlarged view of fine scale device structure in the template master created using FIB, and (c) cross-section of the imprint stamp prepared from the template master. Cross-section corresponds to white dotted line in (b). (d) Device fabrication by sequential deposition of metal, semiconductor and ion gel inks inside cavities nanoimprinted into the substrate. Note that the ink jet nozzles shown would deliver ink to reservoirs, not directly to the device cavity (see FIG. 25).

Figure 30:
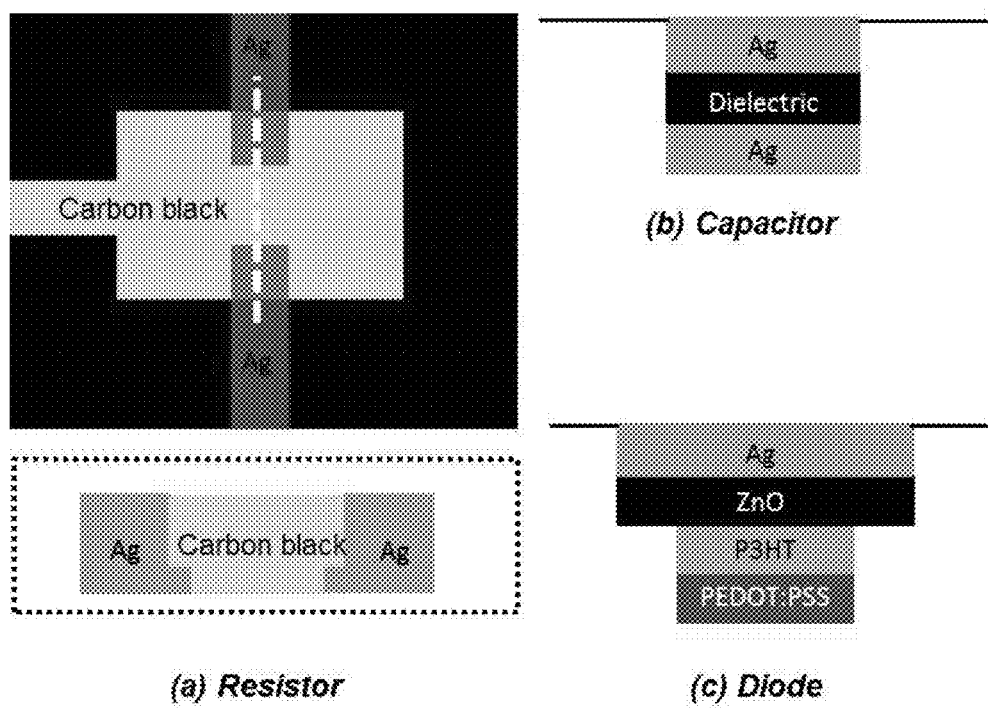

FIG. 30: (a) Planar and cross-sectional layout of a SCALE-built resistor, (b) capacitor, and (c) diode.

Figure 31:
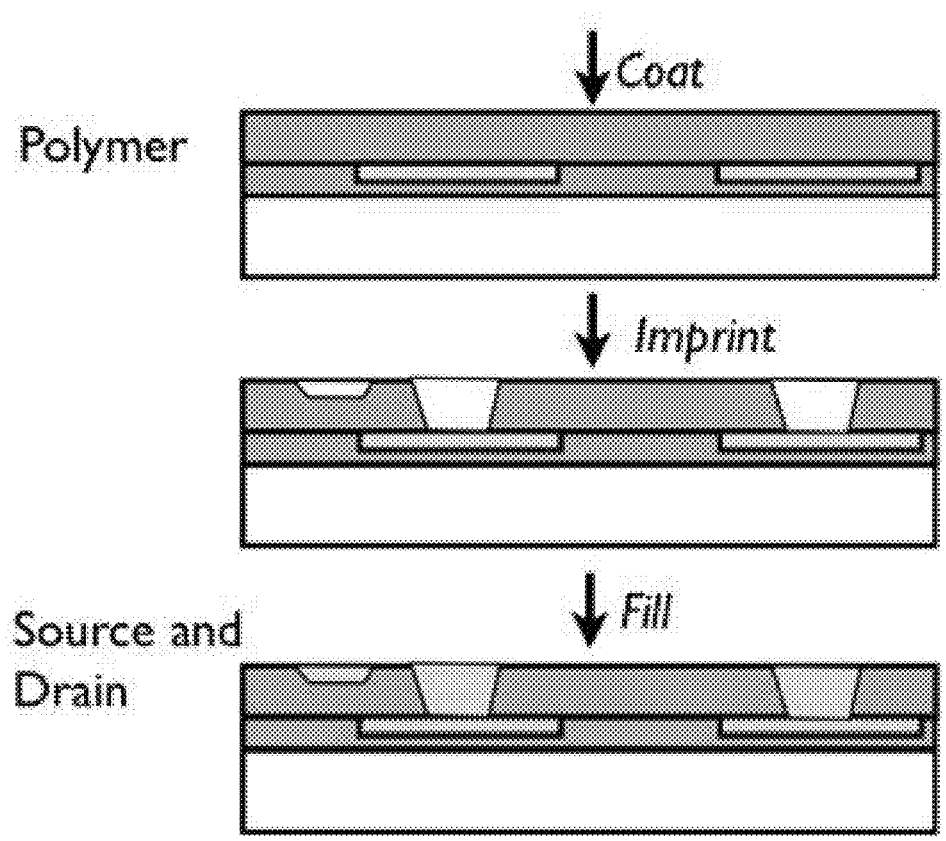

FIG. 31: SCALE process to make upper level interconnects. Ink reservoirs are not shown.

Figure 32:
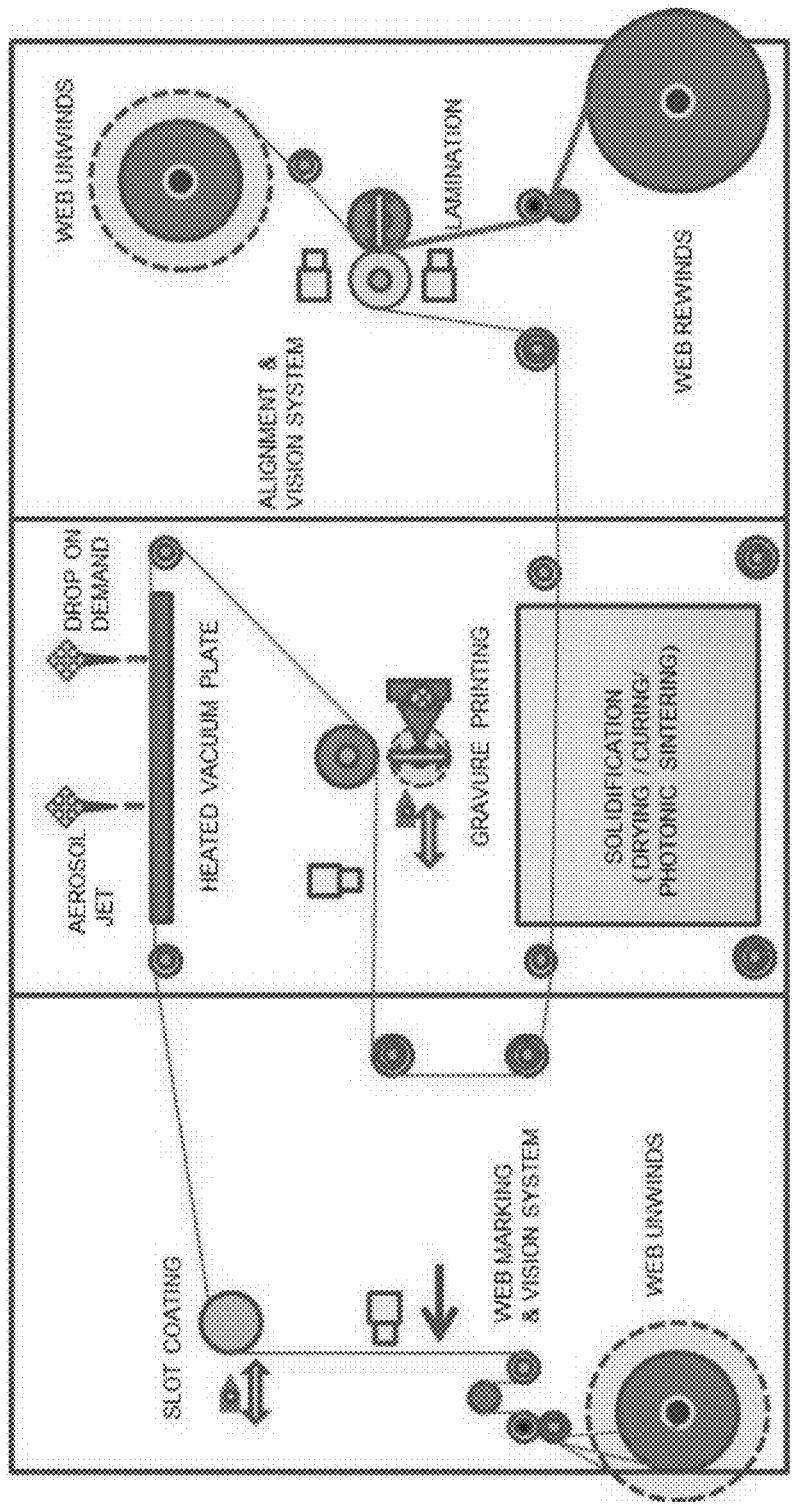

FIG. 32: Schematic diagram of an embodiment of a custom multifunctional R2R coating and printing line. The unit may be ~6 ft high and 12 ft long. One of several possible web paths is shown. The line can be used in tandem with a R2R nanoimprinting line as described herein.

FIG. 33 is a schematic drawing of an electronic device that may be produced in accordance with the teaching presented herein.

Figure 34:
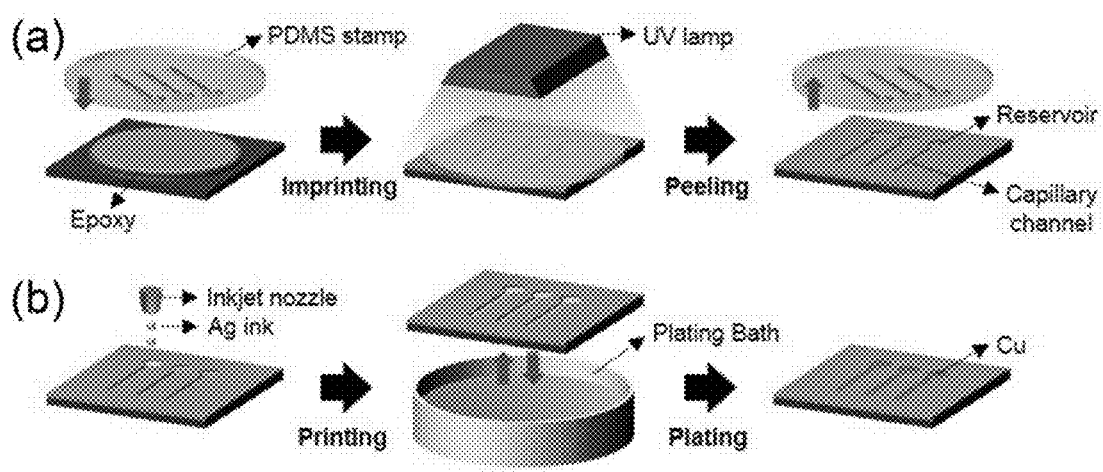

FIG. 34 is a series of schematic drawings illustrating steps of an embodiment of a process described herein. (a) Fabrication of a flexible, imprinted substrate by pressing a PDMS stamp into a PET substrate coated with a curable epoxy prepolymer, solidifying the coating by UV-illumination, and peeling the stamp after the coating is completely cured. (b) Creation of high-resolution and high-aspect ratio metal wires by first inkjet printing of a reactive Ag ink into the microimprinted reservoirs. Capillary flow drives the ink into and along the micro-channels. Finally, the channels are completely filled with metal by immersing the printed substrate in a Cu electroless plating bath.

Figure 35:
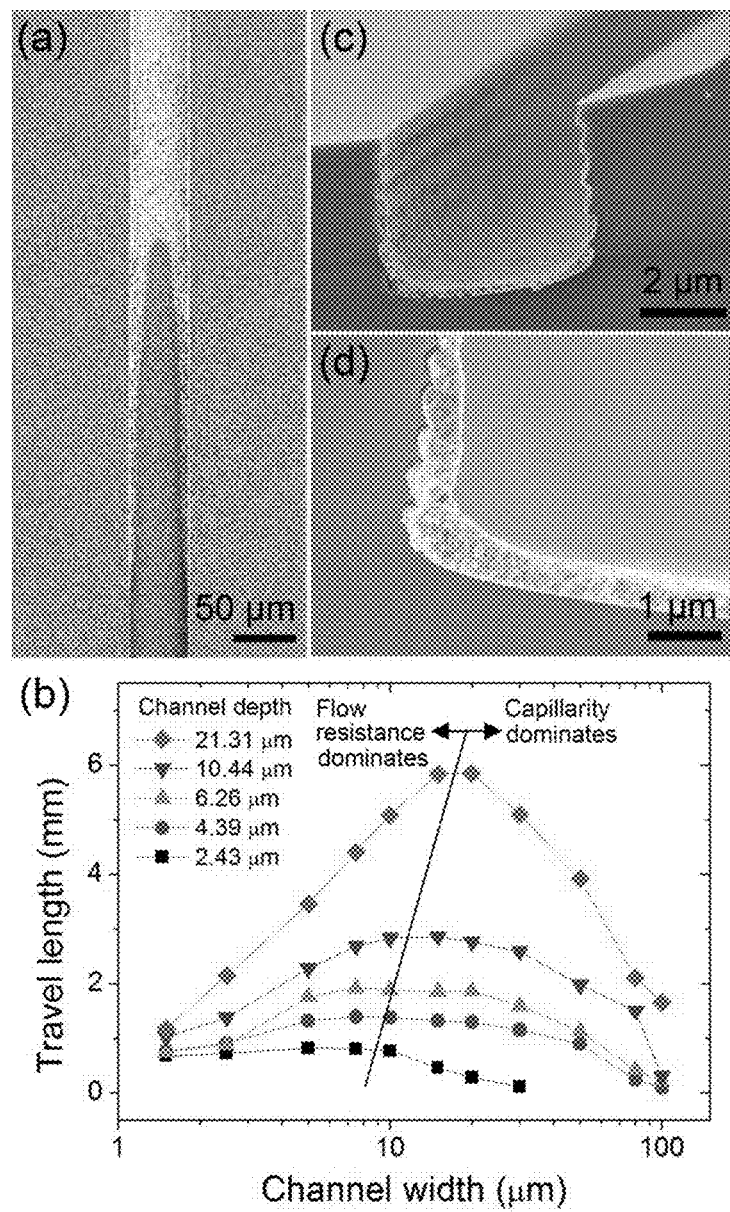

FIG. 35 presents scanning electron micrographs and data regarding capillary filling of Ag ink in microchannels. (a) Top-view scanning electron micrograph (SEM) showing the termination point of the Ag ink inside a 50 µm wide, 10 µm deep imprinted channel on a plastic substrate. (b) Variation of Ag ink travel length with different channel depths and widths. The total length of the channels was 5 cm. Cross-sectional SEM displaying (c) Ag metal deposited on the sidewalls and bottom of a 5 µm wide channel post drying and annealing of the ink, and (d) region of increased Ag thickness near one of the bottom corners of a channel.

Figure 36:
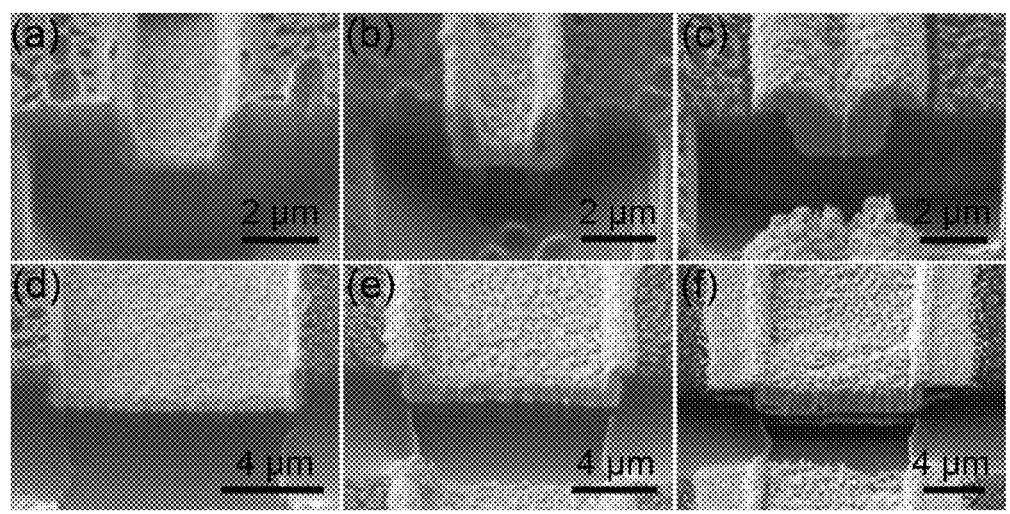

FIG. 36 presents focused ion beam cross-sections showing Cu growth in a 2.5 µm wide channel after (a) 3 min, (b) 6 min and (c) 9 min immersion time in the plating bath, and a 10 µm wide channel after (d) 3 min, (e) 6 min and (f) 9 min immersion time. The depth of the channel in both the cases is 2.5 µm.

Figure 37:
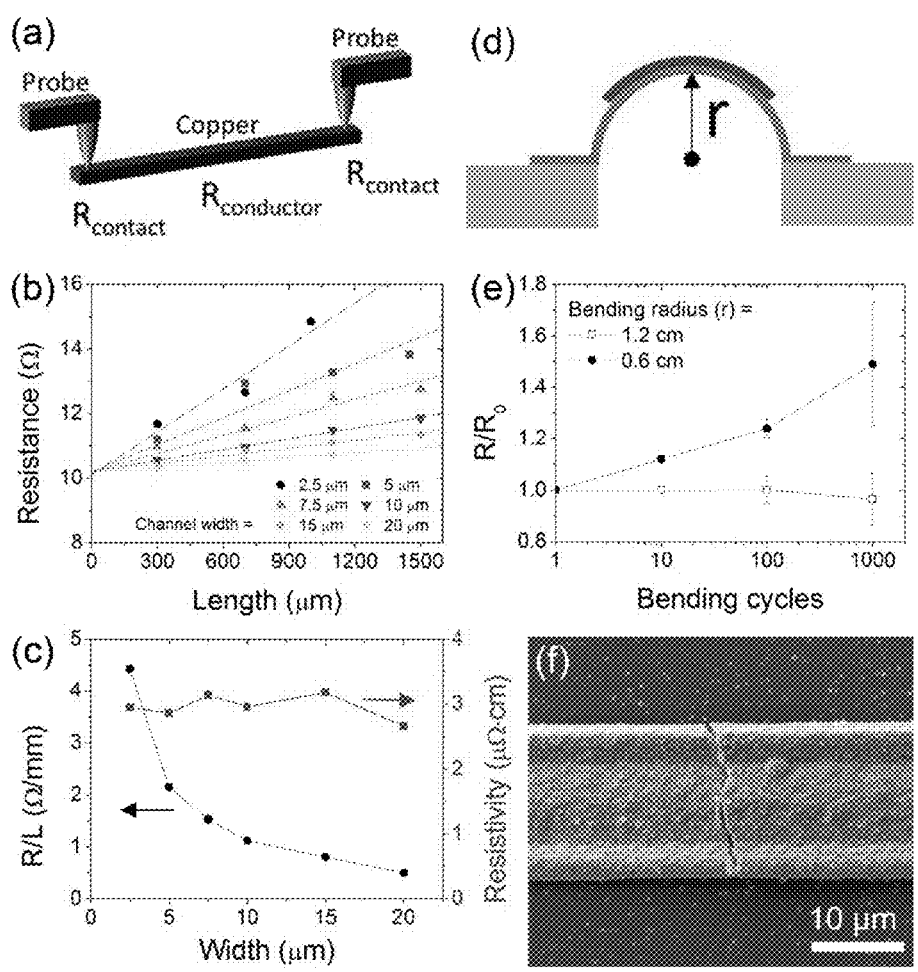

FIG. 37 presents a schematic drawing, data and SEM illustration electrical properties and bendability of Cu/AG wires. (a) Schematic of the two-point probe method to measure electrical resistance of the wires. (b) Variation of wire resistance with length for different channel widths, but constant depth (4 µm). Both 2.5 µm and 20 µm have only three data points, because of termination of capillary flow of the Ag ink before 1.5 mm. (c) Variation of linear resistance and resistivity (derived from (b)) with channel width. The resistivity values do not show a major change over the entire range of widths. (d) Schematic depicting the experimental set up for the bending test. The substrate, attached to a stationary block and a sliding stage, is bent to a certain radius and restored to its initial state to complete one bending cycle. (e) Electrical resistance of the wires as a function of bending cycles under different bending radii (0.6 cm and 1.2 cm). (f) SEM showing a micro-crack along the width of a wire after 1000 bending cycles at r=0.6 cm.

Figure 38:
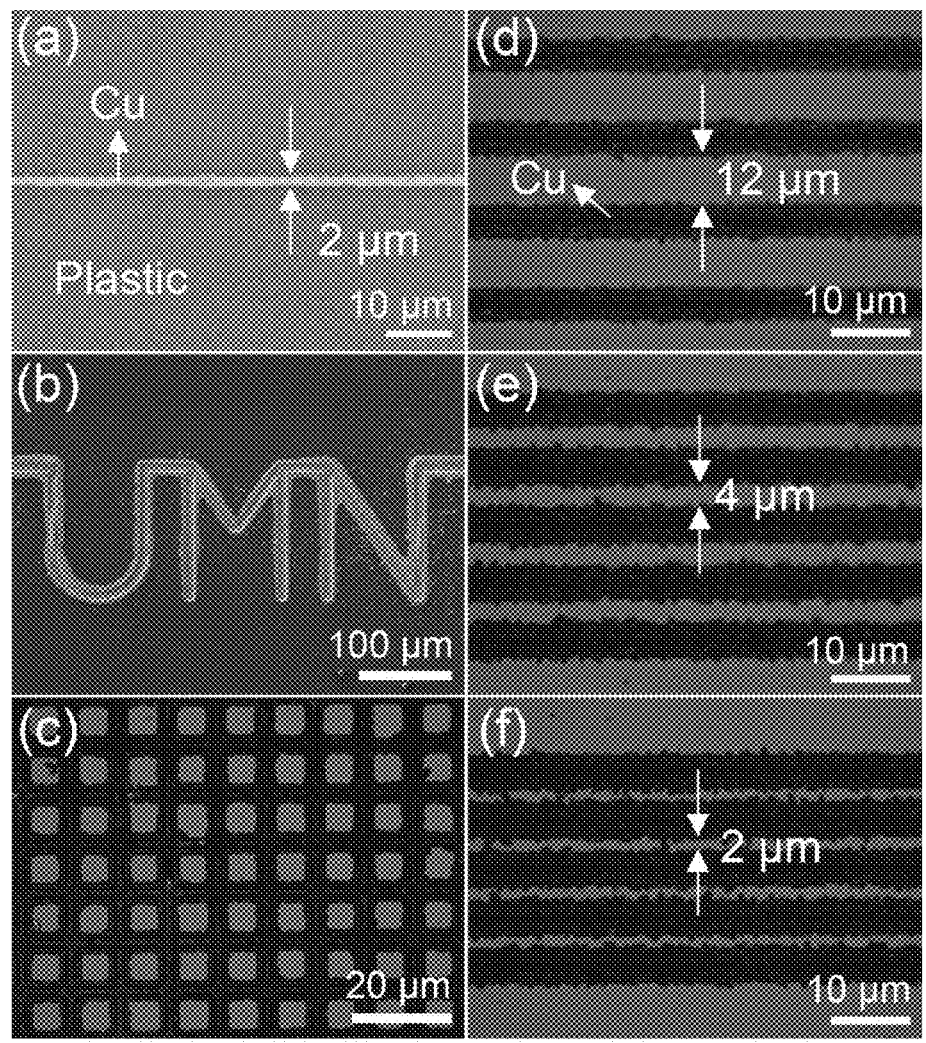
Figure 39:
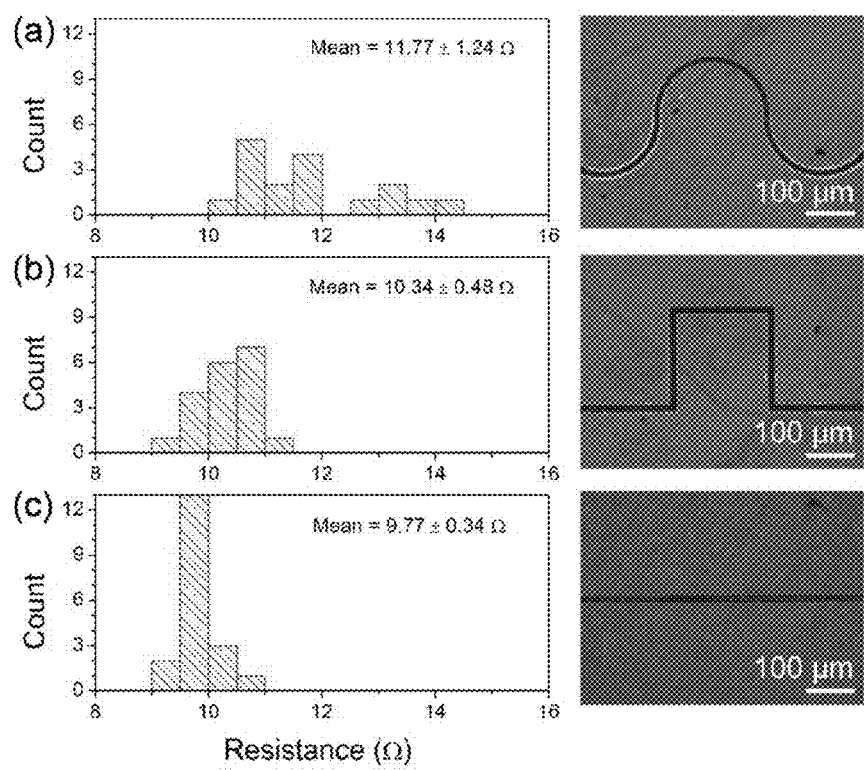

FIG. 38 are SEM images of a patterned (a) 2 µm wide Cu/Ag wire and (b) UMN feature on a plastic substrate. The lighter region is metal. Optical micrographs showing (c) a crossbar pattern (line width and spacing: 5 µm), and an array of 4 µm wide lines with a spacing of (d) 12 µm, (e) 4 µm, and (f) 2 µm. Darker regions are metal. Occasional shorting in 2 µm wires is evident FIG. 39 shows data and images illustrating the effect of channel shape on electrical resistance. Histogram showing distribution of resistance of 18 wires fabricated in (a) curvilinear channels, (b) linear channels with four 90° bends and, (c) linear channels with no bends. The length of each wire was 1 mm.

The schematic drawings are not necessarily to scale. Like numbers used in the figures refer to like components, steps and the like. However, it will be understood that the use of a number to refer to a component in a given figure is not intended to limit the component in another figure labeled with the same number. In addition, the use of different numbers to refer to components is not intended to indicate that the different numbered components cannot be the same or similar.

DETAILED DESCRIPTION

In the following detailed description several specific embodiments of compounds, compositions, apparatuses, systems and methods are disclosed. It is to be understood that other embodiments are contemplated and may be made without departing from the scope or spirit of the present disclosure. The following detailed description, therefore, is not to be taken in a limiting sense.

This disclosure generally relates to, inter alia, flexible devices, which may include, for example, high performance integrated circuits on flexible, stretchable, conformal, and impact resistant substrates for applications in robotics (e.g., 'e-skins'), wearable health diagnostics, drug-delivery, distributed sensing, and human-machine interfacing. Processes for manufacturing such devices are described herein.

In various embodiments, articles described herein are formed from a substrate that defines one or more microchannels and one or more reservoirs. One or more microchannel is in fluid communication with one or more reservoirs. A liquid composition is disposed in a reservoir and the composition moves through the one or more microchannels in communication with the reservoir via capillarity. In some embodiments the liquid composition contains a liquid carrier and a material of interest. In some embodiments, the liquid carrier is evaporated leaving the material of interest deposited in one or more microchannels and reservoir.

Any suitable flexible article may be manufactured using the processes described herein. In some embodiments the article is an electronic article. In some embodiments, the article is an optics article, such as a wave guide. Materials used to produce the articles described herein, as well as the design and configuration of the articles described herein, will determine they type of articles produced and their potential uses.

In some embodiments, the articles described herein are not flexible. It will be understood that the materials selected and processes used will, in part, determine whether the resulting device is flexible or inflexible. In some embodiments, a flexible device described herein can have a bending radius of 0.5 cm or less. In many embodiments, a flexible device described herein has a bending radius of greater than 0.2 cm.

Examples of materials that can form flexible substrates include epoxies, polyurethanes, and the like. In some embodiments, the substrate is formed from an epoxy.

It will be understood that the thickness of the substrate will contribute to flexibility, with thinner substrates typically being more flexible than thicker substrates formed from the same material. In some embodiments, a substrate of a device used herein has a thickness about 500 micrometers or less. For example, the substrate may have a thickness of 400 micrometers or less, 300 micrometers or less, or 200 or less. Typically, the substrate has a thickness of 20 micrometers or more, such as 25 micrometers or more, or 50 micrometers or more. A substrate as described herein may have a thickness in a range between any of the foregoing values.

A structured substrates as described herein can be produced by any suitable process that can produce substrates having features (such as microchannels) having a dimension (such as height or width) of about 500 micrometers or less can be employed. In some embodiments, the process can produce substrates having features having a dimension of 100 micrometers or less, such as 50 micrometers or less or 10 micrometers or less. Examples of such processes include imprint lithography, microreplication, embossing, laser etching, chemical etching, 3D printing, extrusion and the like, or combinations thereof.

In some embodiments, a polymerizable material, such as epoxy resins (or other polymerizable material that can be used to form the polymers described above), is disposed on a polymeric film, and the polymerizable material is cured on the film to produce the substrate. In some embodiments, the film is a flexible thin film. Any suitable flexible thin film can be used. Examples of suitable flexible thin films include polyimide films, polyethylene terephthalate (PET) films, and the like.

Figure 1:
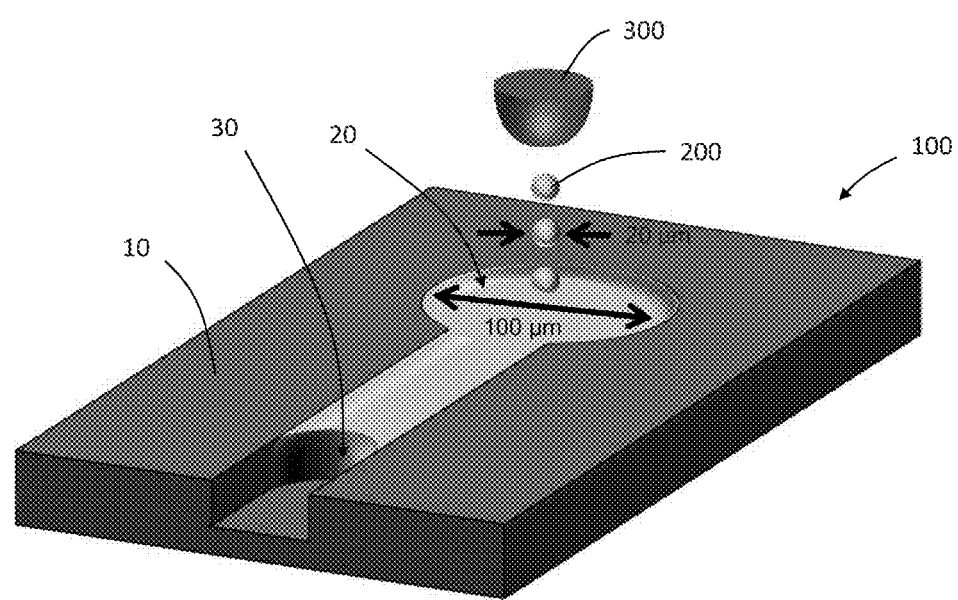
FIG. 1 is a schematic cut-away perspective view of a portion of an embodiment of a device having a substrate defining a microchannel and reservoir.

Referring now to FIG. 1, a portion of a device 100 is shown. The device 100 includes a substrate 10, which in some embodiments can be flexible. The substrate 10 defines a reservoir 20 and a microchannel 30 in fluid communication with the reservoir. A liquid composition 200 is disposed in the reservoir 20. The microchannel 30, reservoir 20, and fluid composition 200 are configured such that disposing of the liquid composition 200 in the reservoir 20 will cause the liquid composition 200 to move through the microchannel 30 via capillarity.

One of skill in the art will understand that a number of factors will affect the ability of a liquid composition 200 to move through a microchannel 30 via capillarity. Such factors include the width of the microchannel 30, the depth of the microchannel 30, the surface tension and adhesive forces between the liquid composition 200 and the walls and base of the microchannel 30, the viscosity of the liquid composition 200, and the like. The volume of the reservoir 20 and the volume of liquid composition 200 disposed in the reservoir 20 can also affect the ability of the liquid composition 200 to move through the microchannel 30 via capillarity. It has been found that for a given width of microchannel, greater depth will tend to lead to larger travel lengths. Often, travel length of the liquid composition through a microchannel will be limited by evaporation of a liquid carrier, such as a solvent, of the composition. Liquid compositions with lower vapor pressures can be used to enhance travel lengths. For example, a high boiling point solvent can augment travel length of the liquid composition, which can be useful for, for example, conductors, interconnects, and the like, while a low boiling point solvent can result in shorter travel length, which can be suitable for, for example, selective, short-length patterning of semiconductors, dielectrics, and the like. Alternatively, covers or other apparatuses may be placed over the microchannels to reduce evaporation to enhance travel length.

A microchannel 30 can have any suitable width and depth, which can, in part, be determined by one or more of the factors described above or a desired characteristic of the material to be deposited in the microchannel. For example, if conductive material is deposited in the microchannel to form a conductor, the cross-sectional area of the deposited material (as well as the properties of the material itself) can affect, for example, the durability or conductivity of the conductor.

In some embodiments, a microchannel can have a width or depth in a range from about 50 nanometers to about 100 micrometers. For purposes of this disclosure, microchannels within such ranges of widths and depths are considered "microchannels." In some embodiments, a microchannel can have a width or depth in a range from about 100 nanometers to about 50 micrometers.

Reservoirs as described herein will typically have a depth that is the same as the depth of a microchannel with which it is in communication. Reservoirs can have upper apertures defined by the substrate of any suitable diametric dimensions (width, diameter, etc.). In some embodiments, the reservoirs have diametric dimensions in a range from about 50 micrometers to about 500 micrometers.

Still with reference to FIG. 1, the reservoir 20 and microchannel 30 can have the same depth.

The reservoir 20 has a width greater than the microchannel 30. In the depicted embodiment, the reservoir 20 has a width of 100 micrometers. It will be understood that the reservoir 20 can have any suitable width and that the width of 100 micrometers depicted in FIG. 1 is shown for purposes of illustration of one suitable width. The dimensions of an upper aperture of the reservoir 20 (e.g., width, diameter, etc.) defined by the substrate 10 can be sufficiently large to allow the liquid composition 200 to be disposed in the reservoir 20.

The liquid composition 200 can be deposited in the reservoir 20 in any suitable manner, such as pouring, funneling, printing, and the like. In the depicted embodiment, the liquid composition 200 is deposited in the reservoir 20 via an ink jet print head 300, which dispenses the liquid composition 200 in 20 micrometer diameter droplets. It will be understood that the droplets of liquid composition 200 can have any suitable size and that the 20 micrometer droplets depicted in FIG. 1 are shown for purposes of illustration of one suitable diameter. Ink jet printers or other printers or dispensing apparatuses that dispense a liquid composition in 20 micrometer droplets or other size droplets, streams, etc. can be employed.

Any suitable liquid composition 200 may be employed in accordance with the teachings presented herein. In some embodiments, the liquid composition includes a liquid carrier and an electronic material. An "electronic material" is a material having properties desired for use in electronic devices. Examples of electronic material include conductive material, dielectric material, semiconductor material, and the like. The liquid carrier of the liquid composition can be a solvent or other suitable liquid carrier in which the electronic material can dissolved, suspended, or the like. In some embodiments, the liquid composition is an electronic ink. As used herein, an "electronic ink" is a liquid composition comprising one or more electronic material that is configured for deposition via a printing technique, such as an ink jet printing technique. Some examples of suitable electronic inks are described below.

In some embodiments, a liquid composition includes a liquid carrier and an optical material. As used herein, an "optical material" is a material having a characteristic desired for used in an optical device. For example, different optical materials may have different optical characteristics, such as different indices of refraction. Materials having differing indices of refraction can be employed in, for example, a light guide or other suitable device to guide light within a microchannel of a device as described herein.

In some embodiments, the liquid carrier is evaporated from the microchannel, leaving the material of interest, such as the electronic material or the optical material, in the microchannel. Evaporation can be enhanced by heat, low humidity conditions, or the like, or combinations thereof. When the liquid carrier is removed, the remaining material of interest may not fill the microchannel. In some embodiments, the microchannel can be left partially filled with the deposited layer of material of interest. In other embodiments, additional material can be deposited on the initially deposited layer of material of interest. The additional material can be the same or different from the initially deposited material of interest. One way to deposit additional material on top of the material of interest is to deposit a liquid composition comprising the additional material in the reservoir to cause the liquid composition with the additional material to move through the microchannel over the deposited material of interest. The liquid composition comprising the additional material can also include a liquid carrier, which can be removed (e.g., by evaporation) leaving the additional material disposed on the first material of interest deposited in the microchannel. This process can be repeated one or more times to leave one or more layers within a microchannel.

In some embodiments, a liquid carrier of the liquid composition can include polymerizable materials, such as monomers. If the material is polymerized prior to evaporation of a substantial amount of the liquid composition or a component thereof, the polymerized material and any other materials in the composition can completely or nearly completely fill the microchannel.

In some embodiments, a process other than dispensing a liquid composition in the reservoir to cause the composition to move through the microchannel over a previously deposited layer can be used to deposit additional material on a layer of material in the microchannel. In some embodiments, a metallic material is plated or deposited on the layer in the microchannel. Any suitable type of plating or deposition can be used. In some embodiments, electroplating is used. In some embodiments, electroless plating is used. In some embodiments, material in the microchannel is pretreated so that the metallic material is selectively plated in the layer of material in the microchannel. In some embodiment, no pretreatment is required for selective deposition. For example if the material in the microchannel is a metallic material, such as silver, pretreatment may not be needed because the metallic material in the microchannel can serve as a seed for selective deposition of the plated metal. Any suitable metallic material, such as copper, nickel, etc. or alloys or combinations thereof, can be plated on the material in the microchannel.

In some embodiments, where the material in the microchannel is a conductive material it may be desirable to fill the channel with conductive material to provide desired electrical properties such as conductance and to provide durability, particularly if the substrate is flexible. The size of the microchannel (e.g., depth and height) can also be controlled to provide desired electrical properties, whether filled or not.

Figure 2A:
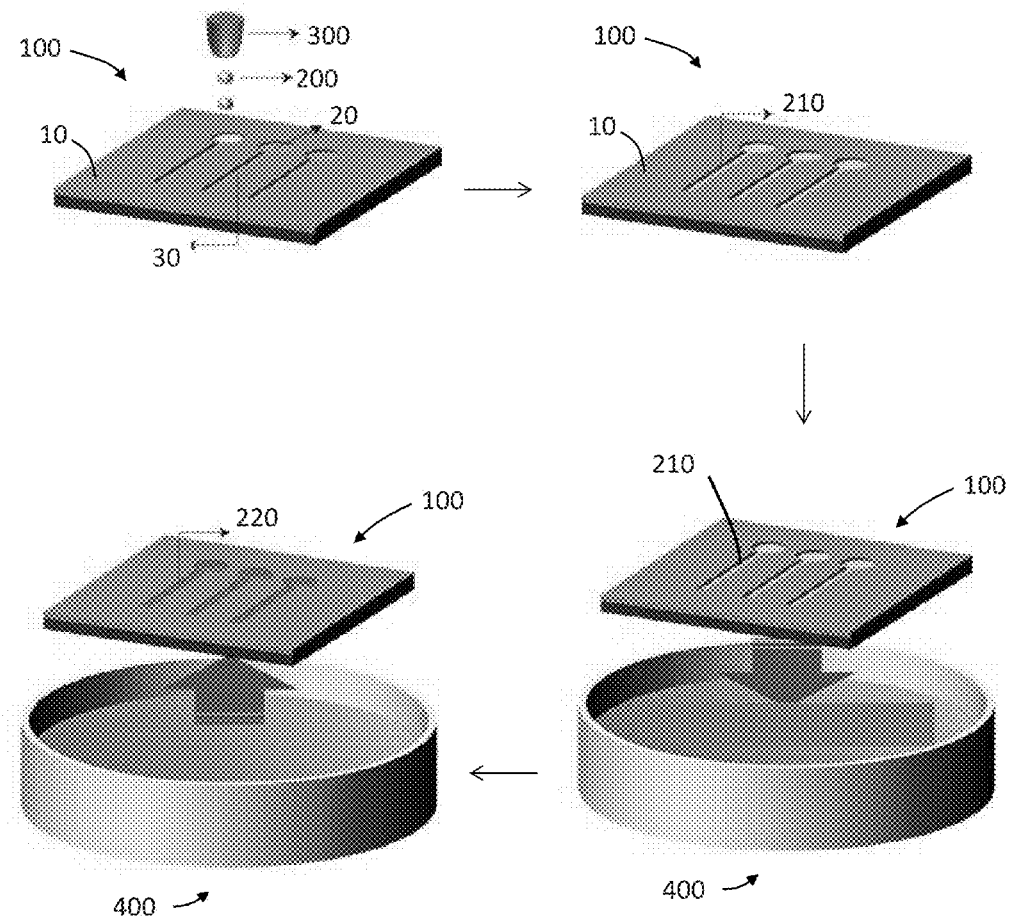
FIG. 2A is a schematic overview of an embodiment of a process for plating metallic material on a layer of conductive material disposed in reservoirs and microchannels defined by a substrate.
Figure 2B:
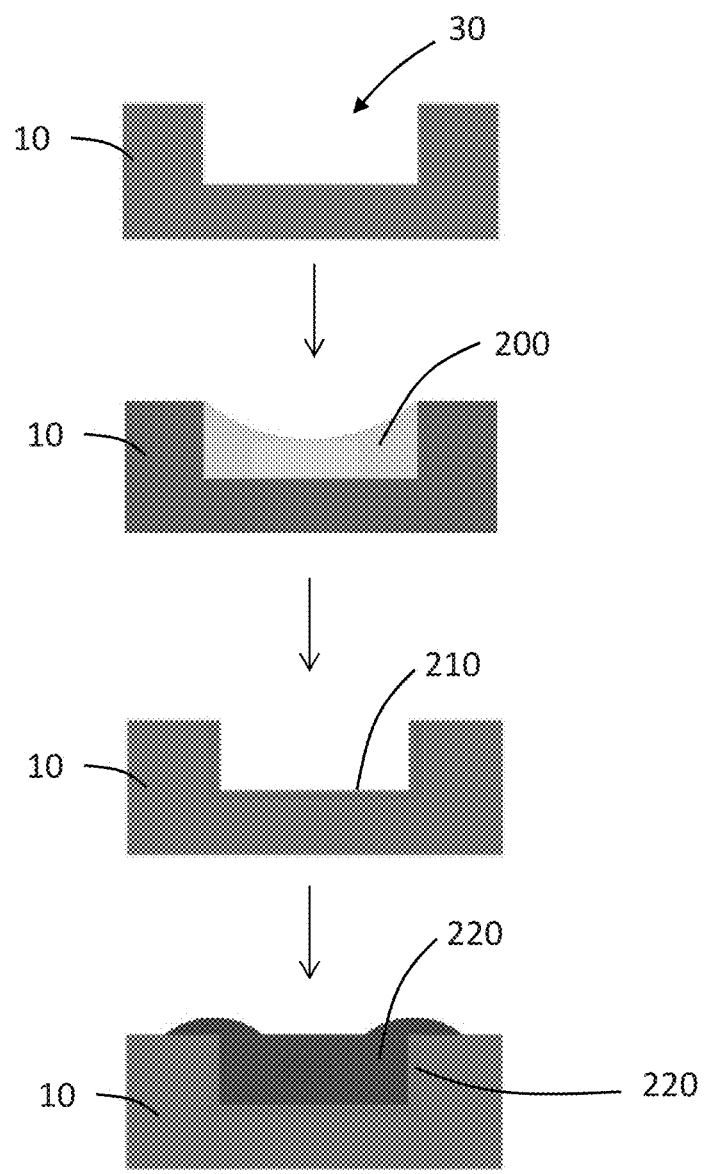
FIG. 2B is a series of schematic cross sectional views of an embodiment of a substrate and deposited material at various stages of a process depicted in FIG. 2A.

Referring now to FIGS. 2A-B, schematic drawings of a process (FIG. 2A) for disposing materials in a microchannels 30 defined by a substrate 10 of a device 100 and a cross section (FIG. 2B) of a portion of the device showing a microchannel during various stages of the process are shown. The upper right panel of FIG. 2A is similar to FIG. 1, except that the substrate 10 forms a plurality of reservoirs 20 and a plurality of microchannels 30. The substrate 10 or the print head 300 can be moved so that the liquid composition can be deposited in each of the appropriate reservoirs 30. Alternatively, a plurality of print heads can be employed. In the upper left panel of FIG. 2A, liquid composition has been added to each of the reservoirs has moved through each of the microchannels. As indicated above, a liquid carrier can be removed by, for example, evaporation to leave a layer of material of interest 210 deposited in the microchannels and reservoirs. In the depicted embodiment, the material of interest 210 can be a metallic material, such as silver. The device 100 with deposited material of interest 210 is introduced into a plating apparatus 400, which is an electroless plating bath in the embodiment depicted. The metallic material of interest 210 can serve as a seed layer for deposition of the metallic material 220, such as copper, which can be selectively be deposited on the seed layer in the microchannels (see lower left panel of FIG. 2A).

Referring now to FIG. 2B, a schematic cross sectional view of a microchannel 30 through the process illustrated in FIG. 2A is shown. Prior to deposition of a liquid composition in the reservoir, the microchannel 30 defined by the substrate 10 is empty. After the liquid composition 200 is deposited in a reservoir in communication with the microchannel 30, the liquid composition 200 moves through the microchannel 30 via capillarity. A liquid carrier, such as a solvent, of the liquid composition is removed to leave a layer of material of interest 210 deposited in the microchannel 30. Material 210 serves as a seed layer for deposition of metallic material 220, which in the depicted embodiment fills the microchannel. It will be understood that the extent to which material 220 fills the microchannel can depend on the conditions with which material 220 is deposited and the time allotted for deposition of material 220.

Any suitable device can be manufactured according to the processes described herein. In many embodiments, the devices are electronic devices. Material deposited in the microchannels can serve as wires (e.g., leads or conductors) and material deposited in the reservoirs can serve as contacts. A number of electronic circuits that can be formed in accordance with the teachings presented herein, as well as some embodiments of processes for forming the circuits, are shown in, for example, FIGS. 3-20.

Figure 3A:
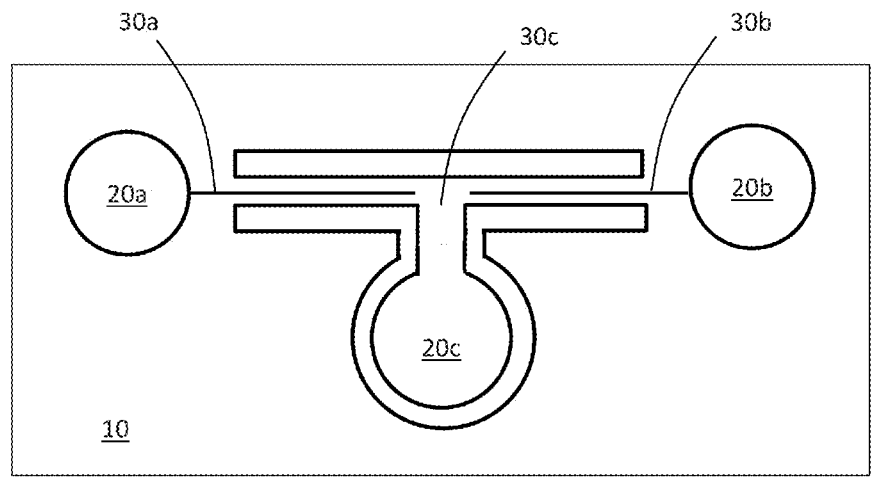
FIGS. 3A-C are a series of schematic plan views of an embodiment of a substrate and deposited materials for use in forming an embodiment of a resistor.
Figure 3B:
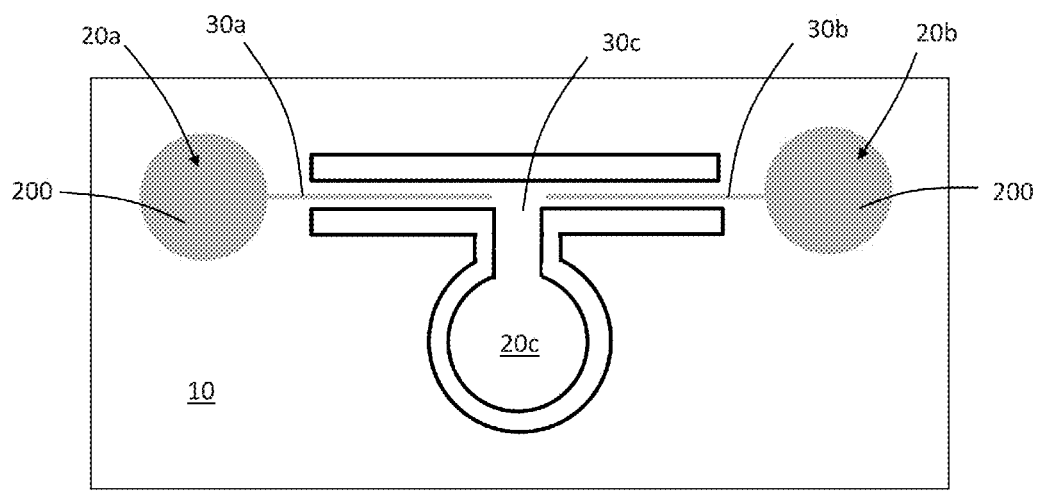
Figure 3C:
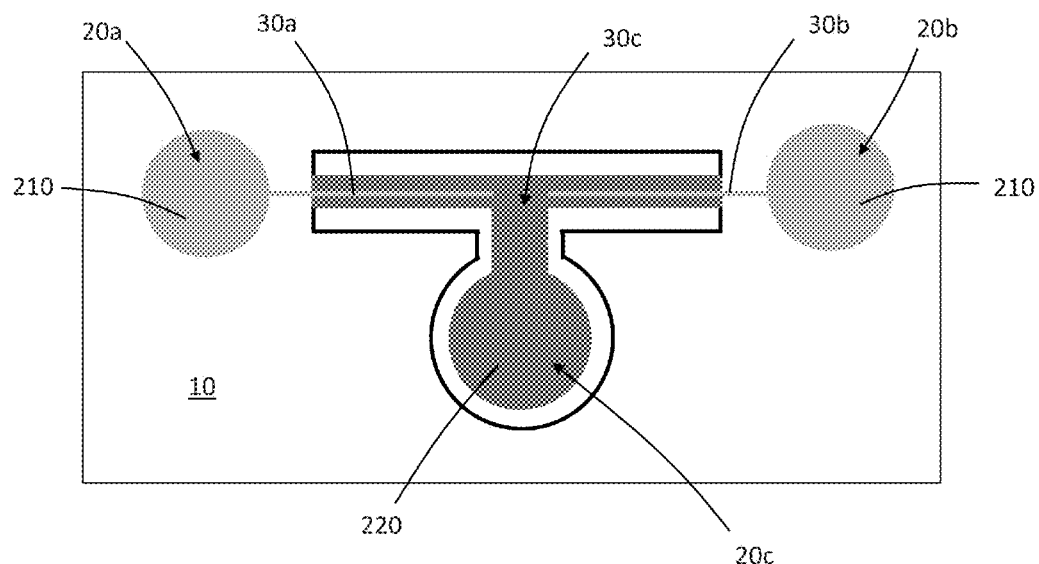

Referring now to FIG. 3A-C, a substrate 10 and process for forming a resistor is shown. As shown in FIG. 3A, the substrate 10 defines a first reservoir 20a and a first microchannel 30a that is in communication with the first reservoir. The substrate 10 also defines a second reservoir 20b and a second microchannel 30b that is in communication with the second reservoir, and a third reservoir 20c and a third microchannel 30c that is in communication with the third reservoir. The first 20a and second 20b reservoirs are of the same or similar dimensions and can be formed at similar depths in the substrate 10. The third reservoir 20c is larger than the first and second reservoirs, and the third microchannel 30c is wider than the first and second microchannels. The third reservoir 20c and third microchannel 30c can be at the same depth in the substrate that the first and second reservoirs and microchannels, at a higher depth, or can be above a major surface of the substrate. As shown in FIG. 3B, a liquid composition 200 comprising a conductive material, such as a silver ink, can be disposed in the first 20a and second 20b reservoirs, which causes the liquid composition 200 to move through the first 30a and second 30b microchannels. A liquid carrier can be removed from the liquid composition to leave the conductive material 210 in the first 30a and second 30b microchannels. A second liquid composition 220 containing a resistive material, such as carbon black, can be dispensed in the third reservoir 20c to cause the second liquid composition 220 to move through the third microchannel 30c. A liquid carrier can be removed from the second liquid composition if needed to leave the resistive material disposed in the third microchannel 20c. The conductive material 210 in the first 20a and second 20b reservoirs can serve as electrical contacts. Electricity flowing from one contact to the other passes through the resistive material deposited by the second liquid composition 220. Accordingly, the device forms a resistor.

Figure 3D:
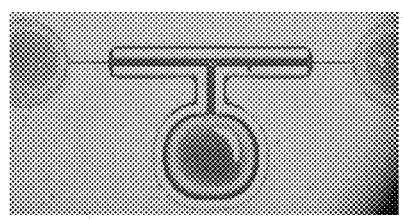
FIG. 3D is an image of an embodiment of a resistor made in accordance with the process depicted in FIGS. 3A-C.
Figure 3E:
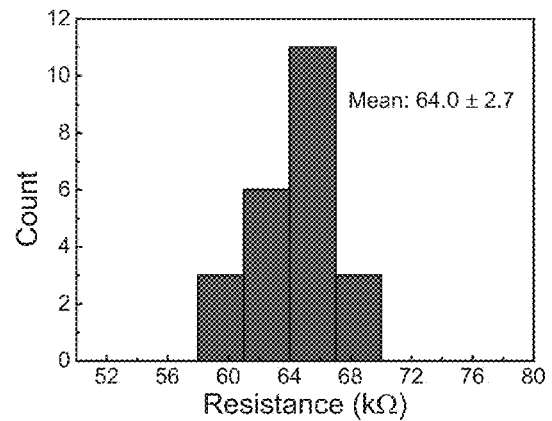
FIG. 3E is a plot of resistance of an embodiment of a resistor made in accordance with the process depicted in FIGS. 3A-C.

FIG. 3D is an image of a resistor formed as described above using silver as the conductive material and carbon black as the less conductive material. FIG. 3E is a graph showing resistance measured through a resistor as shown in FIG. 3D. The tested device had an epoxy substrate. The conductive channels were 10 micrometers in both height and width in which silver was deposited. The less conductive channel was 50 micrometers in both height and width in which carbon black was deposited. Reservoirs for the silver ink and carbon black ink were 400 micrometers and 500 micrometers, respectively. Electrical measurements were done by a two-point probe method, where the silver reservoirs served as contact pads for the probes. The mean resistance was 64.0+/−2.7 kΩ.

Figure 4A:
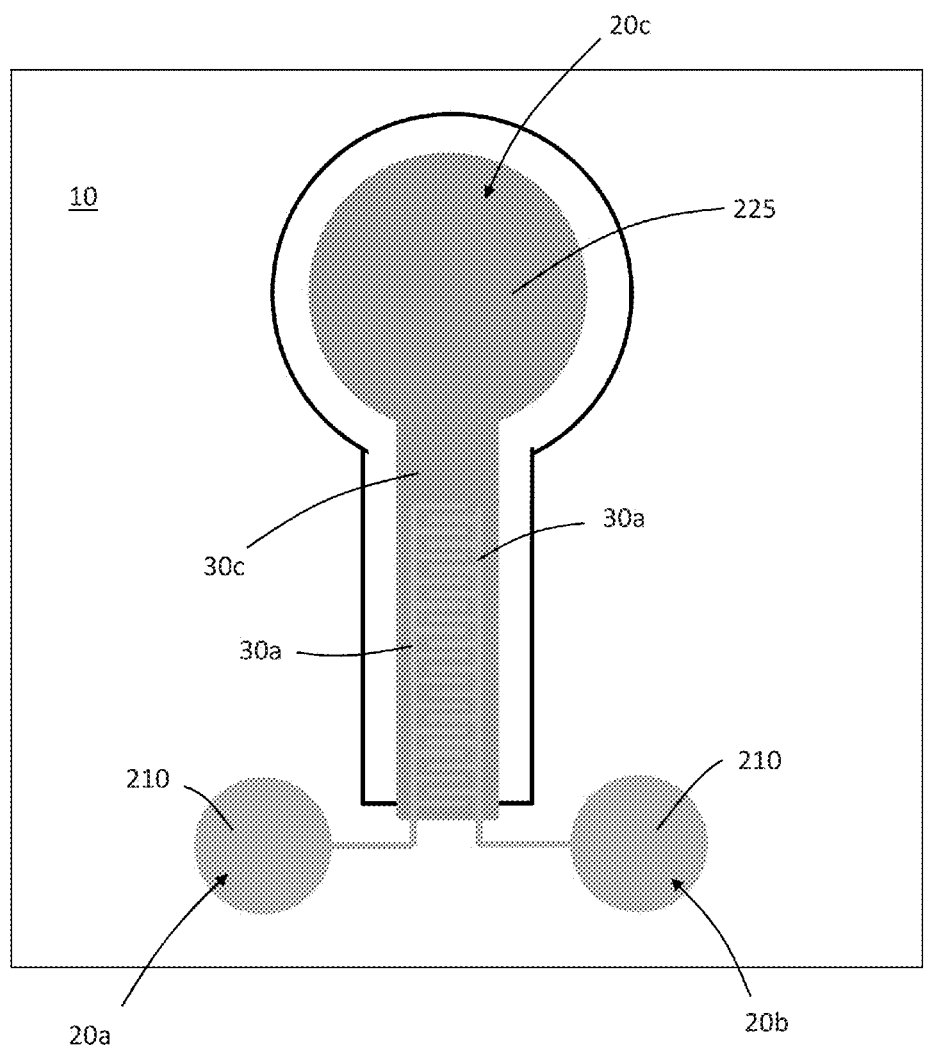
FIG. 4A is a schematic plan view of an embodiment of capacitor.

FIG. 4A is a schematic drawing of a capacitor formed in accordance with the teaching presented herein. The substrate 10 depicted in FIG. 4A defines a first reservoir 20a and a first microchannel 30a that is in communication with the first reservoir. The substrate 10 also defines a second reservoir 20b and a second microchannel 30b that is in communication with the second reservoir, and a third reservoir 20c and a third microchannel 30c that is in communication with the third reservoir. The first 20a and second 20b reservoirs are of the same or similar dimensions and can be formed at similar depths in the substrate 10. The third reservoir 20c is larger than the first and second reservoirs, and the third microchannel 30c is wider than the first and second microchannels. The third reservoir 20c and third microchannel 30c can be at the same depth in the substrate that the first and second reservoirs and microchannels, at a higher depth, or can be above a major surface of the substrate. A liquid composition comprising a conductive material, such as a silver ink, can be disposed in the first 20a and second 20b reservoirs, which causes the liquid composition to move through the first 30a and second 30b microchannels. A liquid carrier can be removed from the liquid composition to leave the conductive material 210 in the first 30a and second 30b microchannels. A second liquid composition containing, for example, a dielectric material can be dispensed in the third reservoir 20c to cause the second liquid composition to move through the third microchannel 30c. In some embodiments, the dielectric material is an ion gel dielectric material. Examples of ion gel dielectrics that can be used are as described in Cho et al. (2008), *Nature Materials*, 7(11), 900-906, which is hereby incorporated herein by reference to the extent that it does not conflict with the disclosure presented herein. A liquid carrier can be removed from the second liquid composition, if needed, to leave the dielectric material 225 disposed in the third microchannel 20c. The conductive material 210 in the first 20a and second 20b reservoirs can serve as electrical contacts.

Figure 4B:
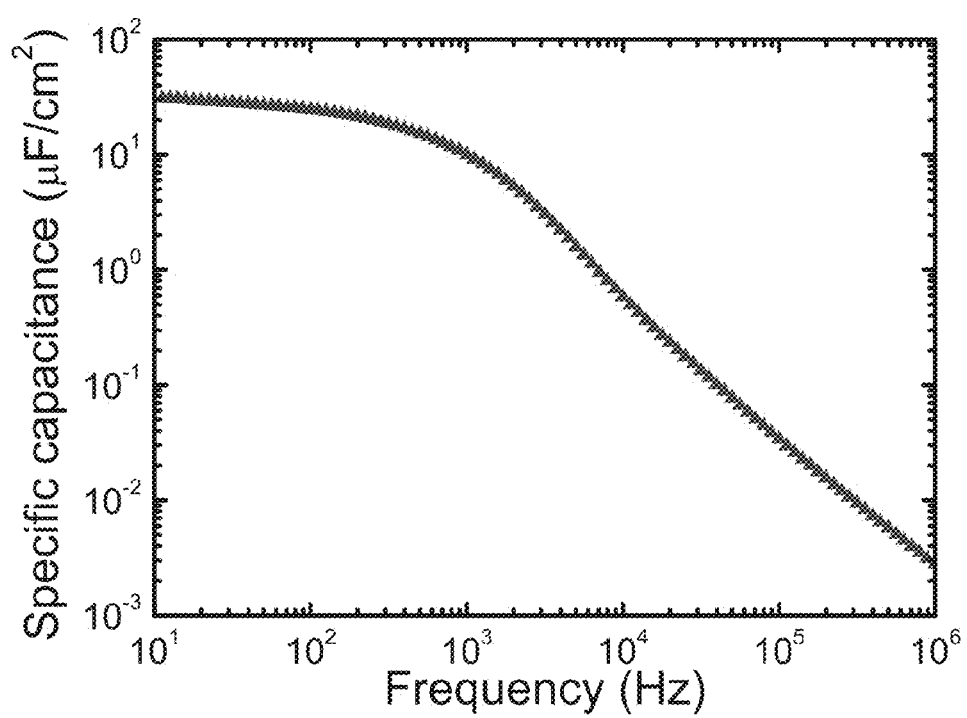
FIG. 4B is a plot specific capacitance vs. frequency of an embodiment of a capacitor as depicted in FIG. 4A.

FIG. 4B is a graph of specific capacitance vs. frequency obtained using a capacitor formed as depicted in FIG. 4A. The tested device had an epoxy substrate. Channels for conductive material (silver) were 10 micrometers in both height and width. The channel for the dielectric material (ion gel) was 50 micrometers in both height and width. Reservoirs for the silver ink and ion gel ink were 400 and 500 um in diameter, respectively. Capacitance measurements were done by using an impedance analyzer instrument (HP 4192 A), where the Ag reservoirs served as contact pad for the probes.

Figure 5:
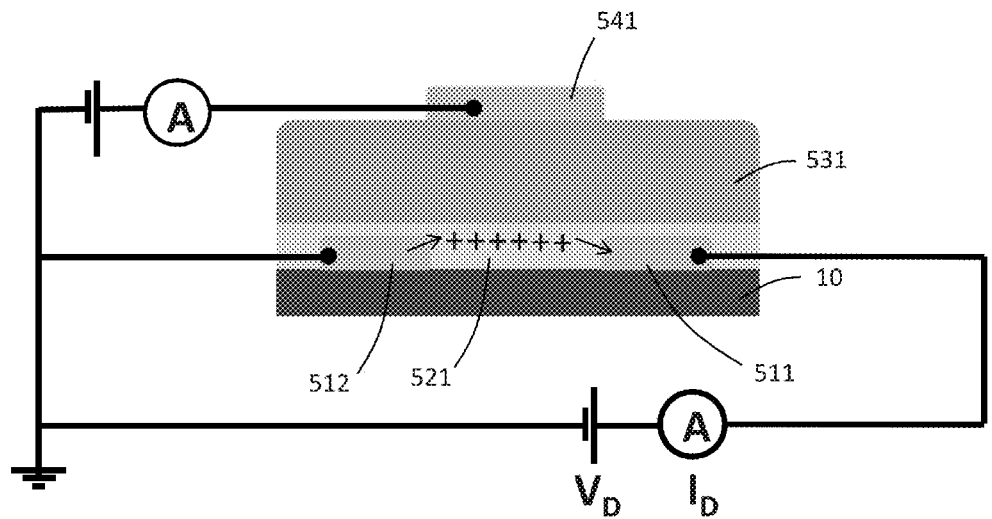
FIG. 5 is a schematic drawing of a thin film transistor (TFT) formed on a flat substrate and associated circuit diagram.
Figure 6:
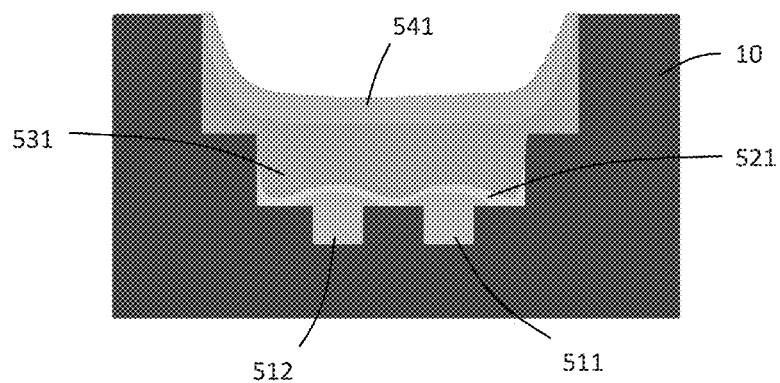
FIG. 6 is a schematic drawing of an embodiment of a TFT made in accordance with the teachings presented herein.

FIG. 5 is a schematic circuit diagram and drawing of a cross section of a thin film transistor (TFT) formed using conventional methods on a flat substrate 10. In contrast, FIG. 6 is a schematic drawing of a cross section of an embodiment of a TFT that can be formed using a substrate 10 process as described herein. In the depicted drawings, the TFT includes a source 512 and drain 511 and a semiconductor material 521 disposed over the source and drain. A dielectric material 531 is disposed over the semiconductor material and a gate 541 is disposed on the dielectric material. The source 512, drain 511, and gate 541 can be electrically coupled as depicted in the circuit diagram shown in FIG. 5.

Figure 7A:
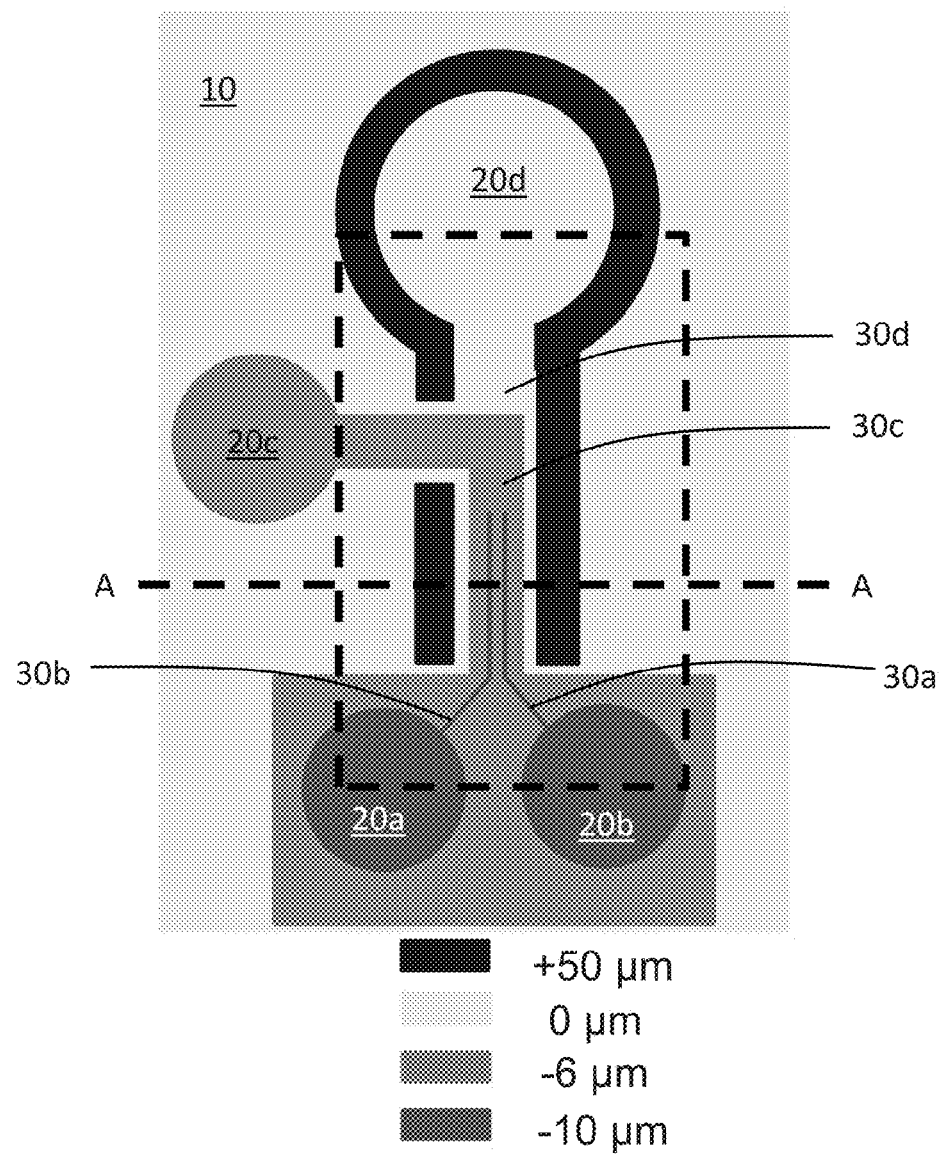
FIG. 7A is a schematic plan view of an embodiment of a substrate for manufacturing an embodiment of a TFT made in accordance with the teachings presented herein.
Figure 7B:
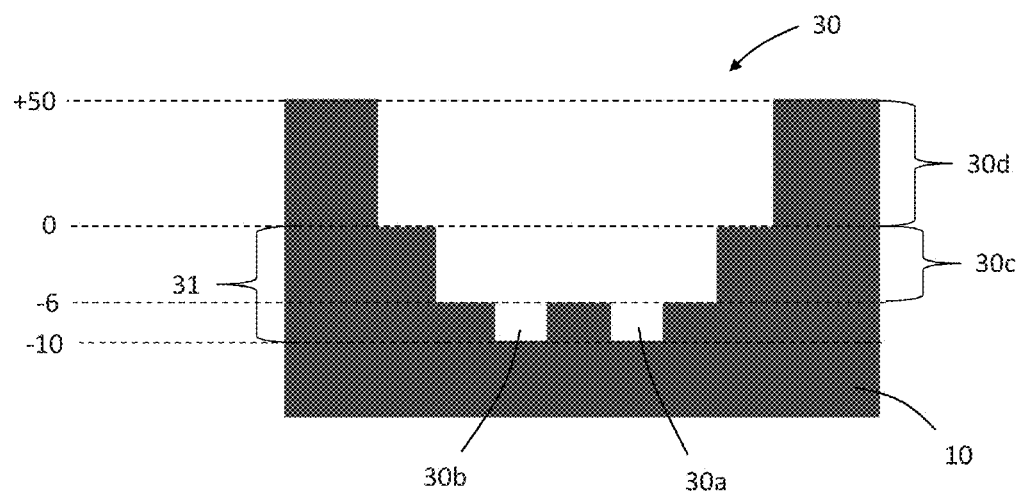
FIG. 7B is a schematic cross section taken through line A-A of the TFT of FIG. 7A.
Figure 7C:
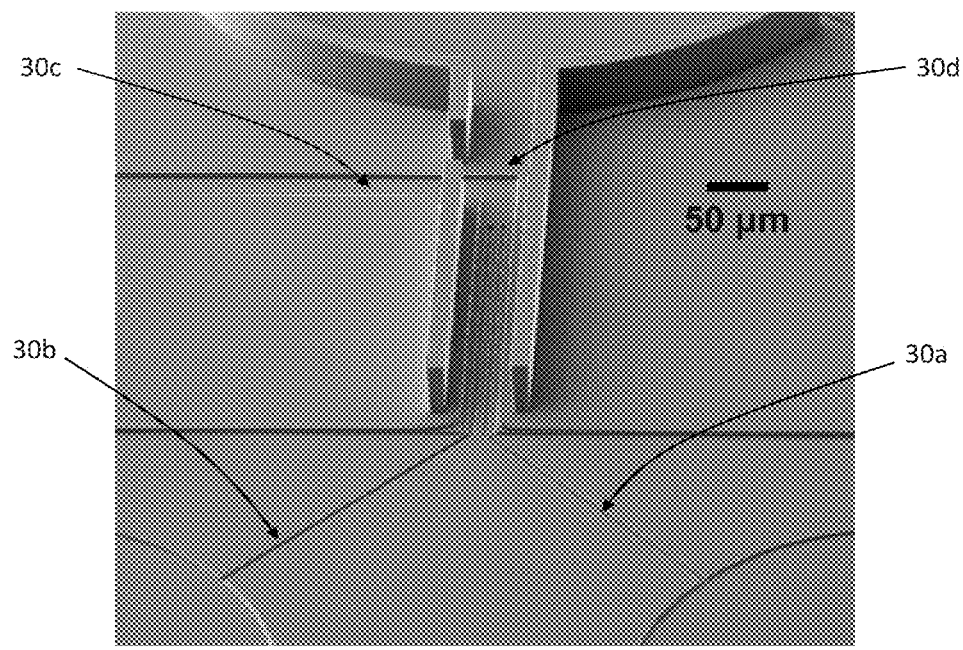
FIG. 7C is an image of an embodiment of a substrate that can be used to form a TFT, generally in accordance with the schematic drawing depicted in FIG. 7A.

FIGS. 7A-C are schematic drawings (7A-B) and an image (FIG. 7C) of different views of a substrate that can be used to form a TFT in accordance with the teachings presented herein. In the schematic view depicted in FIG. 7A, a legend is shown to illustrate the depth of the various features defined by the substrate 10. The substrate 10 has a major surface (0 micrometers) and defines first 20a and second 20b reservoirs and first 30a and second 30b microchannels in communication with first 20a and second 20b reservoirs, respectively, at a depth of 10 micrometers below the major surface of the substrate 10. The substrate 10 further defines a third reservoir 20c and third microchannel 30c in communication with the third reservoir 20c at a depth of 6 micrometers below the major surface of the substrate 10. The substrate 10 also defines a fourth reservoir 20d and fourth microchannel 30d in communication with the fourth reservoir 20d at a height extending 50 micrometers above the major surface of the substrate 10. It will be understood that the depths and heights depicted are merely for purposes of example to illustrate that various features may be at various depths or heights and that the features can be at any suitable depths or heights.

FIG. 7B is a cross section taken through line A-A in FIG. 7A. The depths and heights various portions of the features formed by the substrate 10 are shown on the left side of the drawing. Along line A-A of FIG. 7A, as shown in FIG. 7B, the various microchannels 30a, 30b, 30c, 30d can be considered to form a single microchannel 30 having a plurality of portions. For example, microchannel 30 can be considered to have a major portion 30d and a recessed minor portion 31, which has a major portion 30c and first 30a and second 30c recessed minor portions.

In FIG. 7C an image of a formed substrate for use in manufacturing a TFT is depicted. A 50 micrometer scale bar is depicted to provide an indication of the size of the various features defined by the substrate, such as microchannels 30a, 30b, 30c, 30d.

Figure 8A:
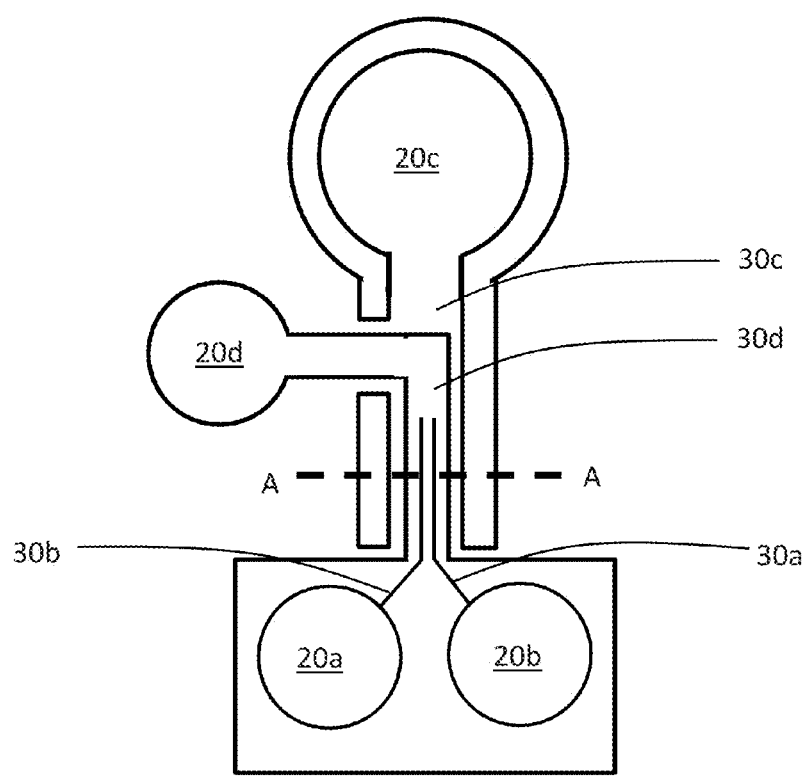
FIGS. 8A-J are schematic plan (A, B, D, G, I) and cross sectional (C, E, F, H, J) drawings of an embodiment of a substrate and materials to illustrate an embodiment of forming a TFT. The sectional views are taken through line A-A as depicted in FIG. 8A.
Figure 8B:
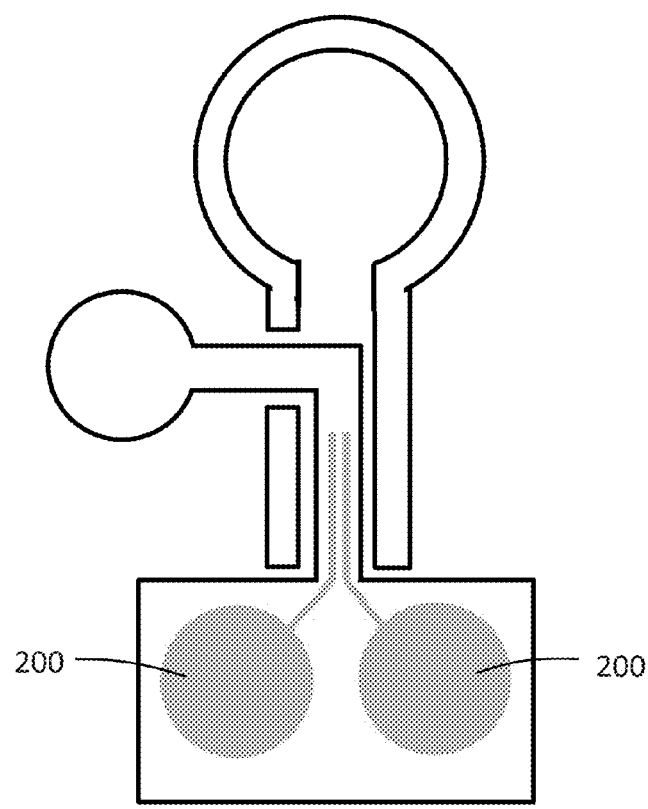
Figure 8C:
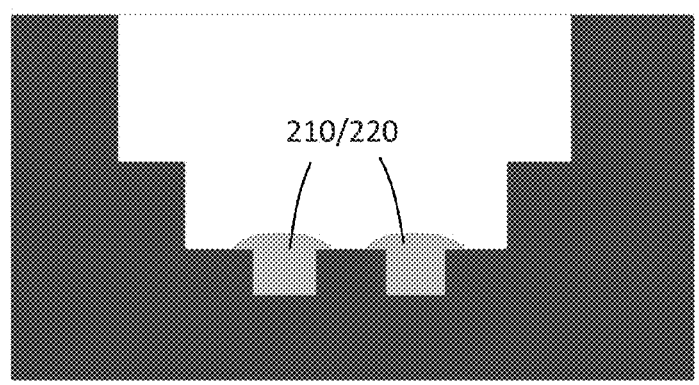

FIGS. 8A-J are schematic plan views and cross-sectional views (along line A-A as depicted in FIG. 8A) illustrating a process of forming a TFT using a structured substrate as depicted in FIGS. 7A-C. If a numbered element is not specifically described with regard to FIGS. 8A-J, reference is made to the discussion above with regard to FIGS. 7A-C, as like numbers refer to like elements. FIG. 8A shows a plan view of the formed substrate before any liquid compositions are deposited in any reservoirs 20a-d. As shown in FIG. 8B, a first liquid composition 200 containing a conductive material can be disposed in the first 20a and second 20b reservoirs to cause the liquid composition to move through the first 30a and second 30b microchannels. In some embodiments, the liquid composition contains a liquid carrier that is removed by evaporation and a second conductive material is deposited on the first conductive material deposited in the first and second microchannels (e.g., as described above with regard to FIGS. 2A-B). The schematic cross sectional view in FIG. 8C illustrates an example of a device resulting from deposition of a second conductive material 220 on the first conductive material 210 in the first and second microchannels.

Figure 8D:
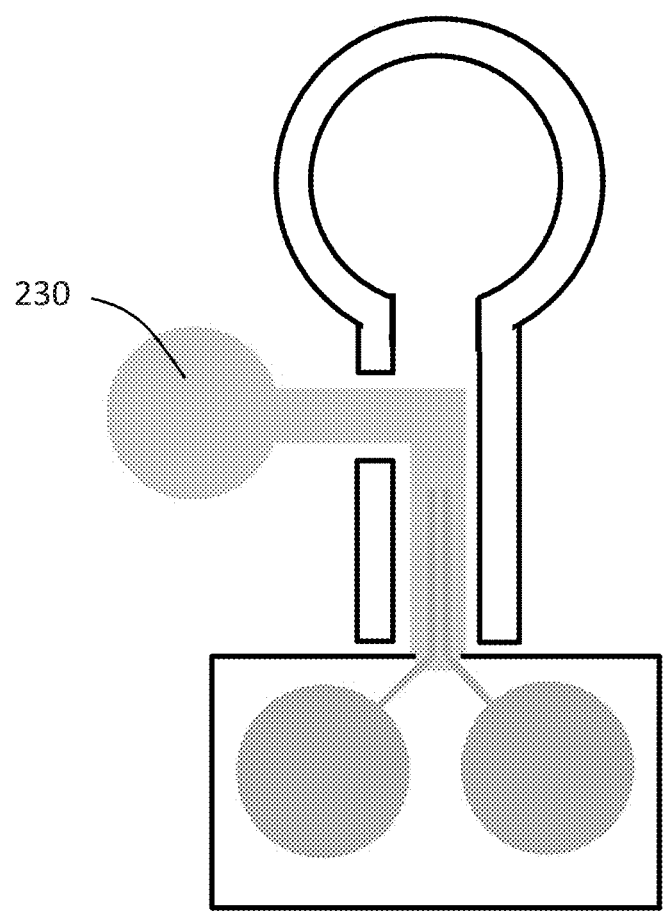
Figure 8E:
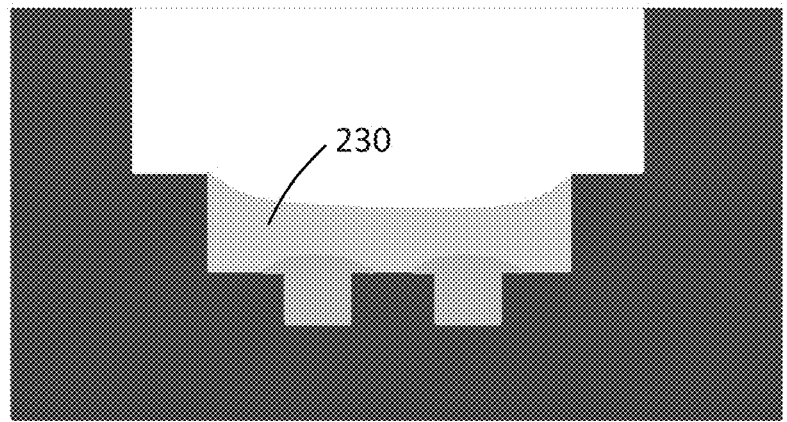
Figure 8F:
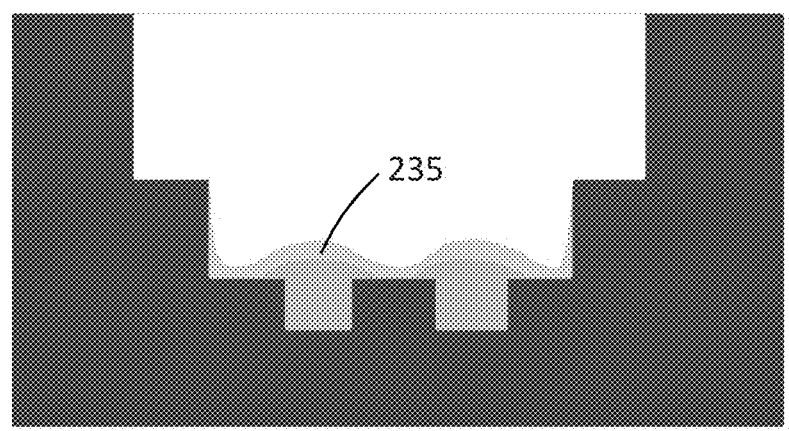

FIG. 8D illustrates a subsequent step of adding a liquid composition 230 comprising a semiconductor material to the third reservoir 20c (see FIG. 8A). FIGS. 8E and 8F illustrate an embodiments where the liquid composition 230 comprises a liquid carrier that is removed (e.g., evaporated), leaving the semiconductor material 235 deposited in the third microchannel 30c (see FIG. 8A) on the conductive material deposited in the first and second microchannels. FIG. 8E depicts the liquid composition 230 before the liquid carrier has been removed. FIG. 8F depicts the deposited semiconductor material 235 after the liquid carrier has been removed.

Figure 8G:
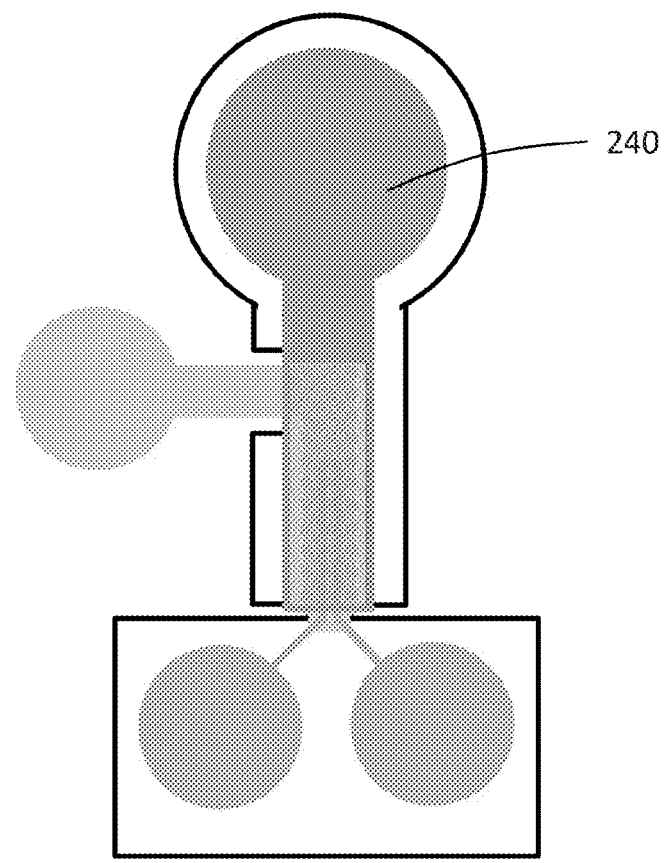
Figure 8H:
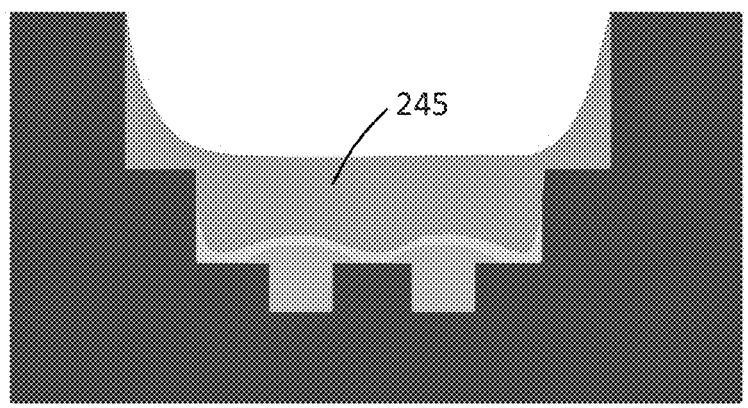

FIG. 8G illustrates a subsequent step of adding a liquid composition 240 comprising a dielectric material to the fourth reservoir 20d (see FIG. 8A). FIG. 8H illustrates an embodiments where the liquid composition 240 comprises a liquid carrier that is removed (e.g., evaporated), leaving the dielectric material 245 deposited in the fourth microchannel 30d (see FIG. 8A) on the semiconductive material deposited in the third microchannel. Because the third microchannel in which the semiconductor is deposited in in communication and recessed under the fourth microchannel at the location of the section depicted in FIG. 8H (which is along line A-A in FIG. 8A), the dielectric material 245 is deposited in a portion of the third microchannel in this portion of the resulting device.

Figure 8I:
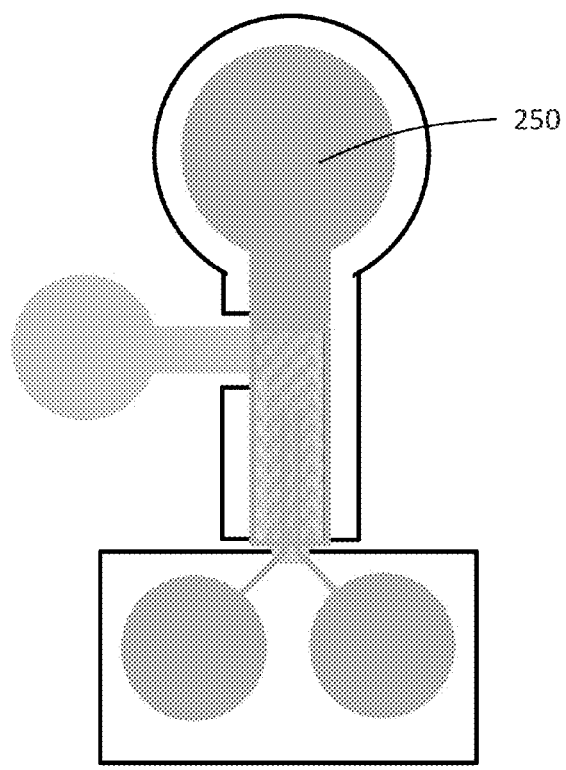
Figure 8J:
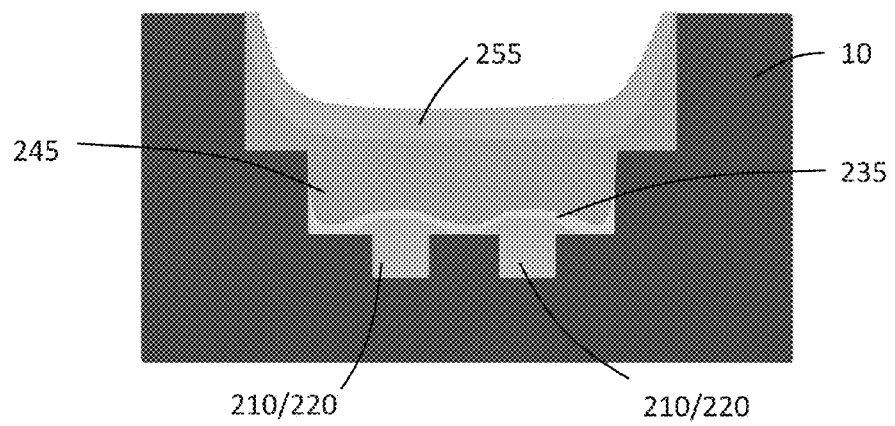

FIG. 8I illustrates a subsequent step of adding a liquid composition 250 comprising a conductive material to the fourth reservoir 20d (see FIG. 8A) on top of the deposited dielectric material. FIG. 8J illustrates an embodiments where the liquid composition 250 comprises a liquid carrier that is removed (e.g., evaporated), leaving the conductive material 255 deposited in the fourth microchannel 30d (see FIG. 8A) on the dielectric material deposited in the fourth microchannel. The resulting TFT circuit formed in and on the substrate 10 includes one or more conductive materials 210/220 disposed in the first and second microchannels (which can be a source 511 and a drain 512 as described above with regard to FIG. 6); semiconductor material 235 deposited in the third microchannel and on the one or more conductive materials 210/220 in the first and second microchannels; a dielectric material 245 deposited in the fourth microchannel and on the semiconductor materials 235 in the third microchannel; and a conductive material 255 (which can be a gate 541 as described above with regard to FIG. 6) deposited in the fourth microchannel and on the dielectric material 245. The conductive material deposited in the first 20a, second 20b, and fourth 20d reservoirs (see FIG. 8A) can serve as electrical contacts. For example, the fourth reservoir in which conductive material 245 (serving as the gate) can be a $V_{IN}$ contact, the first reservoir in which conductive material 210/220 is deposited (serving as the drain) can be a ground contact, and the second reservoir in which conductive material 210/220 is deposited (serving as the source) can be a $V_{OUT}$ contact.

TFT devices having an epoxy substrate were tested. The channels for the source and the drain electrodes were 5 micrometers wide and 3 micrometers deep. The semiconductor channel was 40 micrometers in width and 6 micrometers in depth. The dielectric and gate channels are 60 micrometers in width and 50 micrometers in depth. Reservoirs for the source, drain and semiconductor were 400 micrometers in diameter, respectively. The reservoir for the gate and the dielectric is 500 micrometers in diameter. Transistor current-voltage characteristics were measured using two Keithley 236 source measurement units and a Keithley 6517 electrometer. Results are presented in FIGS. 9-13.

Figure 9:
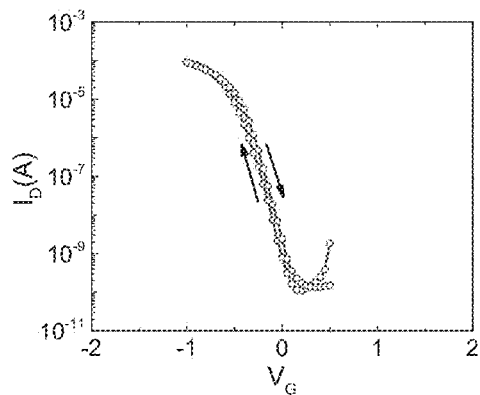
FIGS. 9-10 are plots of current vs. voltage of an embodiment of a 1 volt TFT made in accordance with a process depicted in FIGS. 8A-J.
Figure 10:
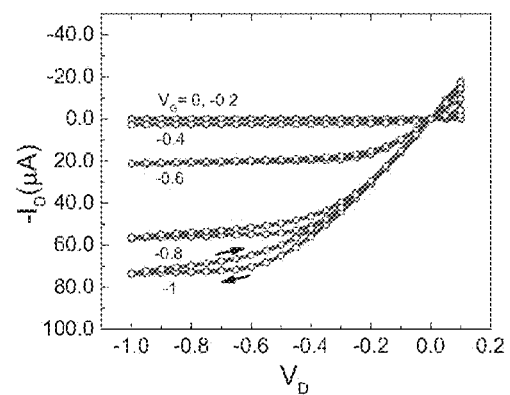

FIGS. 9-10 are current voltage plots of 1 Volt TFTs produced in accordance with the teachings presented herein (e.g., as described with regard to FIGS. 8A-I). The on/off ratio of the TFTs was $10^6$; the mobility was 0.7 $cm^2V^{-1}s^{-1}$; and the threshold voltage was −0.3 V.

Figure 11:
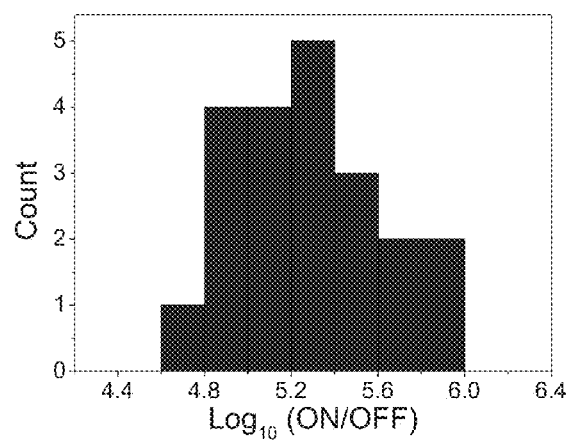
FIGS. 11-13 are plots of Log (ON/OFF) (FIG. 11), mobility (FIG. 12) and threshold voltage (FIG. 13) of an embodiment of a TFT made in accordance with a process depicted in FIGS. 8A-J.
Figure 12:
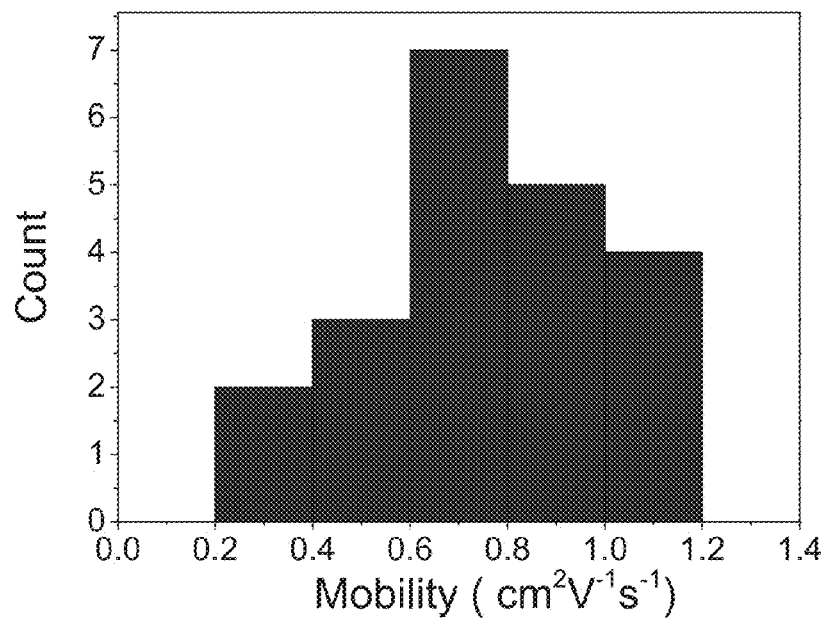
Figure 13:
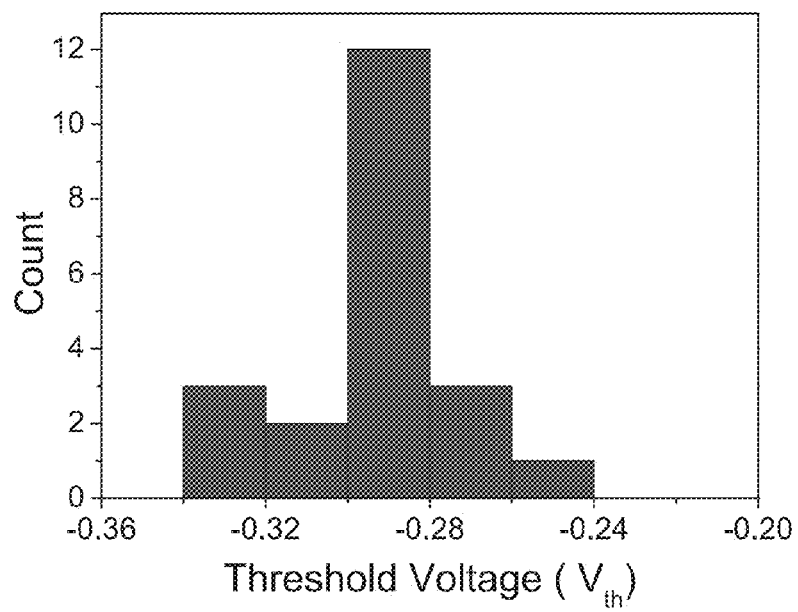

FIGS. 11-13 are plots of log (ON/OFF), mobility and threshold voltage, respectively. The device yield was 21/21. The average Log (ON/OFF) was 5.2+/−0.3. The average mobility was 0.7+/−0.3 $cm^2V^{-1}s^{-1}$. The average threshold voltage was −0.29+/−0.02.

Figure 14A:
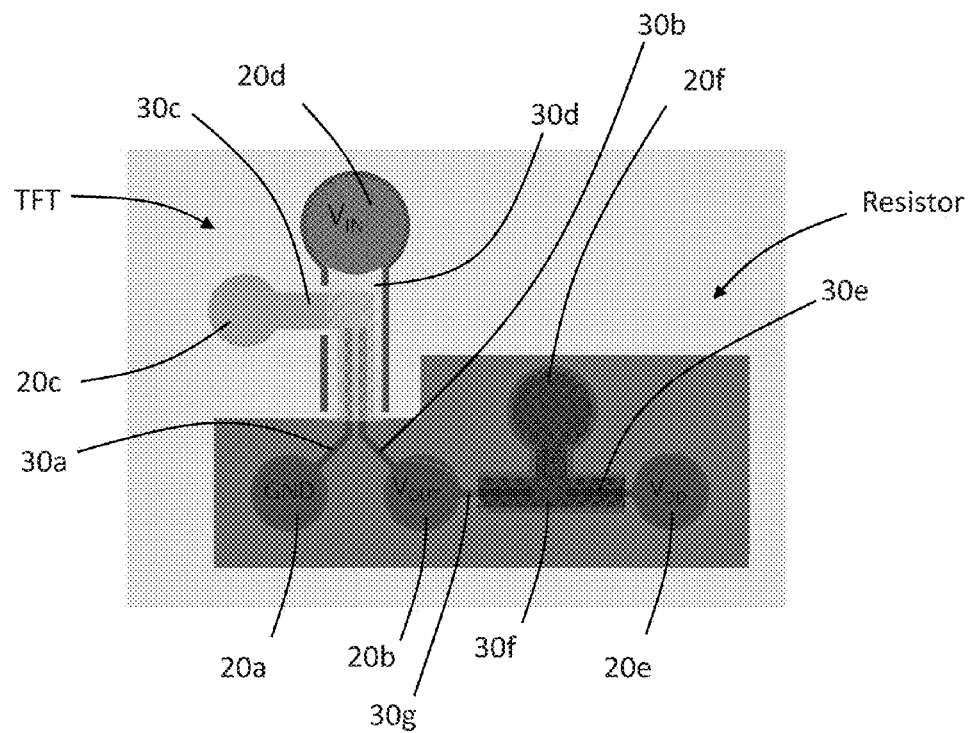
FIG. 14A is a schematic plan view of an embodiment of a resistor-loaded inverter that can be made in accordance with the teachings presented herein.
Figure 14B:
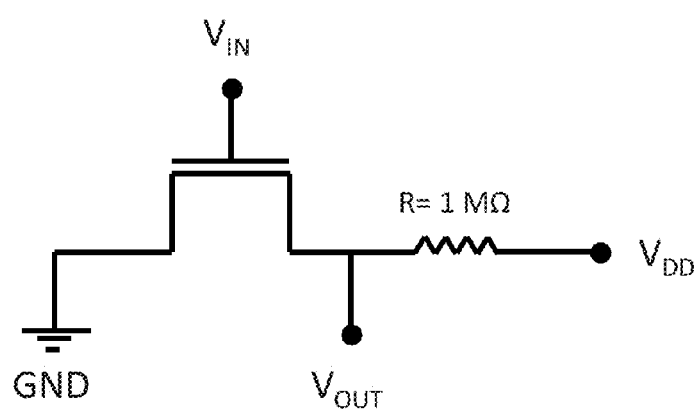
FIG. 14B is a schematic circuit diagram of the resistor-loaded inverter depicted in FIG. 14A.

FIG. 14A is schematic drawing of resistor-loaded inverter that can be made in accordance with the teachings presented herein. FIG. 14B is a circuit diagram of the device in FIG. 14A. The resistor-loaded inverter in FIG. 14A can be a combination of the resistor depicted in FIGS. 3A-C and the TFT depicted in FIGS. 8A-J. Numbered elements in FIG. 14A are used in the same manner as in FIG. 8A. The TFT portion can be made as described above with regard to FIGS. 8A-I. However, reservoir 20b is in communication with microchannel 30b (as in FIGS. 8A-J), as well as microchannel 30g, which serves as a portion of the resistor circuitry. Accordingly, when a liquid composition comprising conductive material is deposited in reservoir 20b, the liquid composition moves through both microchannel 30b and microchannel 30f via capillarity. As discussed above with regard to FIGS. 3A-C, a liquid composition comprising a conductive material can be disposed in reservoir 20e to cause the composition to move through microchannel 30e. A liquid carrier can be removed or the conductive material otherwise solidified in the microchannel and a liquid composition comprising a resistive material, such as carbon black, can be added to reservoir 20f to cause the liquid composition to move through micro channel 30f.

Figure 15:
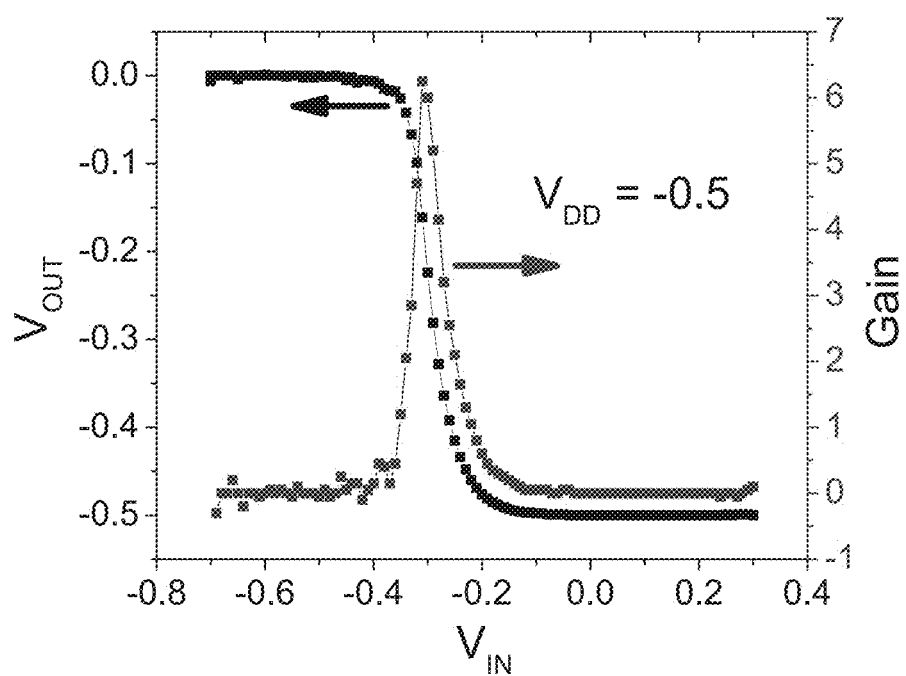
FIG. 15 is a plot of gain at various voltages ($V_{IN}$ and $V_{OUT}$) of an embodiment of a resistor-loaded inverter, generally as depicted in FIG. 14A.

FIG. 15 is a plot of gain at varying voltages ($V_{OUT}$ and $V_{IN}$) of a resistor-loaded invertor produced in accordance with the teachings presented herein (e.g., as described with regard to FIG. 14A). Tested resistor-loaded inverter had an epoxy substrate. The channels for the source and the drain electrodes were 5 micrometers wide and 3 micrometers deep. The semiconductor channel was 40 micrometers in width and 6 micrometers in depth. The dielectric and gate channels were 60 micrometers in width and 50 micrometers in depth. Reservoirs for the source, drain and semiconductor were 400 micrometers in diameter, respectively. The reservoirs for the gate, the dielectric and carbon black were all 500 micrometers in diameter. For inverter measurements, a modulated input gate bias was supplied by an Agilent 33120A arbitrary waveform generator and a Tektronix TDS1002B digital oscilloscope was connected to the output electrode to detect the output voltage signal.

Figure 16A:
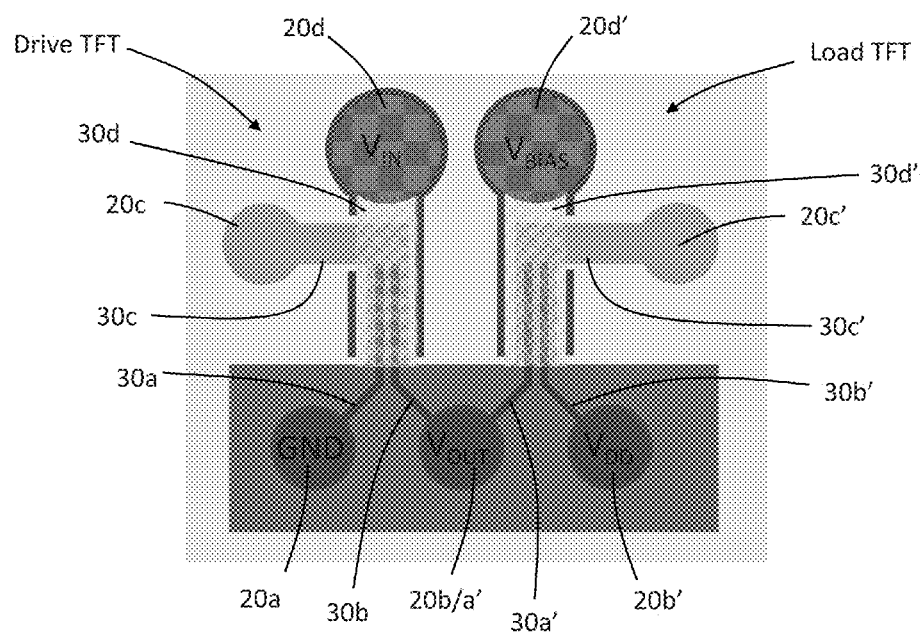
FIG. 16A is a schematic plan view of an embodiment of a transistor-loaded inverter that can be made in accordance with the teachings presented herein.
Figure 16B:
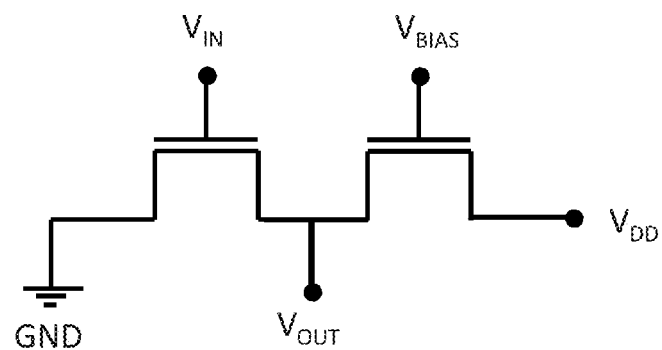
FIG. 16B is a schematic circuit diagram of the transistor-loaded inverter depicted in FIG. 16A.

FIG. 16A is schematic drawing of transistor-loaded inverter that can be made in accordance with the teachings presented herein. FIG. 16B is a circuit diagram of the device in FIG. 16A. The transistor-loaded inverter in FIG. 16A can be a combination of the TFTs depicted in FIGS. 8A-J. Numbered elements in FIG. 16A are used in the same manner as in FIG. 8A. Numbered elements marked with a ' are used in the same manner as number elements marked without a ' in FIG. 8A. However, reservoir 20b/a' is in communication with microchannel 30b as well as microchannel 30a'. Accordingly, when a liquid composition comprising conductive material is deposited in reservoir 20b/a', the liquid composition moves through both microchannel 30b and microchannel 30a' via capillarity.

Figure 16C:
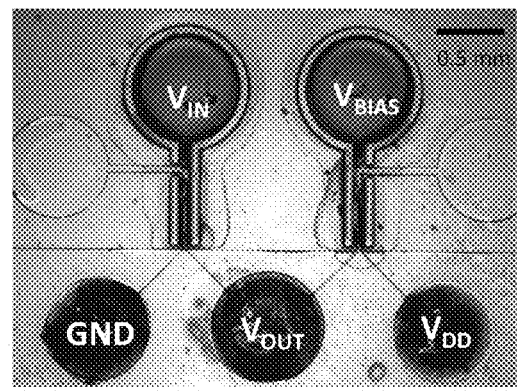
FIG. 16C is an image of an embodiment of a transistor-loaded inverter, generally as depicted in FIG. 16A.

FIG. 16C is an image of a transistor-loaded inverter made using a scheme as depicted in FIG. 16A. Text has been overlaid on the image to identify the various contacts.

Figure 17:
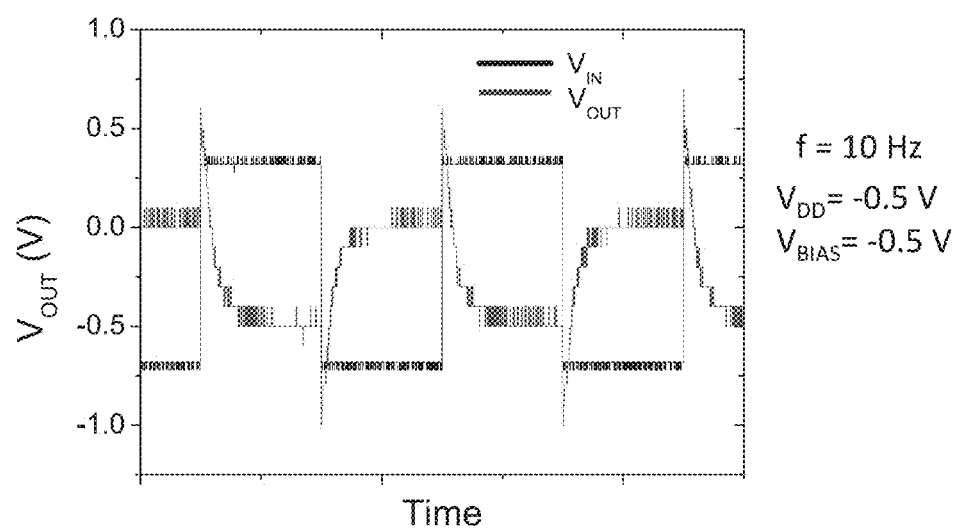
FIG. 17 is a plot of voltage over time of an embodiment of a transistor-loaded inverter, generally as depicted in FIG. 16A.

FIG. 17 is a plot of voltage over time of a resistor-loaded invertor produced in accordance with the teachings presented herein (e.g., as described with regard to FIG. 16A). Tested transistor-loaded inverter had an epoxy substrate. For both the drive and load TFT, the channels for the source and the drain electrodes were 5 micrometers wide and 3 micrometers deep. The semiconductor channel was 40 micrometers in width and 6 micrometers in depth. The dielectric and gate channels are 60 micrometers in width and 50 micrometers in depth. Reservoirs for the source, drain and semiconductor were 400 micrometers in diameter, respectively. The reservoir for the gate and the dielectric is 500 micrometers in diameter. For inverter measurements, a modulated input gate bias was supplied by an Agilent 33120A arbitrary waveform generator and a Tektronix TDS1002B digital oscilloscope was connected to the output electrode to detect the output voltage signal.

Figure 18:
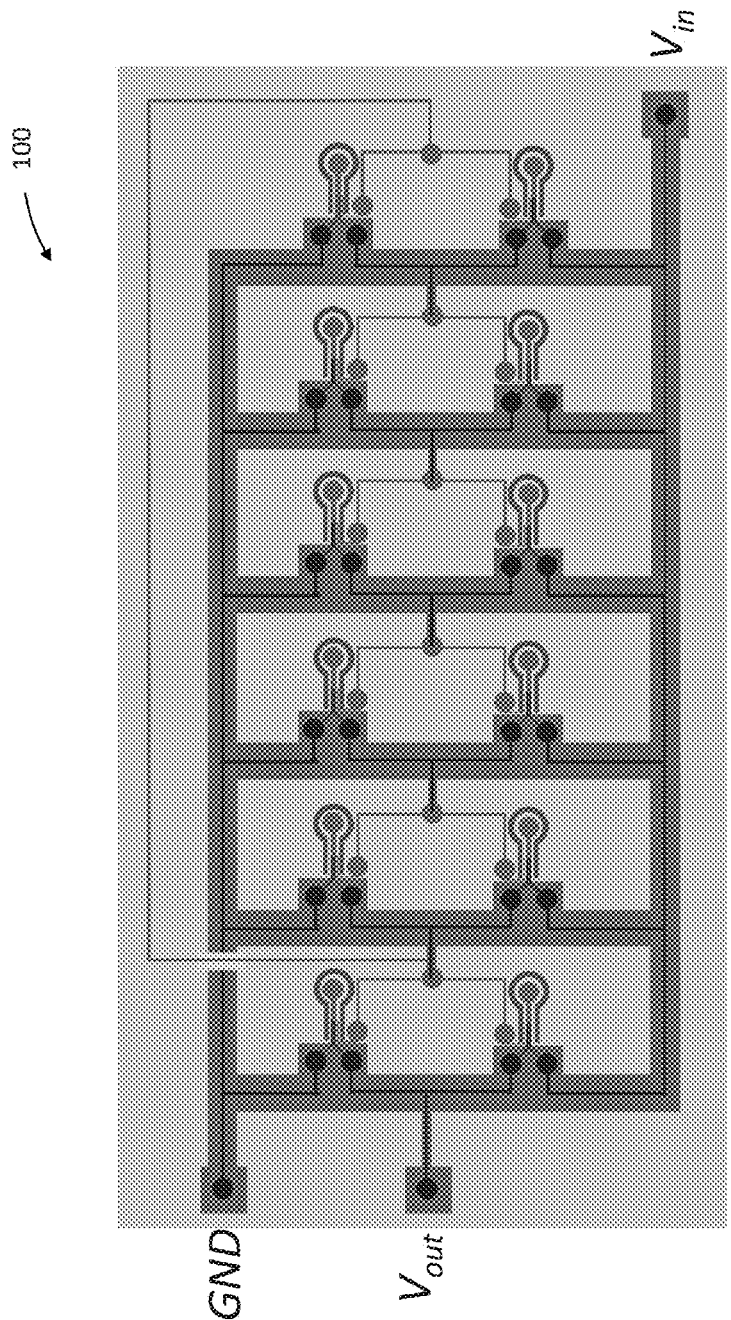
FIG. 18 is a schematic plan view of an embodiment of a ring oscillator that can be made in accordance with the teachings presented herein.

FIG. 18 is a schematic plan view illustrating how an embodiment of a ring oscillator can be made in accordance with the teachings presented herein. The ring oscillator includes a number of TFTs that can be made, for example, as described above with regard to FIGS. 8A-J, as well as other traces or components as shown.

Any suitable electrical device or component can be made in accordance with the teachings presented herein. It is noted that the scale of the components that can be made according to the processes described herein can allow for high densities of circuit components. For example, TFTs made in accordance with various embodiments presented herein can have a footprint of 300×500 square micrometers, which can allow a device integration density of about 500 TFTs per square centimeter.

Figure 19:
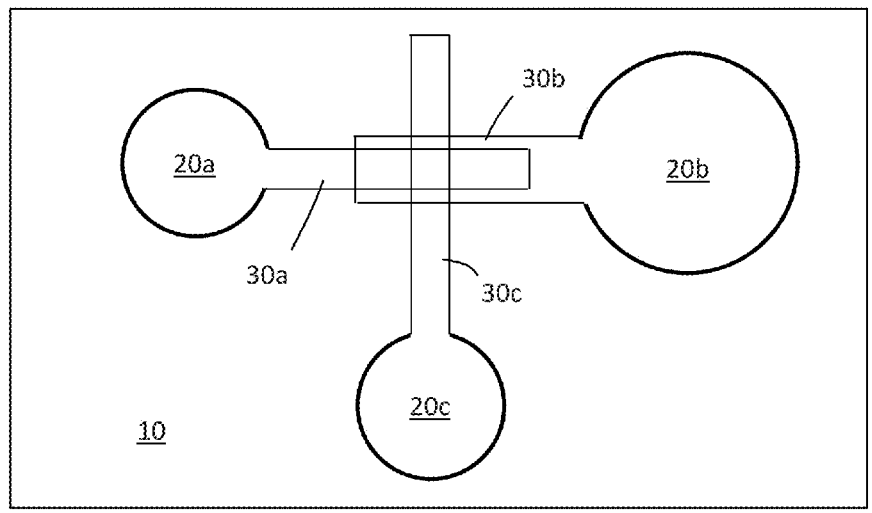
FIGS. 19 and 20A are schematic plan views of embodiments of substrates that can be used to form devices having overlapping conductive traces.
Figure 20A:
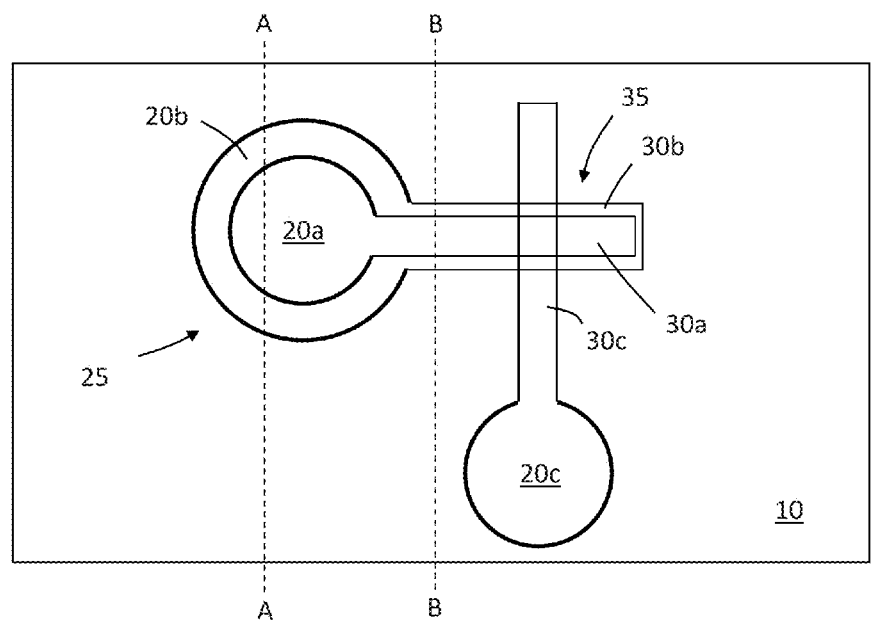

FIGS. 19 and 20A depict alternative embodiments of structured substrates for use in electronic devices where conductive traces cross. In both figures, a liquid composition comprising a conductive material is first placed in reservoir 20a, which causes the liquid composition to move via capillarity through microchannel 30a. A liquid carrier can be evaporated or otherwise solidified to leave the conductive material in reservoir 20a and microchannel 30a. Reservoir 20a and microchannel 30a are at lower depth in the substrate 10 than reservoir 20b and microchannel 30b. A liquid composition comprising an insulating material is placed in reservoir 20b, which causes the liquid composition to move via capillarity through microchannel 30b. A liquid carrier can be evaporated or otherwise solidified to leave the insulating material in reservoir 20b and microchannel 30b. The deposited insulating material, at least in the area where microchannel 30c crosses over microchannel 30a, is deposited on top of the conductive material in microchannel 30a. Reservoir 20b and microchannel 30b are at lower depth in the substrate 10 than reservoir 20c and microchannel 30c. A liquid composition comprising a conductive material is placed in reservoir 20c, which causes the liquid composition to move via capillarity through microchannel 30c. A liquid carrier can be evaporated or otherwise solidified to leave the conductive material in reservoir 20c and microchannel 30c. The insulating material deposited in microchannel 30b, at least in the area where microchannel 30c crosses over microchannel 30a, is disposed between the conductive material in microchannel 30a and the conductive material in micro channel 30c.

Figure 20B:
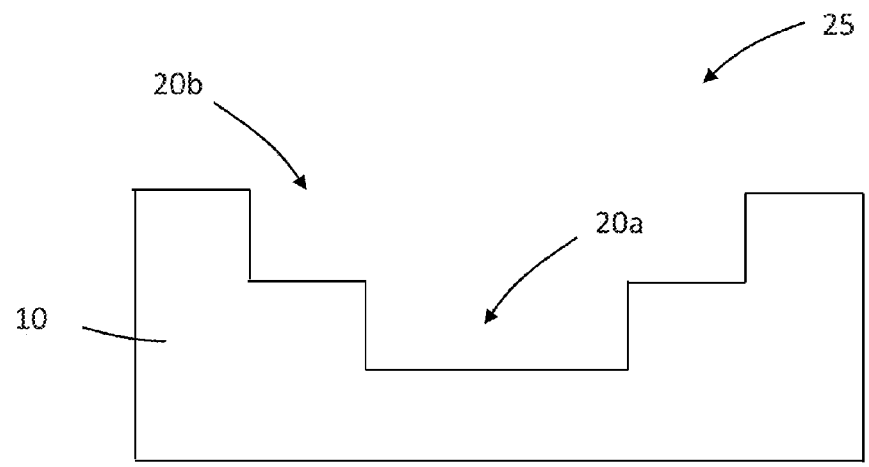
FIG. 20B is a schematic cross sectional view taken through line A-A of FIG. 20A.
Figure 20C:
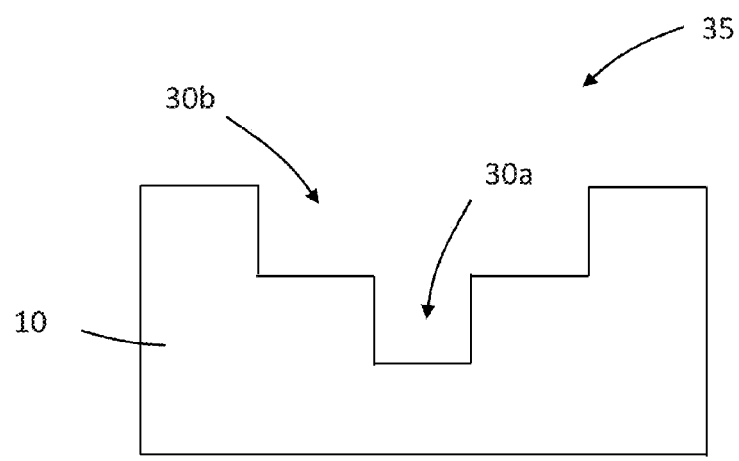
FIG. 20C is a schematic cross sectional view taken through line B-B of FIG. 20A.

In FIG. 20A, reservoir 20a is recessed in reservoir 20b, and microchannel 20a is recessed in microchannel 20b. A schematic cross section taken through line A-A of FIG. 20A is depicted in FIG. 20B, showing the nested aspects of reservoirs 20a and 20b. A schematic cross section taken through line B-B of FIG. 20A is depicted in FIG. 20C, showing the nested aspects of microchannels 30a and 30b. As shown in FIG. 20B, reservoirs 20a and 20b each can be considered nested portions of a larger reservoir 25, in which reservoir 25 defines a total reservoir volume that is the sum of the volume of reservoir 20a and the volume of reservoir 20b, with reservoir 20a being recessed relative to reservoir 20b. As shown in FIG. 20C, microchannels 30a and 30b each can be considered nested portions of a larger microchannel 35, in which microchannel 35 defines a total cross sectional area that is the sum of the cross sectional area of microchannel 30a and the cross sectional area of microchannel 30b. Microchannel 30a is recessed relative to microchannel 30b and has a smaller width than microchannel 30b. Discussion of additional or alternative processes that can be employed are discussed below with regard to, for example, FIG. 31.

Figure 21:
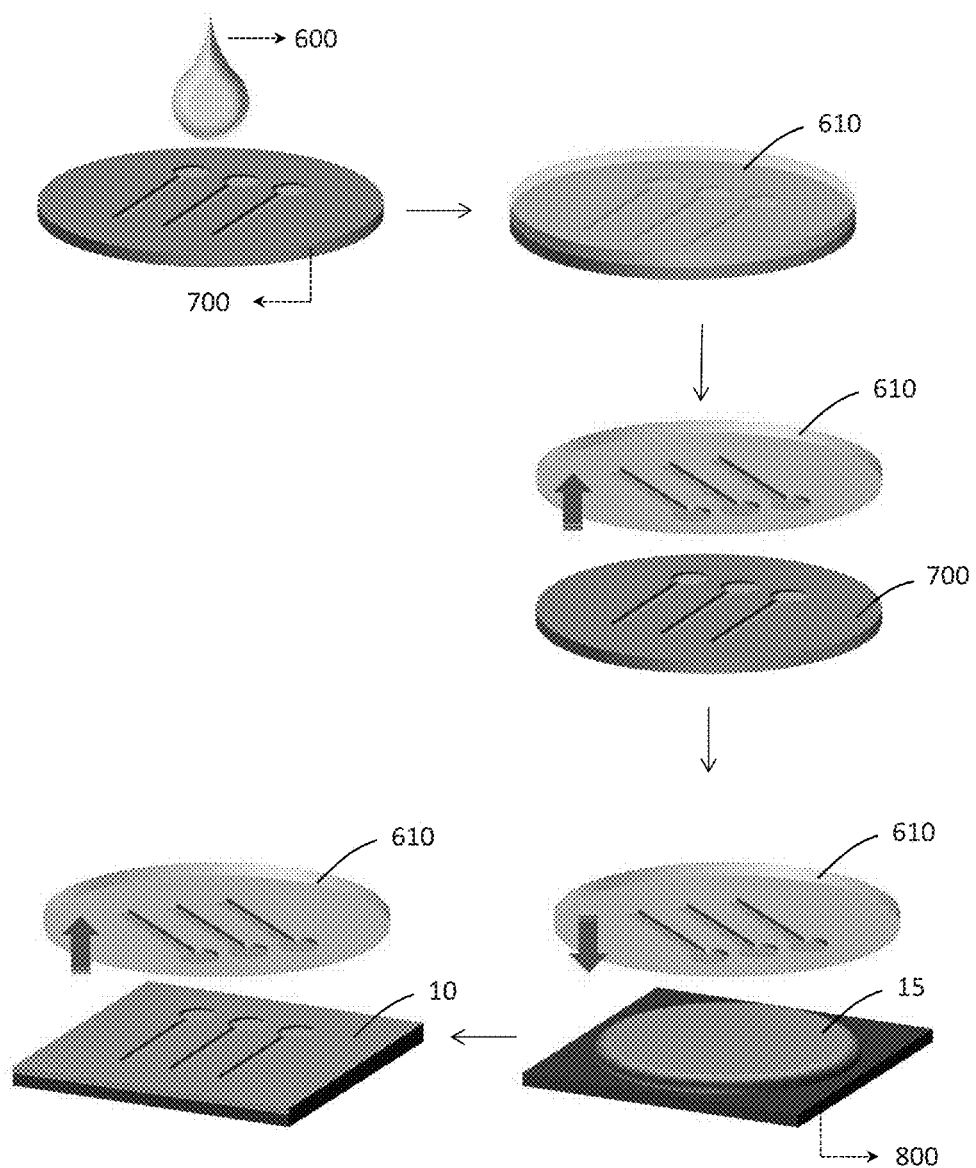
FIG. 21 is a series of schematic perspective view drawings illustrating an embodiment of a process that can be used to produce a structure substrate.

A structured substrate as described herein (e.g., with regard to FIGS. 1-20 above) can be made in any suitable manner capable of producing micrometer scale features. In some embodiments, imprint lithography is used to generate a structured substrate for forming a device as described herein. Referring now to FIG. 21 an overview of one embodiment of an imprint lithography process that can be used to form a structure substrate is shown. In the depicted embodiment, a silicon wafer master 700 is created having reservoirs and microchannels of appropriate size, shape and depth. A polymer 610, such as polydimethylsiloxane (PDMS), disposed on the silicon master 700 and cured to produce a polymer stamp 610. The polymer stamp 610 can be peeled from the silicon master 700. Polymerizable material 15 can be contacted with the stamp 610 and cured while in contact with the stamp 610 to produce the structured substrate 10. The stamp 610 can be peeled from the substrate 10, allowing the substrate to be used to manufacture a device as described herein. Any suitable polymerizable material 15 can be used. One example of a suitable polymerizable material is epoxy resins. Examples of other polymerizable materials include those that can be used to form polymers as described above from which the substrate is formed. As depicted in FIG. 21, the polymerizable material 15 can be disposed on a polymeric film 800. In some embodiments, the film 800 and the substrate 10 are flexible. In some embodiments, the film 800 or substrate 10 are not flexible.

Any suitable equipment may be used in connection with the processes, or one or more portions of the processes, described herein. In embodiments, a roll-to-roll imprinter, such as a NanoEmboss 100 model roll-to-roll nanoimprinter, may be used.

Figure 22:
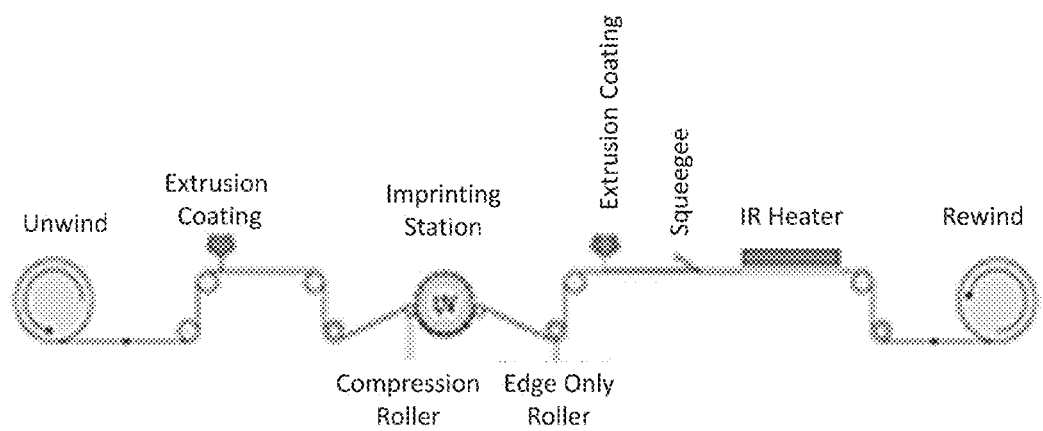
FIG. 22 is a schematic drawing of web path on an embodiment of an embossing system for use in embodiments described herein.

A schematic of an example of a nanoimprinter that may be used is depicted in FIG. 22. The instrument depicted in FIG. 22 coats a moving web with an imprintable, UV curable liquid film and then embosses the film with a patterned roll under UV irradiation to crosslink it. Subsequent process steps can include metrology or another coating and drying operation, as shown in the scheme. Corona pretreatment (not shown) of the moving web is also an option to enhance adhesion of the imprint resist on the web substrate material. Such instruments are available with features such as automatic web tracking, web speeds of 4-800 inches/min and imprint feature sizes below 100 nm.

One strategy for producing high-density circuits on flexible substrates is based on liquid phase coating, printing and patterning operations carried out in an engineered roll-to-roll (R2R) sequence. To be successful, the processing methods, materials characteristics and circuit layout are being developed synergistically. Importantly, liquid phase processing near room temperature offers several advantages including compatibility with plastic substrates and, as will be shown below, the possibility of additive, self-aligned materials deposition.

Figure 23:
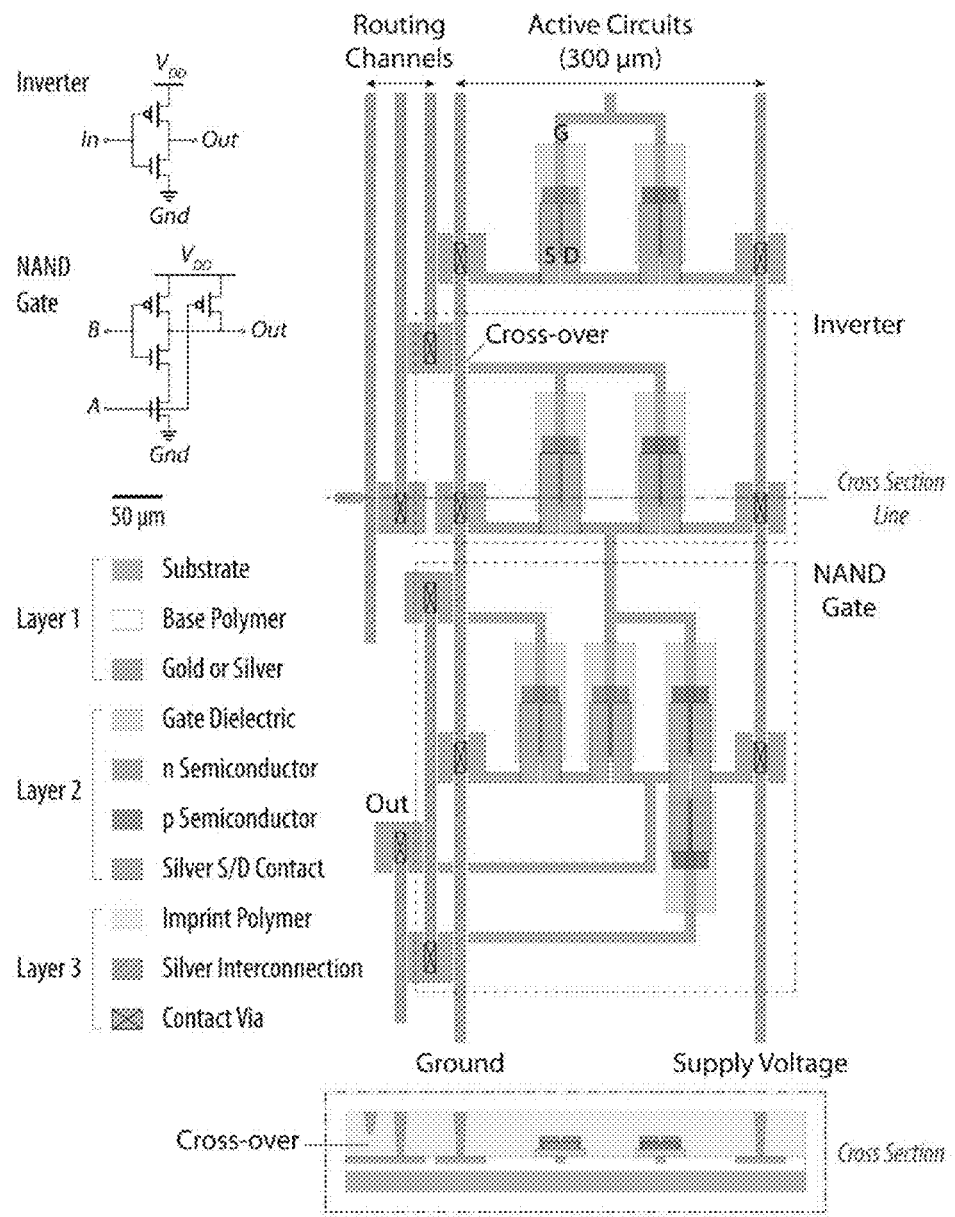
FIG. 23 is a schematic planar layout and cross-section of key circuit elements necessary for flexible electronic circuits with integration densities of 1000 transistors/cm$^2$. The down-web direction is along the routing lines. Note that interconnect cross-overs are achieved using a multi-layered design.

FIG. 23 shows examples of multi-layered device layouts that can be produced in a R2R process. There are several key points to make here: 1) The representative NAND and inverter elements shown in FIG. 23 can constitute basic building blocks of digital circuits. A R2R process capable of producing these elements repeatedly can be used to make any digital circuit, and by extension, many types of analog circuits; 2) The key circuit elements, e.g., transistors and interconnects, are arranged to facilitate the R2R processing steps. Active circuits are confined to 300 micrometer wide (or other suitable width) corridors running down the length of the web and bordered by routing lines and common supply and ground lines also running "down-web". There may be multiple tracks of device corridors and routing lines across the width of the web; 3) the plan view of the layout of FIG. 23 is drawn to scale and represents an integration density of ~1000 transistors/cm$^2$, which will enable an enormous variety of flexible electronic systems; 4) Careful inspection of FIG. 23 (see cross-section at bottom; the cross-section is not to scale vertically) reveals that two levels of interconnects are engineered into the layout. A new approach to multilevel interconnects makes possible, for example, 1,000 device/cm$^2$ integration densities in a high-throughput process.

A central challenge—perhaps the central challenge—for R2R printed electronics is to align multiple layers of different materials with micron level tolerances (or better). The precision alignment mechanisms typical of wafer-based semiconductor fabrication facilities are generally not available for web-handling equipment and it is a daunting proposition to think about how microscale devices can be fabricated on moving webs, let alone nanoscale devices.

Accordingly, the inventors have developed self-aligning strategies for TFT and other flexible electronics or other device (such as optical device) fabrication that may be applied more generally to other flexible electronics or flexible electronic components or other devices. "Self-alignment" means that sequential deposition of materials happens such that materials registration, e.g., the registration of a dielectric layer over a semiconductor layer in a transistor, occurs automatically, without a time-consuming registration process. It is clear that for high speed manufacturing of electronic devices, self-alignment is a major advantage, particularly if the self-aligning strategy is scalable, in that it will work over a wide range of physical dimensions needed for electronic circuits, e.g., from hundreds of microns down to 100 nm and below.

Hewlett-Packard, Inc. took a major step in this direction with their development of the Self-Aligned Imprint Lithography (SAIL) process in the mid-2000's. In the SAIL process, all key materials are coated onto a web substrate and then a top coat resist is applied. The resist is imprinted with a topographical pattern (thickness variations) such that subsequent etching steps selectively remove specific underlayers (metal, semiconductor, dielectric) across the substrate. SAIL has been employed for the manufacture of TFT arrays and it has been implemented R2R. A major drawback of SAIL, however, is that it is a subtractive process. Materials are etched away. Even with a recovery process this is an expensive proposition.

Thus, in addition to self-alignment and scalability, it is advantageous to design additive manufacturing approaches. In additive manufacturing, materials are only deposited where they are needed and they are grown in the final required geometry (e.g., 3D printing is an additive manufacturing technology). This eliminates material waste associated with subtractive processes such as etching or machining Additive manufacturing is environmentally friendly and also potentially more cost-effective in the context of flexible electronics where some materials, e.g., silver, are moderately expensive.

Finally, it is desirable that a new R2R process be parallel and high throughput, by which it is meant, respectively, that many devices (e.g., transistors, capacitors and resistors) can be manufactured quasi-simultaneously across a substrate (as opposed to one at a time—serially), and that the whole process can be accomplished on a continuously moving web.

Figure 24:
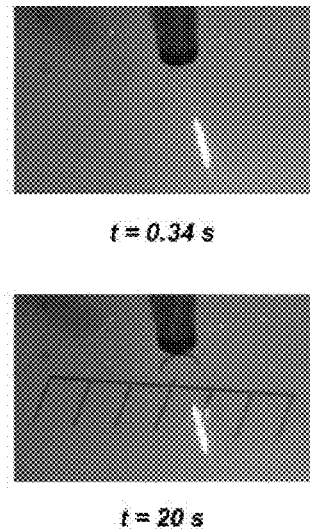
FIG. 24 shows photos of a drop-on-demand ink dispenser located above an imprinted reservoir and imprinted 50 micrometer wide microchannels. Sequential photos show liquid semiconductor ink filling channels by capillarity (0.21 s), complete filling (0.34 s), and drying (11-20 s). Loss of contrast at 0.21 s and 0.34 s is due to refractive index matching of liquid ink with substrate.

To the inventors' knowledge, there is currently no established R2R manufacturing process that is simultaneously self-aligning, scalable, additive, parallel, and high throughput. We propose that all of these process characteristics can be achieved by employing capillary flow of electronically functional liquid inks in microchannels carefully engineered onto the surface of a moving web substrate. We term this new process Self-Aligned Capillarity-Assisted Lithography for Electronics (SCALE). In SCALE, microchannels and reservoirs are molded into a coated thermoset material by imprint lithography. The dimensions of the channels may range from; e.g., 100 nm to tens of microns; reservoirs may be; e.g., hundreds of microns. In various embodiments, electronic inks are delivered to the reservoirs by "drop-on-demand" ink jet dispensers and the liquids, drawn into and along the channels by capillarity, fill relief patterns in a thermoset polymer. A photograph of this process occurring in microchannels obtained in preliminary work is shown in FIG. 24.

The process is self-aligned because multiple inks can be delivered sequentially to prefabricated device cavities at the ends of the microchannels (the other ends of which are connected to one or more reservoirs), to form, upon drying, stacked layers of electronic materials. The process is also highly parallel because a single reservoir can deliver ink to produce many devices in parallel, and multiple dispensers can be employed to fill many reservoirs simultaneously. SCALE is an additive method because material is only delivered to regions where it needs to be. A SCALE process may be used to manufacture any type of discrete electronic component, such as resistors, capacitors, diodes and TFTs. In addition, entire systems can be manufactured when SCALE is combined with an effective three-dimensional interconnect strategy.

Figure 25:
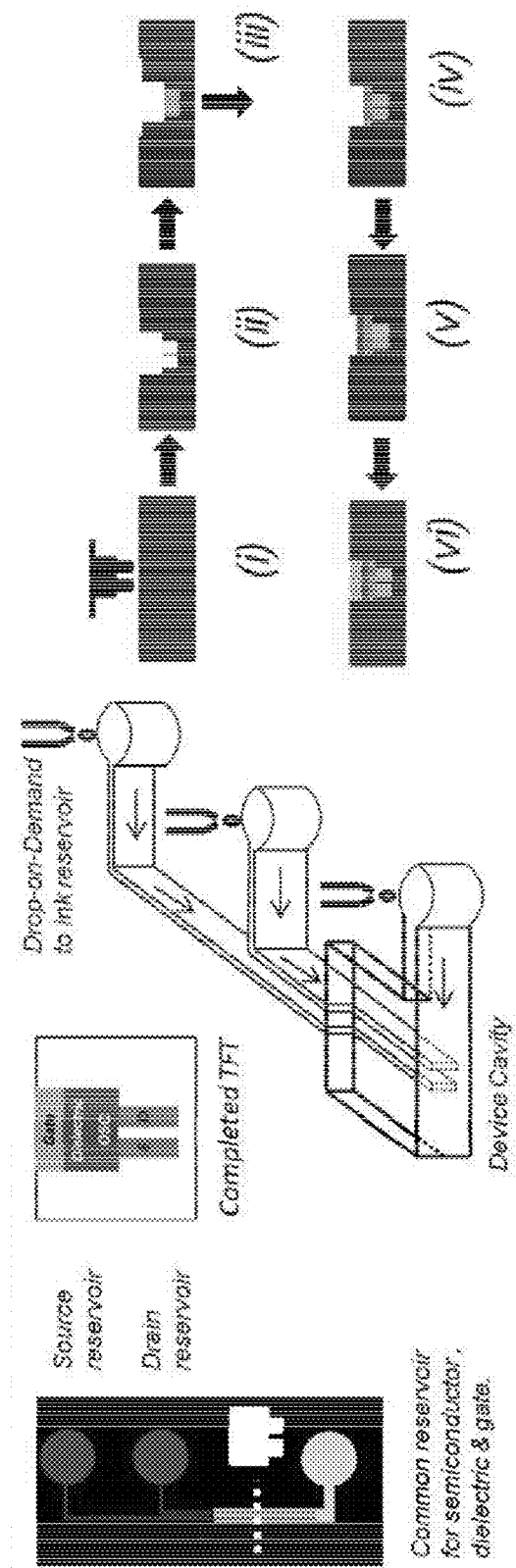
FIG. 25 is an overview of an embodiment of a SCALE process. (Left) Plan view of imprinted ink reservoirs, and TFT cavity. The TFT cavity cross-section is shown in white. (Middle) Scheme showing ink reservoirs and capillary channels that lead to the TFT (or other device) cavity. Liquid is delivered by ink-jet to the reservoirs and flows by capillarity following the arrows. (Right) Scheme of full SCALE process for a TFT involving imprinting (i, ii), filling source and drain cavities with Ag ink (iii), filling the TFT channel cavities with semiconductor (iv), dielectric (v), and Ag gate ink (vi). Not shown are drying/sintering steps.

FIG. 25 provides a general overview of an embodiment of the R2R SCALE process for making a single TFT. In step (i) the topographical pattern is made by impressing the embossing roll into a web-supported, cross-linkable liquid layer with subsequent UV curing to solidify the liquid layer. This produces the complex cavity in panel (ii). Importantly, all of the important spatial information is encoded in this first printing step. Unfilled ink reservoirs are also created in the imprinting step: these are visible in the plan view scheme on the left side of FIG. 25, but are not shown in panel (ii). Then, specific ink reservoirs (colored gray) are filled with metal ink (e.g., Ag ink) by drop-on-demand ink jet nozzles; capillarity spontaneously draws the ink into the feeder channels and fills the source and drain electrode cavities visible in panel (iii). The Ag ink is then dried and sintered (e.g., at 100° C. which is below the glass transition of the plastic substrate), and subsequent ink delivery occurs via sequentially filling the black reservoir. For example, after sintering the Ag ink, a semiconductor ink is loaded into the black reservoir and again capillarity delivers this ink to the transistor cavity as shown in panel (iv). After drying the semiconductor layer, the dielectric ink is delivered on top of the dried semiconductor layer, panel (v). Finally, after drying the dielectric, the gate electrode is made by delivery of Ag ink to the same reservoir, panel (vi). The thickness of the individual layers is controlled by the volume of ink delivered to the reservoirs and the solids content of the inks that are employed.

The reservoirs may serve as the source, drain, and gate electrode pads. Alternatively, the layout in FIG. 25 could be changed so that source, drain and gate pads are formed separately upon each reservoir filling. Another step is to provide interconnects between the printed TFTs to complete a circuit. Examples of embodiments for processes for interconnects are described below.

One aspect of SCALE is controlling the flow of liquid inks from reservoirs down open capillary channels to thin film transistor device architectures. Capillary-driven flow is suitable in small channels, even down the micrometer and nanometer scale.

Figure 26:
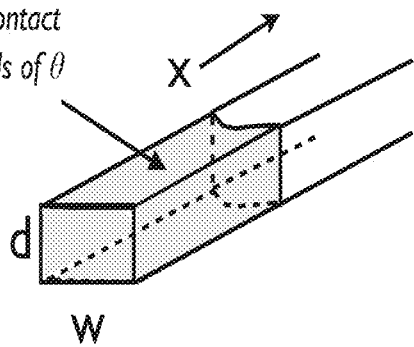
FIG. 26 is a schematic drawing showing capillary driven flow into a closed rectangular cavity connected on the left to a filled reservoir (not shown).

As an example, consider the flow of liquid from a large reservoir into a closed, rectangular capillary channel, FIG. 26. For the liquid to enter into the capillary, good wetting of the capillary walls (low contact angle) is preferred so that the flow is thermodynamically favorable' In general, a contact angle of less than around 5-10° is preferred. Once the liquid wets the capillary walls, a curved meniscus forms, leading to a pressure gradient between the reservoir and the capillary (i.e., the capillary pressure, $\Delta P$). This pressure difference drives flow down the capillary with viscous resistance provided by friction at the capillary walls. The classic Washburn equation describing the liquid front position, x, and the related expression for velocity are shown in FIG. 26. From these expressions, the capillary filling speed for a given length of channel increases as the wettability of the walls increases (i.e., $\theta$ decreases), the viscosity of the liquid decreases, the surface tension of the liquid increases and as the width of the channel increases for a given aspect ratio. More complex equations are available in the literature for flow in open capillary channels. Here, the surface tension of the liquid plays an additional role in the thermodynamic condition for liquid entry into the channel and in the flow process itself. However, again the general trend offered by the Washburn equation holds and provides guidance.

Several research groups have studied capillary flow in nanoscale, closed capillaries with low aspect ratios (w>>d). Capillary channels as narrow as 5 nm have been explored to-date and the general approach in FIG. 26 holds for simple liquids. Hence, we do not expect that the size scale of the capillaries proposed here to be a limiting factor. Instead control of ink properties, such as viscosity and surface tension, the wettability of the capillary walls and the drying conditions will be carefully considered. In particular, evaporation of the solvent from inks raises the viscosity and slows filling. However, based on preliminary studies, the time scale for filling is much shorter than that for evaporation and hence drying is not expected to limit the filling process.

The concept of using capillary driven flow for the construction of micromolded objects and devices has been explored. One notable example is the micromolding in capillaries (MIMIC) method. In this method a polydimethylsiloxane (PDMS) mold containing capillaries is placed on a substrate or support, a drop of prepolymer or precursor liquid is placed in contact with mold, capillary action draws the liquid in, subsequent curing converts the liquid in the capillaries to solid and the mold is removed. This method has been adapted to patterning of a variety of materials on surfaces, including polymers, nanoparticles, carbon nanotubes and organic semiconductors. A related method, capillary force lithography, involves pressing a PDMS pattern of capillaries onto a liquid coated substrate such that the liquid is pulled into the capillaries. The resulting pattern is set by cooling or curing. This method too has been combined with a variety of materials systems. Another approach uses the capillaries in the device or final structure. For example, grooves created by hot embossing of a polymer have been filled with silver ink by capillary action to create a conductive network on the polymer surface. Further, capillary channels created by photolithography have been used to place the organic semiconductor in an array of devices, in which the other materials (conductor and dielectric) are formed by conventional processes.

This previous work establishes the importance and utility of capillary flow in materials processing. However, to our knowledge a complete microelectronics fabrication platform in which all materials in an electronic device are patterned by a process such as SCALE has not been demonstrated previously Liquid-based processing by SCALE is possible, in part, because of rapid advancements in electronic ink development. However, continued improvements are desirable as a diverse suite of materials is preferred for printed circuits, including high conductivity metals for electrodes and interconnects, high capacitance/low leakage gate dielectrics for capacitors and thin film transistors (TFTs), and high-mobility n-type and p-type semiconductors for complementary, low-power logic. Moreover, the rheological properties of the inks are preferably tailored to the demands of the SCALE process. For example, the viscosity of the ink is preferably low (10-50 mPa·s) for compatibility with inkjet print-heads (to fill the reservoirs), and faster capillary filling rates. Also, surface tension is preferably low for good wettability with the walls of the channels. For a water-based ink, this is achievable by adding a small amount of surfactant. Ink solvents are preferably appropriately chosen to ensure complete filling of the channels, while minimizing drying during the filling process.

Metal Inks for Electrodes and Interconnects.

Ag-based inks, Cu-based inks, or other inks suitable for high-speed, large-area manufacturing may be used with SCALE. When developing or using such inks the electrical resistivity of the dried deposit, viscosity, spreading/resolution characteristics, and the ink sintering temperature and time may be considered. For example, less viscous ink formulations may be desired to facilitate both capillary flow for SCALE and droplet-based printing through ultrafine nozzles (diameter ~100 nm). Inks such as Ag Sol ink, comprising a particle- and polymer-free solution, may be used in SCALE. In embodiments, such inks (such as Ag Sol inks) exhibit low electrical resistivity ($\sim 1.6 \times 10^{-5}$ $\Omega$cm) under ambient conditions (as-printed); this resistivity is only 5× bigger than the bulk Ag resistivity.

Dielectric Inks.

Examples of printable formulations suitable for R2R SCALE are described in, for example, (1) T. J. Marks, "Materials for Organic and Hybrid Inorganic/Organic Electronics," *MRS Bulletin*, in press (December, 2010); (2) R. P Ortiz, A. Facchetti, and T. J. Marks, "High-k Dielectrics for Low-Voltage Organic Field-Effect Transistors," *Chem. Rev.*, 110, 205-239 (2010); and (3) DiBenedetto, S.; Facchetti, A.; Ratner, M. A.; Marks, T. J. Molecular Self-Assembled Monolayers and Multilayers as Gate Dielectrics for Organic Thin Film Transistor Applications, *Advanced Materials,* 21, 1407-1433 (2009), each of which is hereby incorporated herein by reference to the extent that they do not conflict with the present disclosure.

Figure 27:
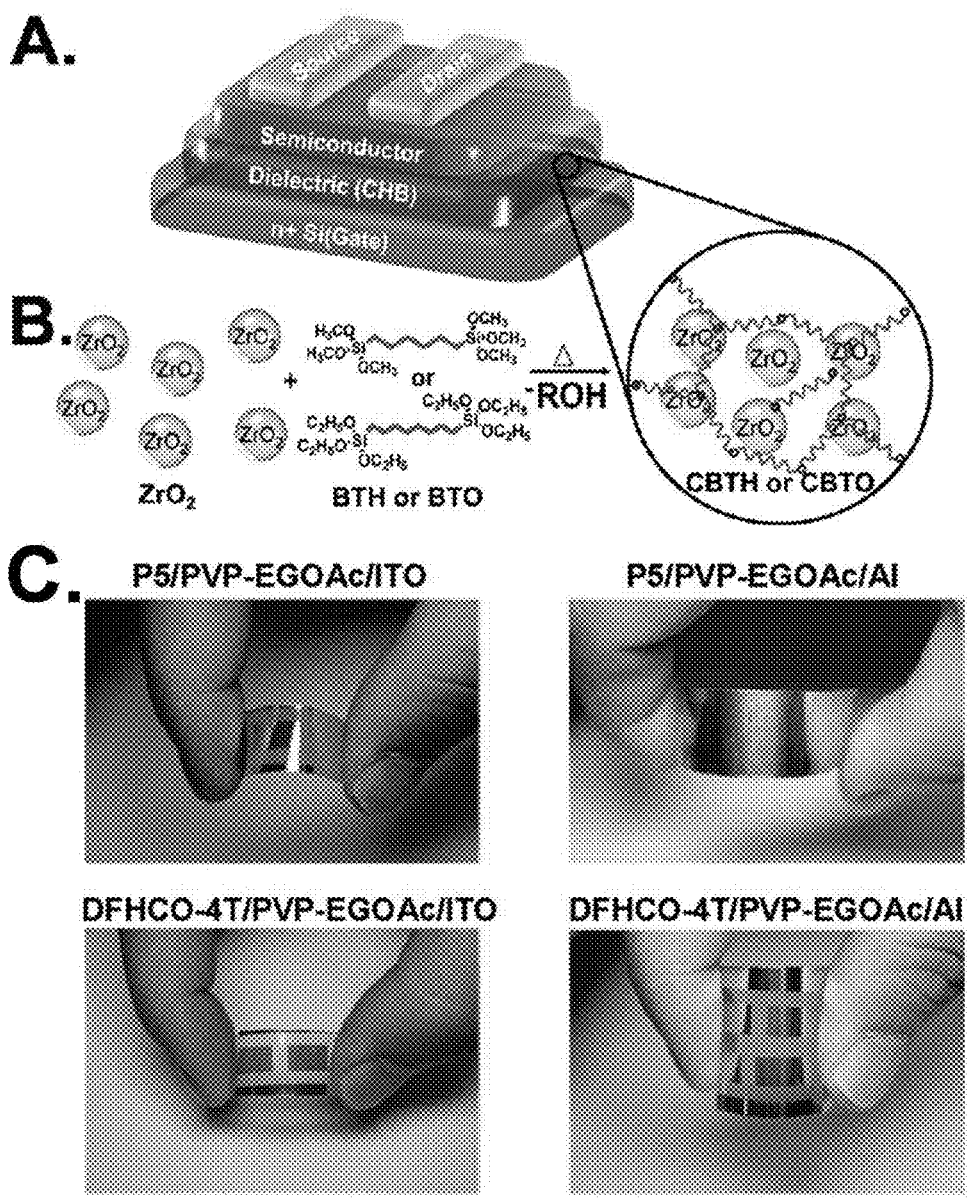
FIG. 27 includes schematic drawings of (A) TFT structure showing the location of the crosslinked hybrid blend (CHB)

Inks based on crosslinkable hybrid blends (CHBs), which involve organosilane linkers and either high-k oxide, or polyvinylphenolic building blocks, such as those depicted in FIG. 27 or described, in, for example, Y.-G. Ha, A. Facchetti, and T. J. Marks, "Flexible Low-Voltage Organic Transistors Enabled by Low Temperature Ambient Solution-Processed Inorganic/Organic Hybrid Gate Dielectric Materials," *J. Am. Chem. Soc.,* in press (2010) (which is hereby incorporated herein by reference to the extent that it does not conflict with the disclosure presented herein). These robust materials can be gravure-printed to yield flexible organic and inorganic TFTs with excellent performance and compatibility with oxide semiconductors; and may be optimized for use in SCALE, aerosol jet, and ink jet.

High capacitance ion gels, such as those described in "Printable Ion Gel Gate Dielectrics for Low Voltage Polymer Thin Film Transistors on Plastic," *Nature Mater.,* 7, 900-906 (2008) (which is hereby incorporated herein by reference to the extent that it does not conflict with the disclosure presented herein), may be developed as printable dielectrics for capacitors and TFTs or other flexible electronics. Ion gels comprise non-volatile ionic liquids and a gelating polymer that gives mechanical toughness, and they can be printed from a common cosolvent; evaporation of the solvent results in spontaneous formation of the gel. The specific capacitance of ion gels is enormous, on the order of 10 $\mu F/cm^2$, by virtue of the mobile ions. Aerosol jet printing of ion gel inks for ultralow voltage circuitry on plastic has been demonstrated. See, for example, (1) M. Ha, Y. Xia, A. A. Green, W. Zhang, M. J. Renn, C. H. Kim, M. C. Hersam, and C. D. Frisbie, "Printed, sub-3V digital circuits on plastic from aqueous carbon nanotube inks," *ACS Nano,* 4, 4388-4395 (2010); and (2) Y. Xia, W. Zhang, W., M. J. Ha, J. H. Cho, M. J. Renn, C. H. Kim, C. D. Frisbie, "Printed, Sub-2V Gel-Electrolyte-Gated Polymer Transistors and Circuits," *Adv. Funct. Mater.* 20, 1 (2010), each of which is hereby incorporated herein by reference to the extent that they do not conflict with the present disclosure. Such ion gel inks are also compatible with the SCALE process (data not shown). An attractive feature of the gels is that the capacitance is independent of the gel film thickness, unlike other dielectrics. This feature allows new TFT or other flexible electronics geometries, which will be described in more detail below. It also relaxes the precision with which thickness needs to be controlled during a printing operation. Such gels are typically thermally stable to about 250° C.

One of skill in the art will understand that parameters of dielectric inks, such as specific capacitance, breakdown strength and leakage currents, may be varied as needed or desired. Many previously tested dielectric inks have an impressive combination of properties including high dielectric constants and capacitances (~1 $\mu F/cm^2$), high breakdown fields, low leakage current densities, excellent air and thermal stability, radiation hardness, and compatibility with solution phase processing. These materials are compatible with a wide range of semiconductors, including carbon nanotubes, oxide films, and nanowires, yielding devices with low operating voltages and excellent bias stress characteristics.

Semiconductor Inks.

Any suitable semiconductor ink may be employed with SCALE. For example, high mobility n-type, printable semiconductor inks that can be paired with p-type semiconductor inks to make low power complementary circuits may be used with SCALE. In embodiments, a printable n-type materials based on amorphous transparent oxide semiconductors (a-TOSs) can be used. When combined with printable gate dielectrics described above, n-type TFTs fabricated with TOSs display high mobilities (up to 180 $cm^2/Vs$), large ON/OFF current ratios (up to $10^7$), low threshold and operating voltages (<1 V), and low hysteresis. See, for example, A. Facchetti, and T. J. Marks, Eds. *Transparent Electronics, from Synthesis to Applications* (book), Wiley-VCH Publishers, 2010, and chapters therein. Typically, TOS materials are deposited from solution and sintered at elevated temperature. However, the processing temperatures for a-TOSs (predominantly M-OH→M-O-M+$H_2O$ progressions) may be lowered by as much as 200° C. using appropriate sol-gel type solution compositions. See, for example, S. Jeong, Y.-G. Ha, J. Moon, A. Facchetti, and T. J. Marks, "Thin-Film Transistors Based on Solution-Processed and Low-Temperature Annealed Ga-Doped Amorphous Oxide Semiconductor Films," *Advanced Materials,* 22, 1346-1350 (2010). Other inks that may be used are described in J. Liu, D. B. Buchholz, R. P. H. Chang, A. Facchetti, and T. J. Marks, "All-Amorphous-Oxide Flexible Transparent Thin Film Transistors," *J. Am. Chem. Soc.,* 132, 11934-11942 (2010), which is hereby incorporated herein by reference to the extent that it does not conflict with the present disclosure.

Complementary devices may be prepared by aerosol jet printing, FIG. 28. A polymer semiconductor ink (P3HT) was used to form the p-channel and a ZnO precursor ink was printed to form the n-channel devices. Both the p- and n-type transistors have a printed high capacitance gate insulator that allows low operating voltages. The data in the right panel show excellent inverter behavior namely trip voltages at 1 V or below and scaling appropriately with $V_{DD}$, device gains above 10, low steady-state power consumption (<1 nW) and good dynamic switching behavior at 5 kHz. These devices can operate dynamically for many hours without any signs of degradation. Another variant of this inverter structure uses printed carbon nanotubes (CNT) as the semiconductor channel. The CNT inverters operate at 100 kHz, or 10 us stage delays. These devices represent the state-of-the-art for printed electronics.

Details of various embodiments of R2R SCALE Process: Building Transistors, Capacitors, Resistors, & Diodes.

Building circuits requires approaches for making all device components, i.e., TFTs, capacitors, resistors, diodes and interconnects. The use of SCALE to make each of these components is described in further detail here. Some elements of R2R-SCALE are: i) a template master consisting a broad range of feature sizes (hundreds of nm to several μm), (ii) a flexible 'daughter' stamp with desirable anti-sticking and longevity properties, and sufficient stiffness for patterning small features without deforming, (iii) a fast-curing, flexible resist material capable of replicating features with good fidelity in short-contact times, and (iv) high performance electronic inks with tunable viscosities and surface tensions.

Depending upon the choice of the dielectric material, TFTs or other flexible electronics can be fabricated by SCALE using two different template master designs. With a conventional dielectric (e.g., high-k polymers or inorganic oxides), the traditional top-gated, bottom-contact TFT stack can be generated by creating the pattern shown previously in FIG. 25. As mentioned before, the lower cavity in the two-tier design may be dedicated to patterning of the source and the drain electrodes. The upper level cavity can be subsequently filled with the semiconductor, dielectric and the gate ink, respectively. The size of the reservoirs may be set to 200 μm, providing an alignment tolerance greater than 100 μm for the inkjet droplet. The line width of each of the source and the drain electrodes, and the channel length can be kept to a minimum of 5 µm, so that the template master is processable using UV-lithography. Multiple tiers in the template can be obtained using successive photolithography cycles. For example, the source and drain reservoirs and their feeder lines may be etched down to a certain depth (e.g., 5 µm). The remaining features may then be aligned to the base layer and processed to a different depth in the subsequent photolithography cycle.

A second TFT design (which can be applied to other electronics) is based on the unique advantage afforded by ion gel gate insulators, namely the ability to physically offset the gate electrode from the source-drain channel, thereby relaxing the strict requirement of precise registration of the gate electrode. Ion gel-gated TFTs with a side-gate architecture display the usual performance metrics, but are slower due to the increased distance the ions need to travel between the source-drain channel and the gate electrode. Using SCALE, this offset can be minimized by an order of magnitude and potentially make low-voltage devices with ~1 MHz switching speed. An example device layout is shown in FIG. 29, where the ratio of the channel width to channel length in the depicted embodiment is 10 µm/500 nm, and the gate electrode offset is 2 µm. The cross-section of the corresponding SCALE template is a four-tier structure. For TFT fabrication, the high resolution metal electrodes—the source and the drain electrodes flanked by a split gate on either side—can be patterned first. The semiconductor ink may be flowed down the middle cavity to cover the source-drain channel, eliminating or reducing the possibility of contact with the gate electrode. The ion-gel ink delivered to the largest cavity swamps the split gates and the semiconductor film to complete the device. In one possible approach of fabricating this template, the single-tier, low-resolution reservoirs and feeder lines (shown in pink) may be photolithographically patterned, which may then be 'stitched' to the multi-level, high resolution features, directly carved out using a focused ion beam (FIB).

It may be important to estimate the integration densities that can be achieved using SCALE. The ink reservoirs may have a significant footprint and optimization of the device layouts and reservoirs may be important. A preliminary analysis shows that a complementary inverter in a 800 µm×800 µm area can be easily produced, including all reservoirs and channels. This then translates to 200 inverters/cm$^2$ (or 400 TFTs/cm$^2$). Further optimization of layouts should increase this number toward the goal of 1000 devices/cm$^2$, and it is noteworthy that already this integration density would be a huge advance over previous demonstrations.

In addition to TFTs, SCALE template masters can be engineered to build resistors, capacitors and diodes (and other electronics), all of which are integral to integrated circuit manufacturing. For example, a resistor can be built by bridging two silver lines with carbon black, by delivering their respective inks to different levels in a two-tier structure, as shown in FIG. 30(*a*). Similarly, it is possible to fabricate capacitors and diodes inside imprinted cavities by SCALE, FIG. 30(*b*) and (*c*).

Flexible molds/stamps are desirable for the SCALE process (FIG. 29*c*) and can be fabricated by casting or thermally imprinting a low-surface energy polymer onto a patterned template master. However, lower viscosity reactive liquids are more suited compared to thermoplastic melts for conformal contact with complex 3-D topographical features on a template master. Potential candidates are PDMS (for optical transparency) and fluoropolymers (e.g., teflon for higher tensile modulus). The mold is preferably inert and preferably does not degrade after prolonged thermal or UV exposures. The flexible stamp may be wrapped and fixed to a high-precision imprint roll. The imprint roll can be made of stainless steel or quartz depending on whether the UV light source is positioned outside or inside the roll, respectively.

The SCALE imprint material coated onto the web is preferably a low-viscosity liquid to achieve rapid conformal contact with both the large and small features during imprinting. It preferably cures rapidly (in the presence of oxygen) within the short contact time with the imprint roll, and exhibit low shrinkage upon curing for high-definition patterning. The imprint pre-polymer can be rapidly cured either thermally (e.g., cross-linkable PDMS) or photonically (e.g., UV-curable epoxysilicone or epoxy-dimethylsiloxanes). Despite a low surface energy mold, adhesion with the imprint material can be enhanced by the high-density and high aspect ratio features on the SCALE mold. Therefore, the imprinted layer preferably has a low surface energy for easy mold-release but preferably has a strong adhesion with the substrate. Functionalized photocurable silsesquioxane (SSQ) resins and PDMS-based copolymers show particular promise as imprint materials. One of the chemical moieties in these material systems shows preferential affinity for the substrate and the overall surface energy of the film is low. Furthermore, the surface energy of the imprinted material should be alterable by plasma or corona treatment to enable capillary flow of the inks in the subsequent steps. The cross-linked network polymer preferably has the necessary chemical resistance against the solvents of the inks employed during the SCALE process.

R2R SCALE Process for Interconnects: Finishing Complete Circuits.

To achieve complete circuits, it is desirable to have a general strategy for making interconnects between transistors, capacitors, resistors, diodes, etc. Some of the interconnects can be fabricated in the same layers as the components, but as indicated in FIG. 23, a three dimensional interconnect process can be important, if not necessary, even for simple circuits (i.e., lines have to cross over each other without shorting). Interconnects may be fabricated efficiently in a various ways using the SCALE process. In a first approach, the web containing discrete components may be coated again with UV-crosslinkable liquid followed by aligned imprinting, as shown in FIG. 31. Imprinting can be aligned to contact pads on the transistor layer, which, as these pads are large (~100 µm), the required precision for this process is relaxed. The imprinting process can create vertical vias and horizontal interconnect channels that will be connected to imprinted ink reservoirs. Subsequent filling of the reservoirs with Ag or Cu (or other suitable) ink, followed by capillary flow, can lead to completion of the desired interconnects. In a second approach, metal-filled vias and interconnects may be made on a second web via the SCALE process, and then the "interconnect web substrate" (web 2) will be aligned to the original "transistor web substrate" (web 1) in a lamination process. Importantly, the alignment requirements here are relaxed because the vias need to be aligned to large contact pads hundreds of µm across. A pressure sensitive adhesive, or Ag epoxy on the pads, can provide the necessary bonding between the two webs.

Integration of New Instrument with Existing Equipment; Maintenance of New Equipment An embodiment of a custom multifunctional R2R coating and printing line that may be used with SCALE is shown in FIG. 32. The apparatus includes the following additive process functions: slot coating, aerosol jet printing, drop on demand delivery of liquids/ink jet printing and gravure printing, and a variety of solidification, curing and sintering processes enabled by infrared heaters and a photonic sintering unit. For aerosol jet or drop on demand printing, the web can be held in place with a heated vacuum plate while the print head translates on a x-y stage above the web. Once printing is complete, the web can be moved forward for solidification. The equipment may be designed for research or commercial applications with relatively narrow webs (4") (of course wider or narrower webs may be employed), accessibility for visualization and metrology, and a unique forward-reverse mode of operation. The forward-reverse mode can allow individual coating or printing steps to be carried out on a short span of web followed by translating that coated or printed web to a solidification station. Once that step is complete, the web can be reversed and a second coating or printed layer can be applied. This mode will allow devices to be build up without consuming large quantities of web and without large drying and curing units that are necessary for continuous operation. Lastly, the depicted design includes a lamination station with state-of-the-art alignment to bring together functional the TFT devices with the upper level interconnects.

Such multifunctional R2R printing and coating lines can enable many additive processes for circuit fabrication, but it may not have nanoimprint capability. Thus, the proposed R2R nanoimprinting line and the multifunctional R2R line will be complementary and can be employed in tandem to effectively produce self-aligned circuits via the SCALE process. First, the capillary architectures can be prepared by nanomiprinting using a nanoemboss instrument, as described above. Then, this structured web may be loaded into the multifunctional R2R coating and printing line and the reservoirs can be filled by the drop-on-demand print head, followed by moving the web to the solidification station. Then the forward-reverse mode of operation may be used: the web can reverse back to the drop on demand location and then next set of reservoirs can be filled. The process can be repeated until the devices are complete. Likewise, the upper level interconnect structures can be constructed by SCALE and the devices can be assembled with the interconnect layer in a final lamination step on the multifunctional line.

It should be noted that the process lines descried herein are preferably for use in an academic research facility and that they are highly flexible and ideal for research studies. It will be understood that process knowledge from research use of such lines should be applicable to larger scale, continuous manufacturing.

An example of an electronic device, such as a TFT, that may be produced using the SCALE process is shown in FIG. 33. As shown in FIG. 33, electronic ink (such as silver ink) may be dispensed into and along a large channel forming the border of the grid. This border can serve as a contact pad. The electronic ink flows into narrow and tall channels via capillarity (which in the depicted embodiment are 5 micrometer wide and 5 micrometers high. The sheets preferably have very low resistance and high transmittance. Embedded electronic material lines (e.g., silver lines) may be used for compatibility with devices. Parallel, high throughput, additive and roll-to-toll processes as described herein may be used.

Imprinting, Printing and Plating (IPP)

Here we present a robust, low-temperature and liquid-based processing method, termed IPP, for obtaining high-resolution and high-aspect ratio metal lines embedded in a plastic substrate by combining three established technologies: (1) imprint lithography (I), (2) inkjet printing (P), and (3) electroless plating (P). FIG. 34, which is similar to FIG. 2, shows a series of steps involved in the IPP process. Firstly, microchannels connected to reservoirs are molded into a coated thermoset material using imprint lithography. A master template is fabricated by etching reservoirs and channels in a silicon substrate (e.g., as described above with regard to FIG. 21). The width of the channels ranged from 1.5-100 μm, whereas the reservoirs are 400 μm in diameter. The master template, in turn, is used to create a polydimethylsiloxane 'daughter' stamp. The stamp is then pressed into a curable epoxy prepolymer liquid coated on a polyethylene terephthalate (PET) film pre-treated by plasma to enhance the adhesion between the epoxy coating and the substrate. The prepolymer is cured using UV illumination, following which the stamp is delaminated to yield imprinted reservoirs and channels on the epoxy-coated PET substrate.

Next, a reactive silver ink (S. B. Walker, J. A. Lewis, *J. Am. Chem. Soc.* 2012, 134, 1419) is delivered into the reservoirs using a drop-on-demand inkjet printer, where it is wicked along the channels via capillary forces. Unlike flat substrates, spreading of this low viscosity ink is confined only to the width of the channel. Upon drying and annealing of the ink, a thin deposit of Ag is left behind in the reservoir and the channel. Subsequently, the channel is filled completely by immersing the substrate in a Cu electroless plating bath for a known amount of time, where the Ag inside the microchannels serves as a seed layer for selective deposition of Cu. In the final configuration, the filled microchannels serve as conductive wires, whereas the reservoirs serve as contact pads.

We employ a particle-free reactive Ag ink for this work, whose rheological properties were tailored to facilitate ink jet printing and capillary flow, simultaneously. This ink is devoid of any organic binder. The surface of Ag metal obtained post-annealing is therefore free from any residue, serving as an excellent seed layer for Cu growth, as discussed later. FIG. 35a shows a plan-view scanning electron micrograph (SEM) of a 50 μm wide channel filled with Ag metal. Note that the Ag ink remains confined within the channel during the wicking process. The two leading edges near the termination of flow are also distinguishable, suggesting that for the entire duration of capillary flow, the bulk liquid trailed the liquid along the sidewalls. As the Ag ink in the reservoir approached the capillary channel, the liquid was first imbibed along the two corners of the channel forming a curved meniscus, leading to a pressure gradient between the reservoir and the channel (i.e., the capillary pressure, AP). Capillary pressure in the direction of flow in an open, rectangular channel can be described as (D. Juncker, H. Schmid, U. Drechsler, H. Wolf, M. Wolf, B. Michel, N. de Rooij, E. Delamarche, *Anal. Chem.* 2002, 74, 6139):

$$\Delta P = \gamma (\cos\theta)\left(\frac{1}{d} + \frac{2}{w}\right), \quad (1)$$

where γ is the surface tension of the liquid, θ is the contact angle of the liquid on the walls of the channel, and d and w are depth and width of the channel, respectively. This pressure gradient drives ink flow down the channel against the competing flow resistance arising from friction at the channel walls.

To investigate the effect of channel geometry on the travel length, the reactive Ag ink, with a volume equivalent to reservoir volume, was flowed within long (5 cm) channels of varying widths and depths (FIG. 35b). Beginning with the widest channels, as shown on the right in FIG. 35b, travel length initially increased upon decreasing the channel width at a constant channel depth. However, for narrow channels (<15 μm), the opposite trend occurred, which we will discuss below. Travel length also increased upon increasing the channel depth at any constant value of width. It is known that given a continual supply of liquid to a closed capillary channel, liquid flow never terminates, although the speed of the advancing liquid front continuously decreases along the channel length. By contrast, in open channels, the movement of the ink is also accompanied by solvent evaporation, which results in a localized increase in viscosity at the advancing liquid front (the part that exists in the channel for the longest duration). Eventually, this liquid front completely solidifies and further ink flow is inhibited. Once formed, the solidification front advances inwards towards the reservoir.

The travel length of a liquid ink in an open channel can be roughly estimated as the product of the average flow velocity and the time at which solidification sets in at the advancing liquid front. The onset of solidification depends upon the vapor pressure of the ink and height of the liquid inside the channel, but not on channel width (surface area to volume ratio of liquid in channels with different widths but same depth is constant). The average flow velocity, on the other hand, has a strong dependence on the width of the channel. Decreasing the channel width, while keeping the depth constant, enhances capillary pressure (from (1)). However, flow resistance also increases upon decreasing the width, with the effect being especially pronounced in very narrow channels. Resistance to flow in a closed microchannel of width w is inversely proportional to $w^{4}$; [23, 25] hence, a similar dependence can also be expected for open microchannels. Therefore, average flow velocity increases and subsequently decreases upon decreasing the channel width for a fixed depth, dictated by the relative dominance of either capillary pressure or flow resistance, respectively (FIG. 35b). Interestingly, the travel length increased upon increasing the channel depth, for a constant width. Although increasing the channel depth decreases capillary pressure (from (1)), it also reduces the effect of viscous dissipation from the channel floor, besides increasing the time for solidification at the advancing liquid front. Therefore, both flow velocity and travel time of the ink increase in deeper channels. It is worthwhile noting that maximum travel length observed for our experiments is close to 6 mm, which should be adequate for most printed circuits applications.

Cross-sectional SEM provides insight into the dynamics of flow and drying of Ag ink inside a microchannel. FIG. 35c reveals that a thin Ag deposit is present on both the sidewalls and bottom of a 5 µm wide channel. The presence of Ag on the sidewalls indicates that during the entire capillary flow, the liquid filled the channel almost to the top. It is also testimony to the pinning of the contact line to the top of the walls during drying. Similar to the coffee-ring effect on flat surfaces, the pinned contact line initiates liquid flow from the center towards the wall during drying, leading to a region of slightly increased Ag thickness near the walls and a region of uniform thickness away from the walls (FIG. 35d). This is consistent with results obtained for polymer and latex solutions dried within similar confined geometries.

Capillary filling enables patterning of the reactive Ag ink in high-resolution channels. However, the channels are only partially filled with metal after drying and annealing of the ink. To obtain high-aspect ratio conductors, complete filling of the channels with metal is required. We accomplish this through electroless deposition of Cu. Upon immersing the substrate in the plating solution, Cu ions from the solution diffuse towards the Ag metal inside the microchannels, where they are reduced to Cu metal. FIG. 36 displays focused ion beam (FIB) cross-sections illustrating time-dependent growth of Cu inside Ag-filled micro channels (widths: 2.5 and 10 µm, depth: 2.5 µm). The temperature of the bath is maintained at 55° C. After 3 min immersion time, Cu grows exclusively atop Ag present on both the sidewalls and the bottom of the channel (FIG. 36 a, d). The thickness of Cu increases with plating time, with an average growth rate ~300 nm min$^{-1}$. Interestingly, side overgrowth near the top of the channel sidewalls is also seen after a plating time of 6 min, indicating isotropic growth of Cu around an individual Ag seed (FIG. 36 e). Eventually, after 9 min, both the 2.5 and 10 µm channels are flush with Cu with an overgrowth of 0.8 and 3 µm, respectively on either side of the channel (FIG. 36 c,f). Advancing Cu metal fronts from both the sidewalls and the bottom seamlessly merged to completely fill the channels, yielding very high aspect ratios (height/width) of 0.6 and 0.1 for the 2.5 and 10 µm channels, respectively. It should be noted that the aspect ratios can be further improved by inhibiting the side-overgrowth through the addition of special additives to the electroless plating solution. The surface morphology of the plated Cu is characterized using atomic force microscopy, which revealed that the root-mean-square roughness over a 25 µm$^2$ area was 81.8±5.2 nm.

To study the effect of the channel geometry on the electrical properties, we used the two-point probe method (FIG. 37a) to measure the resistance of the Cu/Ag wires in channels with different widths (2.5 to 20 µm) at a constant depth (4 µm). FIG. 37b illustrates the resistance of all wires, irrespective of the channel width, varied linearly with length in accordance with Ohm's law, suggesting dimensional invariance of the wires along their length. The contact resistance (between the tungsten probes and the wires) was nearly independent of the wire width, which is also a signature of a true conductor. The calculated resistivity is similar for all wires, with an average value of 2.96±0.1 µΩ-cm, which translates to a conductivity of 57% of bulk Cu (FIG. 37c). This is impressive considering the maximum temperature employed during the entire process was 100° C. during annealing the Ag ink. The resistance per unit length of the wire scales inversely with the channel width. For example, linear resistance almost doubles upon decreasing the channel width by a factor of 2. Despite the low line width, very low values of linear resistance (down to 1 Ωmm$^{-1}$ for 10 µm wide channels) are achieved due to the low resistivity and high aspect ratio of the patterned wires. We also studied the effect of channel shape on resistance of the wires. Interestingly, the resistance of wires in non-linear channels is slightly higher than those in linear channels of the same length, which may result from thinner Ag or Cu deposits around bends in the channel (FIG. 39).

To investigate mechanical flexibility and durability of the Cu/Ag wires, we examined the change in electrical resistance of five wires (width: 15 µm, depth: 4 µm) subjected to repeated bending cycles at two different radii of curvature (r) (FIG. 37d). As shown in FIG. 4e, for r of 1.2 cm (~0.4% tensile strain), electrodes subjected to 1000 repeated bending cycles exhibited only a slight increase in their electrical resistance relative to the initial value. For r of 0.6 cm (0.8% strain), the electrical resistance increased gradually, with a 1.5-fold increase after 1000 cycles. None of the patterned wires exhibited complete failure. The SEM image reveals formation of micro-cracks along the width of the wires, parallel to the axis of bending (FIG. 37f). Although the bending performance is acceptable for most flexible electronics applications, it may be further optimized by employing thinner wires or an encapsulating layer to shift the stress-neutralization plane during bending into the Cu layer. We also investigated the adhesion of the Cu/Ag wires (widths: 2.5-100 µm, depth: 4 µm) using the scotch tape and ultrasonication tests. Although wider wires (>30 µm) showed delamination in some locations, the narrower wires displayed exceptional adhesion to the molded epoxy substrate and remained anchored to the channels even after 3 consecutive tests.

FIG. 38 summarizes the versatility of this method to produce high-resolution conductors. FIG. 38a shows a top-view SEM of a 2 µm wide Cu/Ag line. Despite such high-resolution, line consistency and sharp edge definition over a length scale of tens of microns are clearly evident. Because capillary flow is impartial to the shape of the channel, complex patterns such as 'UMN' (line width: 12 µm) and crossbars (line width and spacing: 5 µm) can also be easily produced. For device applications, miniaturized line spacing is critical to performance along with line width. To determine the minimum line spacing obtainable using this approach, we fabricated an array of channels (line width: 4 µm) with an initial spacing of 15, 7.5 and 5 µm. After the printing and plating steps, the width of the individual Cu/Ag wires was 7 µm and the spacing reduced to 12, 4 and 2 µm, respectively (FIG. 37d-f). No shorts were observed for lines with 4 µm spacing, but the 2 µm lines exhibited occasional shorting (FIG. 37f). To our knowledge, such high-resolution, high-aspect ratio metal patterning on a plastic substrate using an additive, liquid-based process has not been reported previously.

In summary, we have demonstrated a new approach, referred to as IPP, to patterning highly conductive wires through capillarity-induced flow of inkjet-printed reactive Ag ink into micro-imprinted channels on a plastic substrate followed by a Cu electroless plating step. Specifically, high-resolution metal wires with minimum line width and spacing down to 2 and 4 µm, respectively, have been achieved using this approach. High aspect ratio features, up to 0.6, are obtained after the Cu deposition. The Cu/Ag wires display excellent conductivity (>50% of bulk metal), which is invariant over different channel dimensions, making them suitable candidates for flexible electronic devices and circuits. Due to their high aspect ratio and electrical conductivity, wires as fine as as 2.5 µm exhibit a very low linear resistance (<5 $\Omega mm^{-1}$). The embedded wires exhibit good flexibility and resilience, with minimal degradation in electrical performance after thousands of bending cycles. Since our patterning approach is compatible with roll-to-roll processing, it can be readily implemented in a continuous, additive manufacturing process.

IPP Experimental Section

Master Template Fabrication:

Silicon wafer (100) was first cleaned by a Piranha solution (5:1 $H_2SO_4$ with $H_2O_2$) solution for 20 min at 120° C., and then rinsed with DI water and dried. The wafer was prebaked at 115° C. for 1 min. Photoresist (Shipley 1813) was spin coated (3000 rpm) on the silicon wafer for 30 s, followed by softbake at 110° C. for 1 min to drive off solvents. A predesigned mask was placed above the photoresist-coated silicon wafer, and exposed to UV light for 5 s in an ultraviolet exposing system (Karl Suss MABA6). The silicon wafer was immersed in the developer solution for 1 min, rinsed with DI water and dried. The patterned silicon wafer was then dry etched to a required depth by reactive ion etching (SLR 770 Deep Trench Etcher). The etch rate was 0.9 µm $min^{-1}$. Lastly, the patterned silicon wafer with reservoirs and channels was washed in acetone and ethanol to remove the photoresist and rinsed with DI water. The patterned silicon wafer was placed in a hexamethyldisilazane (HMDS) vapor bath for 2 h.

Polydimethylsioxane (PDMS) Stamp Fabrication:

For preparing the PDMS stamp, PDMS monomer and its curing agent (Dow Corning, Sylgard-184) were thoroughly mixed in a 10:1 weight ratio, respectively, and vacuum degassed for 30 min. The master template substrate was placed in a plastic petri dish and 30 g of the PDMS pre-polymer mixture was poured over the substrate and allowed to level out. The pre-polymer mixture was then cured in an atmospheric oven at 60° C. for 12 h. After completely curing, the PDMS stamp was delaminated from the silicon master template. The stamp was then placed in an oven at 120° C. for 2 h to enhance its modulus.

Imprinted Flexible Substrate Fabrication:

A 25 µm thick coating of a flexible, UV-curable polymer, NOA-73 (Norland Products Inc.), was applied to a 75 µm thick PET substrate. Prior to the coating, the PET substrate was air-plasma treated for 3 min to promote the adhesion of the coating. The PDMS stamp was inserted into the liquid coating and pressed using a glass roller to drive out entrapped air bubbles at the coating-stamp interface, if any. The coating was cured by exposure to UV light for 20 min. Following complete cure, the stamp was delaminated, leaving behind imprinted features in the NOA/PET substrate.

Inkjet Printing of Ag Ink:

An 80 µm diameter drop-on-demand inkjet nozzle was employed for printing the Ag ink. The optimized waveform consisted of a rise time of 5 µs, dwell time of 20 µs and fall time of 5 µs, drive voltage of 100 V and jetting frequency of 360 Hz. The diameter of a single ejected droplet was about 65-75 µm. The nozzle was aligned to an imprinted reservoir, and a fixed number of droplets were delivered to the reservoir. Prior to printing, the imprinted substrate was air-plasma treated for 3 min for surface energy enhancement to facilitate capillary flow. The printed substrate was annealed on a hot plate at 100° C. for 5 min.

Cu Electroless Plating:

The Cu electroless plating solution contained 2.704 g of $CuSO_4.5H_2O$, 8.15 g of ethylenediaminetetraacetic acid disodium salt, 3.25 g of NaOH, 100 mL of DI water, and 25 mL of an aqueous solution of formaldehyde (37% by weight). The temperature of the bath was maintained at 55° C. The printed substrate was kept in the bath for a known amount of time and taken out, rinsed with DI water, and dried using an air gun.

Summary of Selected Aspects

A number of aspects methods and devices have been described herein. A summary of some selected aspects is provided below.

A first aspect is a method comprising providing a substrate having a microchannel and a reservoir in communication with the microchannel; and disposing a first liquid composition comprising a liquid carrier and a first electronic material, first optical material or other first material of interest in the reservoir to cause the first liquid composition to move via capillarity through the microchannel.

A second aspect is a method according to the first aspect, wherein providing the substrate comprises molding a polymer to have the microchannel and reservoir via imprint lithography A third aspect is a method according to the second aspect, wherein molding the polymer comprises inserting at least a portion of a template in a polymerizable material.

A fourth aspect is a method according to the third aspect, wherein the template is disposed on a roller.

A fifth aspect is a method according any one of aspects 1-4, further comprising evaporating at least a portion of the liquid carrier leaving, the first electronic material, the first optical material, or the first material of interest in the microchannel.

A sixth aspect is a method according to the any one of aspects 1-5, further comprising depositing a second liquid composition comprising a liquid carrier and a second electronic material, second optical material or other second material of interest in the first reservoir to cause the second liquid composition to move via capillarity through the microchannel over the first electronic material, the first optical material, or the other first material of interest.

A seventh aspect is a method according to the sixth aspect, wherein the first reservoir defines a total reservoir volume and wherein the first reservoir is a nested reservoir defining a first volume in a first nested portion and a second volume in a second nested portion, wherein the total reservoir volume is the sum of the first volume and the second volume, and wherein disposing the first liquid composition in the reservoir comprises disposing the first liquid composition in the first volume defined by the first nested portion and wherein disposing the second liquid composition in the reservoir comprises disposing the second liquid composition in the second volume defined by the second nested portion.

An eighth aspect is a method according to the sixth or seventh aspect, wherein the second liquid composition is an electronic ink, an optical ink, or an ink containing an other material of interest.

A ninth aspect is a method according to any of aspects 6-8, wherein the microchannel comprises a major portion having a first width and a recessed portion having a second width, wherein the first width is greater than the second width, and wherein the first electronic material is disposed in the recessed portion and disposing the second liquid compositing in the reservoir causes the second liquid composition to move through the major portion.

A tenth aspect is a method according to any of aspects 6-9, further comprising evaporating at least a portion of the liquid carrier of the second composition, leaving the second electronic material, the second optical material or the second material of interest layered on the first electronic material in the first channel.

An eleventh aspect is a method according to any one or aspects 6-9, wherein the first material is an electronic material that is electrically conductive and wherein the second material is electronic material that is electrically nonconductive.

A twelfth aspect is a method according to any of the preceding aspects, wherein the first material is an electronic material that is a conductive material A thirteenth aspect is a method according to the twelfth aspect, further comprising plating a metal on the first electronic material within the microchannel.

A fourteenth aspect is a method according to any of the preceding aspects, wherein the first liquid composition is an electronic ink, an optical ink, or an ink containing another material of interest.

A fifteenth aspect is a method according to any of the preceding aspects, wherein the entire method is carried out on a roll-to-roll apparatus A sixteenth aspect is a method for forming an electronic device, optical device or other device comprising: (a) providing a substrate having a microchannel and first and second reservoirs in communication with the microchannel; (b) disposing a first fluid composition comprising a liquid carrier and a first electronic material, first optical material or other first material of interest in the first reservoir to cause the first fluid composition to move via capillarity through the microchannel; (c) evaporating at least a portion of the liquid carrier of the first liquid composition, leaving the first electronic material, first optical material or first other material of interest in the channel; and (d) disposing a second liquid composition comprising a liquid carrier and a second electronic material, a second optical material or other second material of interest in the second reservoir to cause the second liquid composition to move via capillarity through the microchannel over the first electronic material.

A seventeenth aspect is a method according to the sixteenth aspect, further comprising evaporating at least a portion of the liquid carrier of the second liquid composition, leaving the second electronic material, the second optical material or second other material of interest layered on the first electronic material, first optical material or other first material of interest in the first channel.

An eighteenth aspect is a method according to the sixteenth or seventeenth aspect, wherein the microchannel comprises a major portion having a first width and a recessed portion having a second width, wherein the first width is greater than the second width, and wherein the first material is disposed in the recessed portion and wherein disposing the second liquid compositing in the second reservoir causes the second liquid composition to move through the major portion.

A nineteenth aspect is a method according to any of aspects 16-18, wherein the entire method is carried out on a roll-to-roll apparatus.

A twentieth aspect is a method comprising: (a) providing a flexible substrate for an electronic device, the substrate having a plurality of channels and a plurality of reservoirs defined therein, wherein a first of the plurality of channels is in fluid communication with a first of the plurality of reservoirs, wherein a second of the plurality of channels is in communication with a second of the plurality of reservoirs, and wherein the first and second channels are both in communication with a third of the plurality of reservoirs; (b) disposing a first fluid composition comprising a liquid carrier and first material (e.g., electronic, optical or other material of interest) in the first reservoir to cause the first fluid composition to move via capillarity through the first channel; (c) disposing a second fluid composition comprising a liquid carrier and a second material (e.g., electronic, optical or other material of interest) in the second reservoir to cause the second liquid composition to move via capillarity through the second channel; and (d) disposing a third fluid composition comprising a liquid carrier and a third material (e.g., electronic, optical or other material of interest) in the third reservoir to cause the ink to move via capillarity through the first channel and second channels.

A twenty-first aspect is a method according to the twentieth aspect, further comprising: (a) evaporating at least a portion of the liquid carrier of the first liquid composition in the first channel, leaving the first material in the first channel; and (b) evaporating at least a portion of the liquid carrier of the second liquid composition in the second channel, leaving the second material in the second channel, wherein the third liquid composition is disposed in the third reservoir after the liquid carrier has been removed from the first fluid composition and after the liquid carrier has been removed from the second fluid composition.

A twenty second aspect is a method according to the twentieth or twenty-first aspect, wherein the entire method is carried out on a roll-to-roll apparatus.

A twenty-third aspect is a device comprising: (a) a substrate; (b) a patterned polymer disposed on the substrate, wherein the patterned polymer defines a first microchannel in communication with a first reservoir; and (c) a first material (e.g., electronic, optical or other material of interest) disposed in the first microchannel.

A twenty-fourth aspect is a device according to the twenty-third aspect, wherein the patterned polymer further defines a second microchannel in communication with the first reservoir and wherein the first material is disposed in the second microchannel.

A twenty-fifth aspect is a device according to the $23^{rd}$ or $24^{th}$ aspect, further comprising a second material (e.g., electronic, optical or other material of interest), wherein the patterned polymer further defines a third microchannel in communication the first reservoir, wherein the first microchannel comprises a first recess defined in the third microchannel and wherein the second microchannel comprises a second recess defined in the third microchannel, and wherein the second electronic material is disposed in the third microchannel, wherein at least a portion of the second material is disposed on the first material in the first microchannel and is disposed on the first material in the second microchannel.

A $26^{th}$ aspect is a device according to the $24^{th}$ or $25^{th}$ aspect, further comprising a second material (e.g., electronic, optical or other material of interest), wherein the patterned polymer further defines a third microchannel in communication a second reservoir, the first microchannel comprises a first recess defined in the third microchannel and wherein the second microchannel comprises a second recess defined in the third microchannel, wherein the second material is disposed in the third microchannel, wherein at least a portion of the second material is disposed on the first material in the first microchannel and is disposed on the first material in the second microchannel Thus, embodiments of SELF-ALIGNED CAPILLARITY-ASSISTED LITHPGRAPHY are disclosed. One skilled in the art will appreciate that the articles, devices and methods described herein can be practiced with embodiments other than those disclosed. The disclosed embodiments are presented for purposes of illustration and not limitation. One will also understand that components of the articles, devices and methods depicted and described with regard the figures and embodiments herein may be interchangeable.

All scientific and technical terms used herein have meanings commonly used in the art unless otherwise specified. The definitions provided herein are to facilitate understanding of certain terms used frequently herein and are not meant to limit the scope of the present disclosure.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise. The term "and/or" means one or all of the listed elements or a combination of any two or more of the listed elements.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising" and the like. As used herein, "consisting essentially of," as it relates to a composition, apparatus, system, method or the like, means that the components of the composition, apparatus, system, method or the like are limited to the enumerated components and any other components that do not materially affect the basic and novel characteristic(s) of the composition, apparatus, system, method or the like.

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure, including the claims.

Also herein, the recitations of numerical ranges by endpoints include all numbers subsumed within that range (e.g., 1 to 5 includes 1, 1.5, 2, 2.75, 3, 3.80, 4, 5, etc. or 10 or less includes 10, 9.4, 7.6, 5, 4.3, 2.9, 1.62, 0.3, etc.). Where a range of values is "up to" a particular value, that value is included within the range.

As used herein, "providing" with regard to a substrate means manufacturing, purchasing, or otherwise obtaining the substrate.

Use of "first," "second," etc. in the description above and the claims that follow is not intended to necessarily indicate that the enumerated number of objects are present. For example, a "second" channel is merely intended to differentiate from another channel (such as a "first" infusion). Use of "first," "second," etc. in the description above and the claims that follow is also not necessarily intended to indicate that one comes earlier in time than the other.

The invention claimed is:

1. A method for manufacturing an electronic device, comprising:
    providing a substrate having a microchannel and a reservoir in communication with the microchannel; and
    disposing a first liquid composition comprising a liquid carrier and a first electronic material in the reservoir to cause the first liquid composition to move via capillarity through the microchannel.

2. A method according to claim 1, wherein providing the substrate comprises molding a polymer to have the microchannel and reservoir via imprint lithography.

3. A method according to claim 2, wherein molding the polymer comprises inserting at least a portion of a template in a polymerizable material.

4. A method according to claim 3, wherein the template is disposed on a roller.

5. A method according to claim 1, further comprising evaporating at least a portion of the liquid carrier leaving, the first electronic material in the microchannel.

6. A method according to claim 5, further comprising depositing a second liquid composition comprising a liquid carrier and a second electronic material in the first reservoir to cause the second liquid composition to move via capillarity through the microchannel over the first electronic material.

7. A method according to claim 6, wherein the first reservoir defines a total reservoir volume and wherein the first reservoir is a nested reservoir defining a first volume in a first nested portion and a second volume in a second nested portion, wherein the total reservoir volume is the sum of the first volume and the second volume, and wherein disposing the first liquid composition in the reservoir comprises disposing the first liquid composition in the first volume defined by the first nested portion and wherein disposing the second liquid composition in the reservoir comprises disposing the second liquid composition in the second volume defined by the second nested portion.

8. A method according to claim 6, wherein the microchannel comprises a major portion having a first width and a recessed portion having a second width, wherein the first width is greater than the second width, and wherein the first electronic material is disposed in the recessed portion and disposing the second liquid compositing in the reservoir causes the second liquid composition to move through the major portion.

9. A method according to claim 6, further comprising evaporating at least a portion of the liquid carrier of the second composition, leaving the second electronic material layered on the first electronic material in the first channel.

10. A method according to claim 6, wherein the first electronic material is electrically conductive and wherein the second electronic material is electrically nonconductive.

11. A method according to claim 1, wherein the first electronic material is a conductive material.

12. A method according to claim 11, further comprising plating a metal on the first electronic material within the microchannel.

13. A method according to claim 1, wherein the entire method is carried out on a roll-to-roll apparatus.

* * * * *